United States Patent
Tamura

(10) Patent No.: US 10,177,142 B2
(45) Date of Patent: Jan. 8, 2019

(54) CIRCUIT, LOGIC CIRCUIT, PROCESSOR, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Hikaru Tamura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 191 days.

(21) Appl. No.: 15/378,324

(22) Filed: Dec. 14, 2016

(65) Prior Publication Data

US 2017/0187357 A1    Jun. 29, 2017

(30) Foreign Application Priority Data

Dec. 25, 2015 (JP) .................................. 2015-253021

(51) Int. Cl.
*H03K 3/037* (2006.01)
*H01L 27/088* (2006.01)
*H03K 3/012* (2006.01)

(52) U.S. Cl.
CPC ........... *H01L 27/088* (2013.01); *H03K 3/012* (2013.01); *H03K 3/0372* (2013.01); *H03K 3/0375* (2013.01)

(58) Field of Classification Search
CPC ..... H01L 27/08; H01L 27/085; H01L 27/088; H01L 27/0883; H01L 27/0886;
(Continued)

(56) References Cited

U.S. PATENT DOCUMENTS 3,775,693 A    11/1973 Proebsting
4,797,576 A    1/1989 Asazawa
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Lincoln Donovan
*Assistant Examiner* — Diana J Cheng
(74) *Attorney, Agent, or Firm* — Fish & Richardson P.C.

(57) ABSTRACT

A circuit suitable for data backup of a logic circuit is provided. The circuit includes first to fourth nodes, a capacitor, first to third transistors, and first and second circuits. Data can be loaded and stored between the circuit and the logic circuit. The first node is electrically connected to a data output terminal of the logic circuit. The second node is electrically connected to a data input terminal of the logic circuit. The capacitor is electrically connected to the third node. The first transistor controls electrical continuity between the first node and the third node. The second transistor controls electrical continuity between the second node and the third node. The third transistor controls electrical continuity between the second node and the fourth node. The first and second circuits have functions of raising gate voltage of the first transistor and raising gate voltage of the second transistor, respectively.

18 Claims, 33 Drawing Sheets

(58) Field of Classification Search
CPC ............... H01L 27/092; H01L 27/0921; H01L 27/0922; H01L 27/0924; H01L 27/0925; H01L 27/0927; H01L 27/0928; H03K 3/00; H03K 3/01; H03K 3/012; H03K 3/02; H03K 3/027; H03K 3/037; H03K 3/0372; H03K 3/0375
USPC .......................................... 327/185, 199–225
See application file for complete search history.

(56) References Cited

U.S. PATENT DOCUMENTS

| | | | |
|---|---|---|---|
| 4,800,303 | A | 1/1989 | Graham et al. |
| 5,039,883 | A | 8/1991 | On |
| 5,731,856 | A | 3/1998 | Kim et al. |
| 5,744,864 | A | 4/1998 | Cillessen et al. |
| 5,980,092 | A | 11/1999 | Merryman et al. |
| 6,049,883 | A | 4/2000 | Tjandrasuwita |
| 6,078,194 | A | 6/2000 | Lee |
| 6,204,695 | B1 | 3/2001 | Alfke et al. |
| 6,281,710 | B1 | 8/2001 | Poirier et al. |
| 6,294,274 | B1 | 9/2001 | Kawazoe et al. |
| 6,563,174 | B2 | 5/2003 | Kawasaki et al. |
| 6,573,754 | B2 | 6/2003 | Menczigar et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,076,748 | B2 | 7/2006 | Kapoor et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,576,582 | B2 | 8/2009 | Lee et al. |
| 7,674,650 | B2 | 3/2010 | Akimoto et al. |
| 7,732,819 | B2 | 6/2010 | Akimoto et al. |
| 8,467,231 | B2 | 6/2013 | Matsuzaki et al. |
| 8,575,985 | B2 | 11/2013 | Ohmaru et al. |
| 8,593,856 | B2 | 11/2013 | Koyama et al. |
| 8,705,267 | B2 | 4/2014 | Endo et al. |
| 8,773,906 | B2 | 7/2014 | Ohmaru |
| 8,891,286 | B2 | 11/2014 | Endo et al. |
| 9,385,713 | B2 | 7/2016 | Uesugi et al. |
| 2001/0046027 | A1 | 11/2001 | Tai et al. |
| 2002/0036529 | A1 | 3/2002 | Furusawa et al. |
| 2002/0056838 | A1 | 5/2002 | Ogawa |
| 2002/0074568 | A1 | 6/2002 | Yoshida et al. |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0038582 | A1 | 2/2006 | Peeters |
| 2006/0043377 | A1 | 3/2006 | Hoffman et al. |
| 2006/0091793 | A1 | 5/2006 | Baude et al. |
| 2006/0095975 | A1 | 5/2006 | Yamada et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0119394 | A1 | 6/2006 | Dronavalli |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0024318 | A1 | 2/2007 | Mamidipaka |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0048744 | A1 | 2/2008 | Fukuoka |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0197414 | A1 | 8/2008 | Hoffman et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0102018 | A1 | 5/2011 | Shionoiri et al. |
| 2011/0121878 | A1* | 5/2011 | Kato ........................ G11C 7/04 327/215 |
| 2011/0176357 | A1 | 7/2011 | Koyama et al. |
| 2011/0187410 | A1 | 8/2011 | Kato et al. |
| 2012/0140550 | A1 | 6/2012 | Endo et al. |
| 2012/0250397 | A1 | 10/2012 | Ohmaru |
| 2013/0243149 | A1 | 9/2013 | Yamazaki |
| 2014/0078816 | A1 | 3/2014 | Koyama et al. |
| 2014/0204645 | A1 | 7/2014 | Ohmaru et al. |
| 2014/0226394 | A1 | 8/2014 | Endo et al. |
| 2014/0269013 | A1 | 9/2014 | Tsutsui et al. |
| 2015/0070064 | A1 | 3/2015 | Endo et al. |
| 2015/0070962 | A1 | 3/2015 | Ohmaru et al. |
| 2015/0295570 | A1 | 10/2015 | Ohmaru |

(56) References Cited

U.S. PATENT DOCUMENTS

| | | |
|---|---|---|
| 2015/0370313 A1 | 12/2015 | Tamura |
| 2016/0233865 A1 | 8/2016 | Tamura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257192 A | 12/2012 |
| JP | 2013-009297 A | 1/2013 |
| JP | 2013-175708 A | 9/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physical Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digets '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crytsalline Blue Phase for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5) InGaO3(ZnO)3, and Ga2O3(ZnO)m (m=7, 8, 9, and 16) in the In2O3—ZnGa2O4—ZnO Systems", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (GaZO3-InZO3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Bartling.S et al., "An 8MHz 75 µA/MHz Zero-Leakage Non-Volatile Logic-Based Cortex-M0 MCU SoC Exhibiting 100% Digital State Retention at VDD=0V with <400ns Wakeup and Sleep Transitions", ISSCC 2013 (Digest of Technical Papers. IEEE International Solid-State Circuits Conference), Feb. 17, 2013, pp. 432-433.

Sakimura.N et al., "10.5 A 90nm 20MHz Fully Nonvolatile Microcontroller for Standby-Power-Critical Applications", ISSCC 2014 (Digest of Technical Papers. IEEE International Solid-State Circuits Conference), 2014, pp. 184-185.

Noguchi.H et al., "D-MRAM Cache: Enhancing Energy Efficiency with 3T-1 MTJ DRAM / MRAM Hybrid Memory", Design, Automation & Test in Europe Conference & Eihibition, Mar. 18, 2013, p. 6pages.

(56) References Cited

OTHER PUBLICATIONS

Atsumi.T et al., "DRAM Using Crystalline Oxide Semiconductor for Access Transistors and Not Requiring Refresh for More Than Ten Days", IMW 2012 (4th IEEE International Memory Workshop), 2012, pp. 99-102, IEEE.

Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics) , 2012, vol. 51, pp. 021201-1-021201-7.

Kobayashi.H et al., "Processor with 4.9-μs break-even time in power gating using crystalline In—Ga—Zn-oxide transistor", Cool Chips XVI, Apr. 17, 2013, pp. 1-3.

Isobe.A et al., "A 32-bit CPU with Zero Standby Power and 1.5-clock Sleep/2.5-clock Wake-up Achieved by Utilizing a 180-nm C-axis Aligned Crystalline In—Ga—Zn Oxide Transistor", 2014 Symposium on VLSI Circuits Digest of Technical Papers, Jun. 10, 2014, pp. 49-50.

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.

Kobayashi.Y et al., "Scaling to 50-nm C-Axis Aligned Crystalline In—Ga—Zn Oxide FET with Surrounded Channel Structure and Its Application for Less-Than-5-nsec Writing Speed Memory", 2014 Symposium on VLSI Technology : Digest of Technical Papers, 2014, pp. 170-171.

\* cited by examiner (normal operation)

(normal operation)

(backup operation)

(restore operation)

FIG. 26A
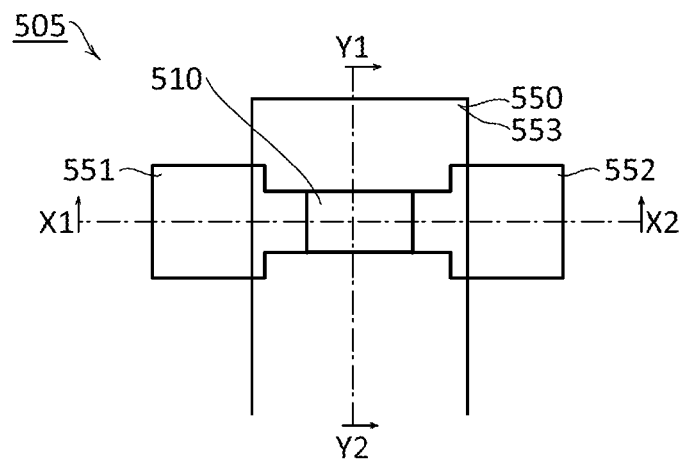
FIG. 26B
FIG. 26C
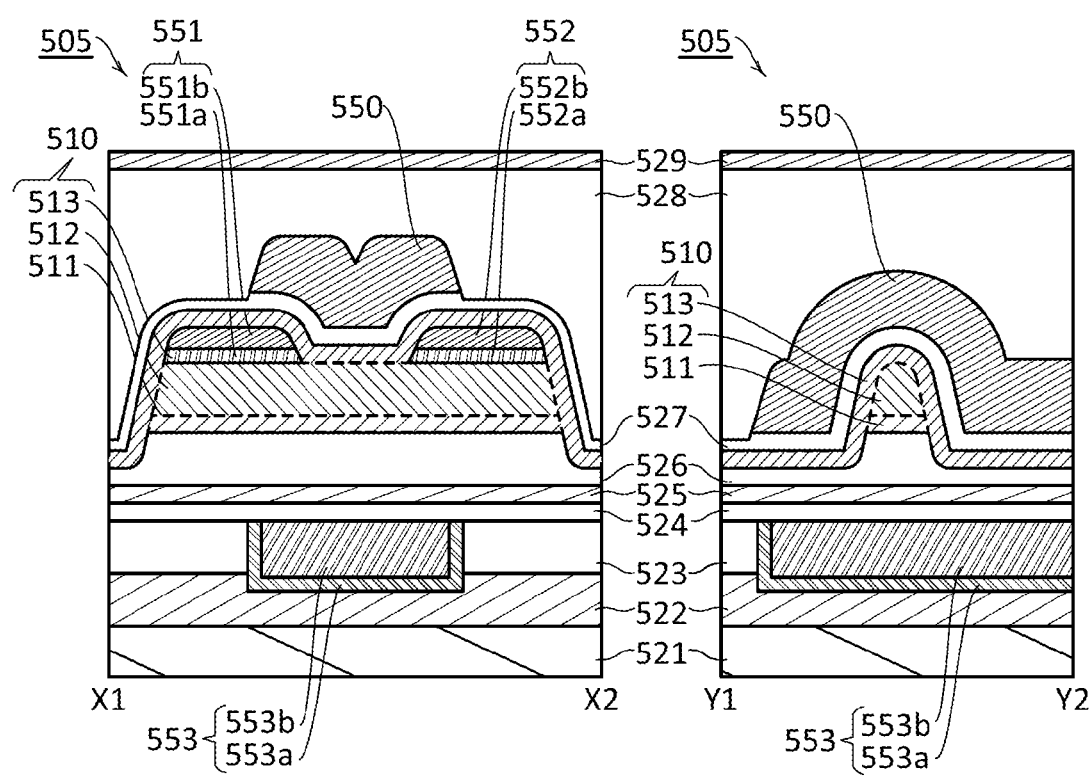

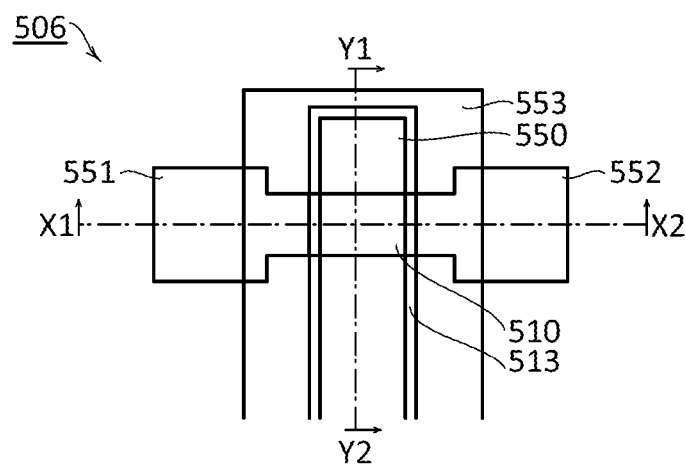
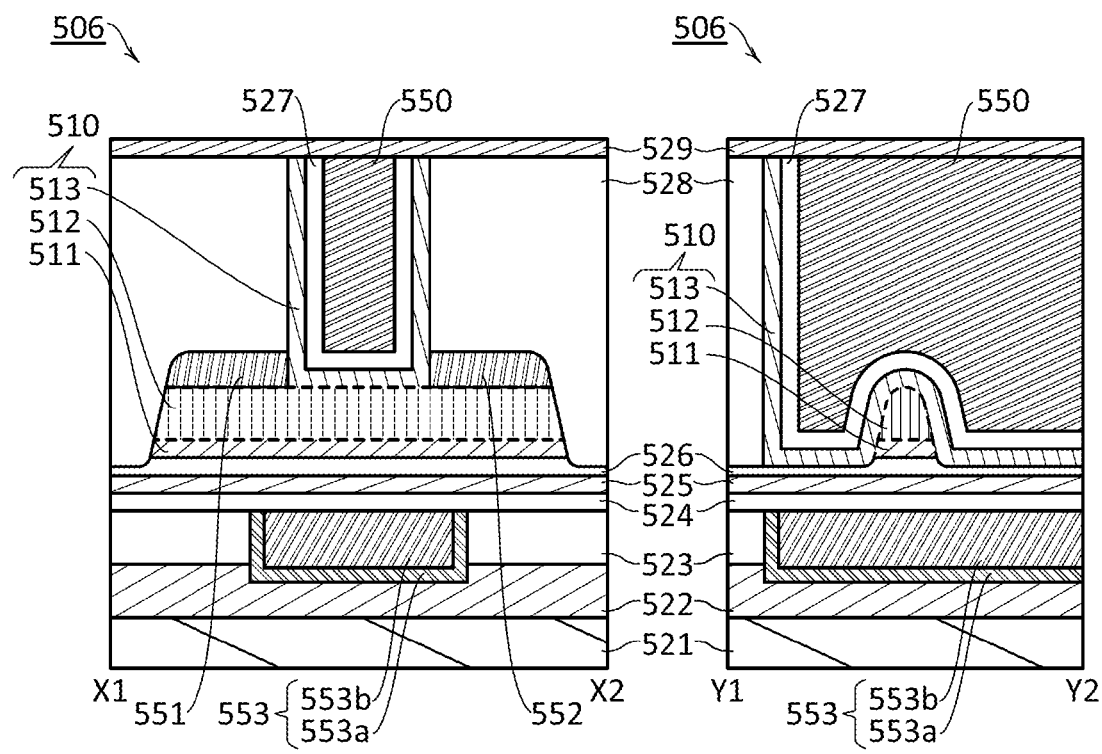

FIG. 28A
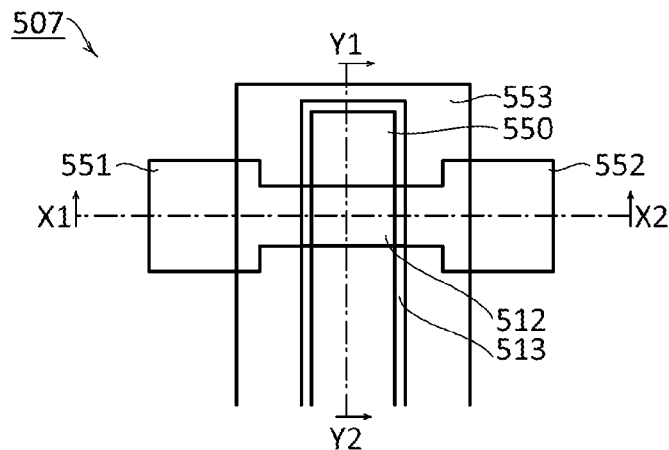
FIG. 28B
FIG. 28C
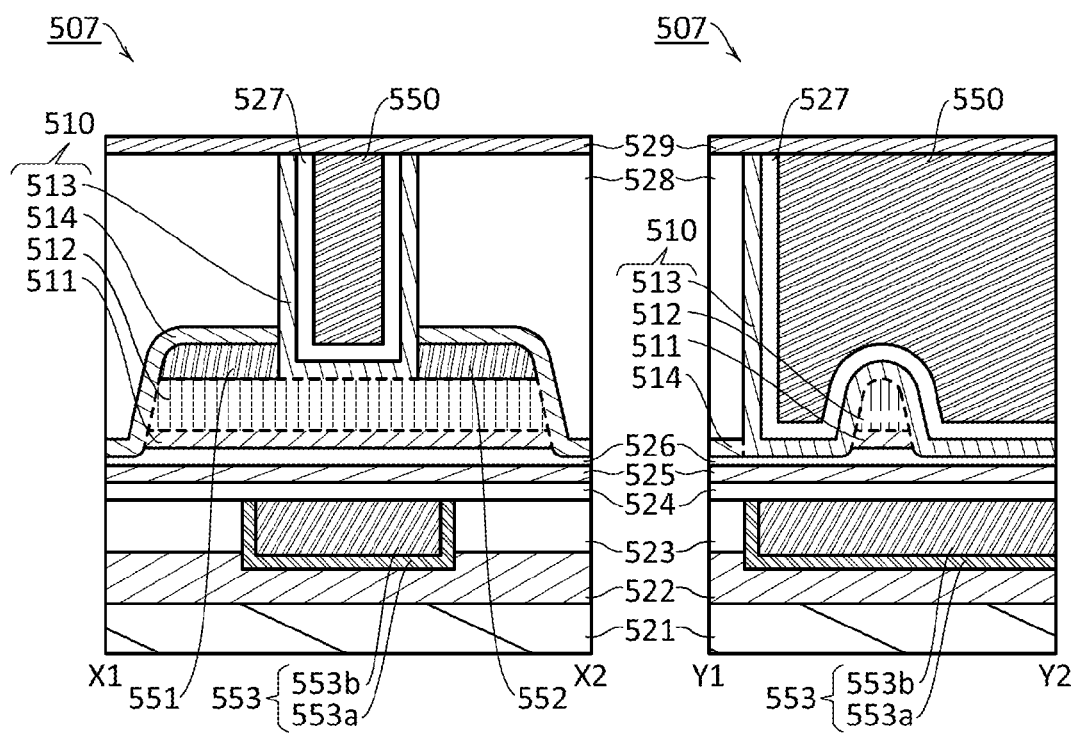

Backup Circuit
80

Backup Circuit
90

CIRCUIT, LOGIC CIRCUIT, PROCESSOR, ELECTRONIC COMPONENT, AND ELECTRONIC DEVICE

BACKGROUND OF THE INVENTION

1. Field of the Invention

One embodiment of the present invention disclosed in the specification, the drawings, and the claims (hereinafter referred to as "this specification and the like") relates to a semiconductor device (e.g., a data retention circuit or a logic circuit), a driving method thereof, and a manufacturing method thereof. Note that one embodiment of the present invention is not limited to the above technical field.

2. Description of the Related Art

In order to reduce the power consumption of a semiconductor device, circuits that do not need to operate are stopped by power gating or clock gating. A flip-flop is a kind of sequential circuit (storage circuit that holds a state) included in a semiconductor device in many cases. Thus, a reduction in power consumption of the flip-flop is effective in reducing the power consumption of a semiconductor device including the flip-flop. When a general flip-flop is powered off, a state (data) retained therein is lost; therefore, it is necessary to back up the state of the flip-flop so that the semiconductor device is power gated.

For example, Non-Patent Document 1 discloses that the use of a flip-flop that includes a backup circuit including an oxide semiconductor transistor and a Si transistor enables power gating of a processor.

REFERENCE

Non-Patent Document

Non-Patent Document 1: H. Tamura et al., "Embedded SRAM and Cortex-M0 Core Using a 60-nm Crystalline Oxide Semiconductor," *IEEE Micro,* 2014, vol. 34, No. 6, pp. 42-53.

SUMMARY OF THE INVENTION

Objects of one embodiment of the present invention are to provide a novel semiconductor device, to provide a novel method for driving a semiconductor device, to enable power gating, to reduce power consumption, to reduce size, to enable operation with a single power source, to facilitate circuit design, to facilitate operation verification, and the like.

One embodiment of the present invention does not necessarily achieve all the objects described above. The description of a plurality of objects does not disturb the existence of each object. Other objects will be apparent from the description of this specification and the like, and such objects could be objects of one embodiment of the present invention.

(1)

One embodiment of the present invention is a circuit including first to sixth nodes, first to third transistors, a first capacitor, and a first circuit. The first capacitor is electrically connected to the first node. The first transistor has a function of controlling electrical continuity between the first node and the second node. The second transistor has a function of controlling electrical continuity between the first node and the third node. The third transistor has a function of controlling electrical continuity between the third node and the fourth node. A gate of the third transistor is electrically connected to the fifth node. A gate of the second transistor is electrically connected to the sixth node. The fifth node is electrically connected to the first circuit. The first circuit has a function of inputting voltage higher than voltage of the fifth node to a gate of the first transistor.

(2)

It is possible to provide a second circuit that is electrically connected to the sixth node and has a function of inputting voltage higher than voltage of the sixth node to the gate of the second transistor in the circuit described in (1).

(3)

A channel formation region of each of the first transistor and the second transistor described in (1) may include a metal oxide.

(4)

One embodiment of the present invention is a logic circuit that includes a backup circuit and a first logic circuit. The backup circuit includes the circuit described in any one of (1) to (3). The first logic circuit includes an input node and an output node. The output node is electrically connected to the second node of the backup circuit. The input node is electrically connected to the third node of the backup circuit.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

A transistor is an element having three terminals: a gate, a source, and a drain. The gate functions as a control terminal that controls the on/off state of the transistor. Two terminals except a gate are input/output terminals that function as a source and a drain. Depending on the type of the transistor or the levels of potentials applied to the two terminals, one of the terminals functions as a source and the other functions as a drain. Therefore, the terms "source" and "drain" can be interchanged with each other in this specification and the like. In this specification and the like, two terminals except a gate are referred to as a first terminal and a second terminal in some cases.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Note that voltage refers to a potential difference between a given potential and a reference potential (e.g., a ground potential (GND) or a source potential) in many cases. Voltage can be referred to as a potential. Note that a potential has a relative value. Accordingly, a ground potential does not necessarily mean 0 V.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In this specification and the like, ordinal numbers such as "first," "second," and "third" are used to avoid confusion among components, and thus do not limit the number of components or do not limit the order.

One embodiment of the present invention can provide a novel semiconductor device or a novel method for operating the semiconductor device. Alternatively, one embodiment of the present invention enables power gating, enables data retention without power supply, can reduce power consumption, can reduce size, can facilitate design, and can facilitate operation verification.

In one embodiment of the present invention, there is no need to obtain all the effects described above. The description of the plurality of effects does not disturb the existence of other effects. In one embodiment of the present invention, other objects, effects, and novel features will be apparent from the description of the specification and the drawings.

BRIEF DESCRIPTION OF THE DRAWINGS

In the accompanying drawings:

FIG. 26A is a plan view illustrating a structure example of an OS transistor, and FIGS. 26B and 26C are cross-sectional views of the OS transistor in FIG. 26A;

FIG. 27A is a plan view illustrating a structure example of an OS transistor, and FIGS. 27B and 27C are cross-sectional views of the OS transistor in FIG. 27A;

FIG. 28A is a plan view illustrating a structure example of an OS transistor, and FIGS. 28B and 28C are cross-sectional views of the OS transistor in FIG. 28A;

DETAILED DESCRIPTION OF THE INVENTION

Figure 1A:
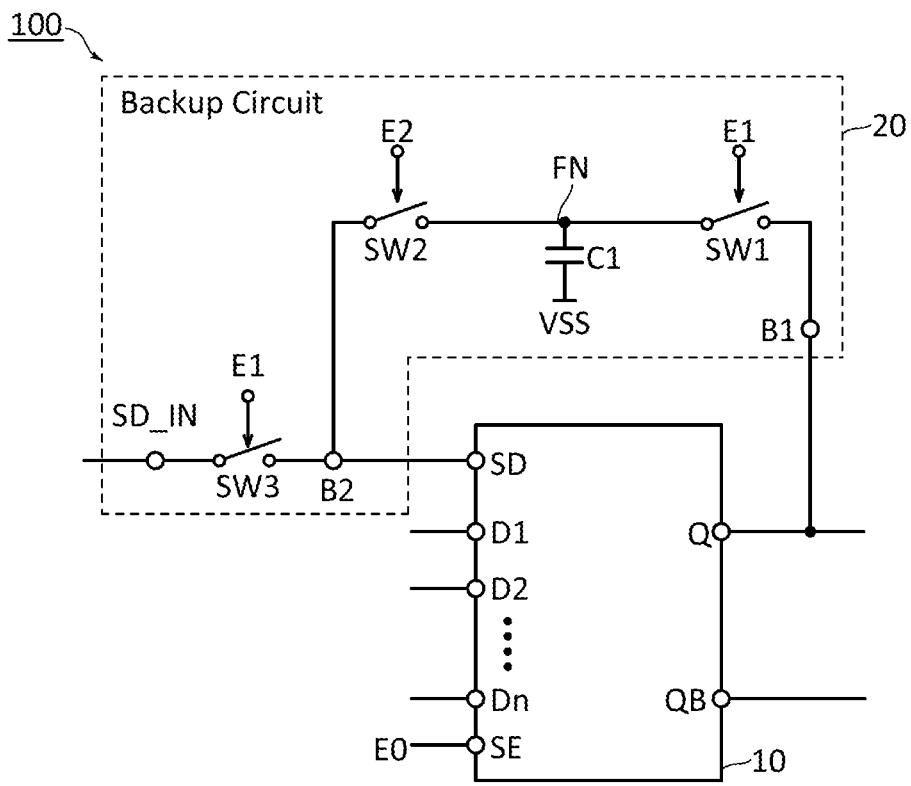
FIG. 1A is a circuit diagram illustrating a structure example of a circuit.

Embodiments and an example of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments and the example.

Any of the embodiments and the example described below can be combined as appropriate. In addition, in the case where a plurality of structure examples (including a manufacturing method example, an operating method example, a usage example, and the like) are given in one embodiment, any of the structure examples can be combined as appropriate, and any of the structure examples can be combined with one or more structure examples described in the other embodiments and the example.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing. Even when a block diagram illustrates one circuit block for performing processing, a plurality of circuit blocks may be actually provided to perform the processing. Such a case is in the category of one embodiment of the present invention. Even when a block diagram illustrates a plurality of circuit blocks with different functions, one circuit block may be actually provided to have a plurality of functions. Such a case is also in the category of one embodiment of the present invention.

In this specification, terms for describing arrangement, such as "over," "above," "under," and "below," are used for convenience for describing the positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

Embodiment 1

In this embodiment, a semiconductor device with a data (state) retention function is described. Power gating of the semiconductor device is described as a typical example. First, a logic circuit including a backup circuit is described with reference to FIG. 1A and the like.

<Structure Example of Logic Circuit>

A circuit 100 in FIG. 1A includes a logic circuit 10 and a backup circuit 20. The circuit 100 can be referred to as a logic circuit including a backup circuit. The logic circuit 10 has a data (state) retention function and can be referred to as a sequential circuit depending on a circuit structure or the like. The backup circuit 20 has a function of storing data of the logic circuit 10 and a function of writing retained data back to the logic circuit 10 in the circuit 100.

(Logic Circuit 10)

The logic circuit 10 includes nodes SE, SD, D1 to Dn (n is an integer of 1 or more), Q, and QB. The nodes SD and D1 to Dn are data input nodes. The nodes Q and QB are data output nodes. The node QB outputs data whose logic is inverted from the logic of the node Q. The logic circuit 10 does not necessarily include the node QB. A control signal E0 is input to the node SE. For example, the circuit 10 has a function of selecting any one of the nodes SD and D1 to Dn in accordance with the logic of the node SE and an arithmetic function of outputting data whose logic is the same as the logic of data, which is input to the selected node, from the node Q.

Figure 1B:
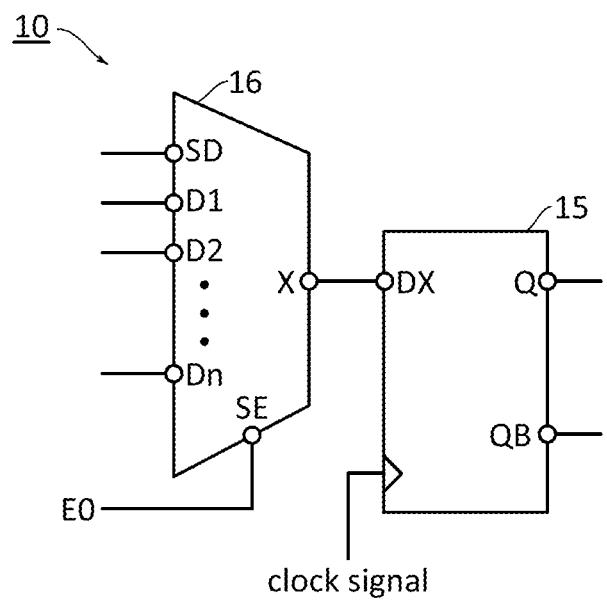
FIG. 1B is a circuit diagram illustrating a structure example of a logic circuit in the circuit in FIG. 1A.

FIG. 1B illustrates a structure example of the logic circuit 10. The logic circuit 10 includes circuits 15 and 16. The circuits 15 and 16 are logic circuits. The circuit 15 includes nodes DX, Q, and QB. The circuit 16 is an input data selection portion, which includes nodes SE, SD, D1 to Dn, and X. The node X is a data output node and is electrically connected to the node DX of the circuit 15.

The circuit 15 has a function of retaining data input to the node DX and an arithmetic function of outputting data whose logic is the same as the logic of input data of the node DX from the node Q. For example, the circuit 15 can be a sequential circuit whose internal state is updated by a control signal such as a clock signal. The sequential circuit can be, for example, a latch circuit, a flip-flop, a shift register, a counter circuit, or a frequency division circuit.

The control signal E0 is a signal for controlling the circuit 16. The circuit 16 has a function of selecting any one of the nodes SD and D1 to Dn in response to the control signal E0 to electrically connect the selected node to the node X. In other words, the circuit 16 has a function of selecting data to be input to the circuit 15.

(Backup Circuit 20)

The backup circuit 20 includes nodes B1, B2, FN, and SD_IN, switches SW1 to SW3, and a capacitor C1.

The logic circuit 10 is electrically connected to the backup circuit 20 so that data can be loaded and stored between the logic circuit 10 and the backup circuit 20. The node B1 is an input node of backup data and is electrically connected to the node Q. The node B2 is an output node of restore data and is electrically connected to the node SD. The node FN can be electrically floating and functions as a data (state) retention portion of the backup circuit 20. The node SD_IN is an input node to which data of another logic circuit is input.

The capacitor C1 functions as a storage capacitor that holds the voltage of the node FN. One terminal of the capacitor C1 is electrically connected to the node FN. The other terminal of the capacitor C1 is electrically connected to a wiring for supplying VSS. VSS is low power supply voltage. The switch SW1 controls electrical continuity between the node B1 and the node FN. The switch SW2 controls electrical continuity between the node FN and the node B2. The switch SW3 controls electrical continuity between the node SD_IN and the node B2. The on/off states of the switches SW1 and SW3 are controlled by a signal E1. The on/off state of the switch SW2 is controlled by a signal E2.

An operation example of the circuit 100 is described with reference to FIGS. 2A to 2D.

(Normal Operation)

Figure 2A:
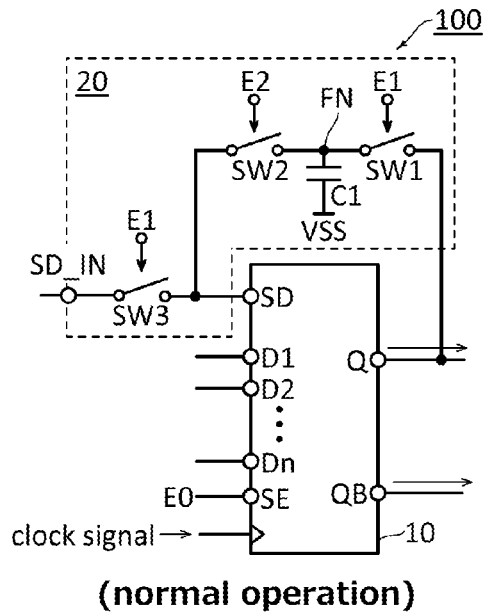
FIGS. 2A to 2D are circuit diagrams each illustrating an operation example of the circuit in FIG. 1A.
Figure 2B:
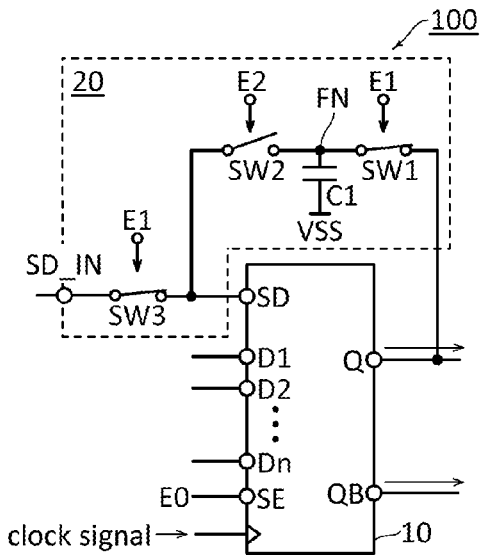

In normal operation, the logic circuit 10 processes data input from the nodes SD and D1 to Dn. Thus, the switch SW2 is turned off. The switch SW3 is turned on as necessary. When data processed by the logic circuit 10 does not contain data of the node SD, the switch SW3 is turned off (FIG. 2A). When data processed by the logic circuit 10 contains data of the node SD, the switch SW3 is turned on (FIG. 2B).

In the circuit structure of FIG. 1A, the switch SW1 is also turned on or off by the signal E1 in conjunction with the switch SW3; however, the switch SW1 may be either on or off. Different control signals can be used for the switches SW1 and SW3. Accordingly, the switch SW1 can be always off in the normal operation.

(Backup Operation)

Figure 2C:
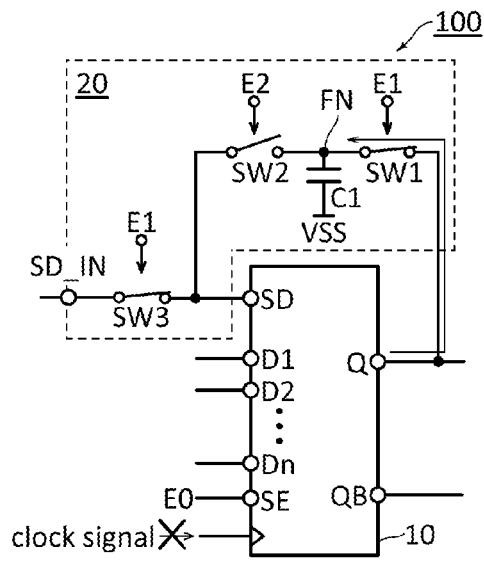
Figure 2D:
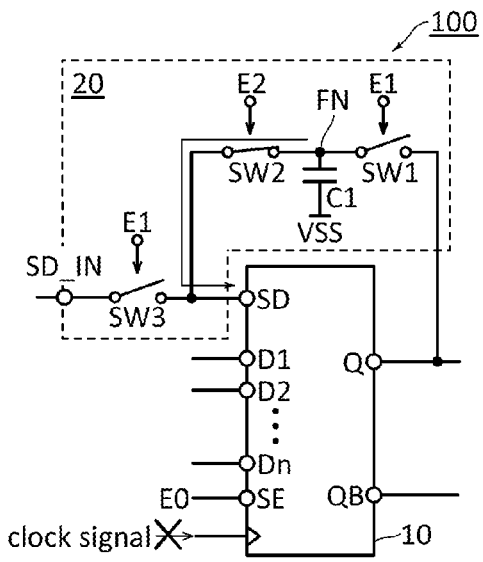

In order to back up the state of the logic circuit 10, input of a control signal such as a clock signal to the logic circuit 10 is stopped as necessary so as not to change the logic (state) of the node Q. Next, the switch SW1 is turned on and the switch SW2 is turned off (FIG. 2C). Since the node FN is electrically connected to the node Q, the logic of the node FN is the same as that of the node Q. When the logic of the node Q is "1," the logic of the node FN is also "1." When the logic of the node Q is "0," the logic of the node FN is also "0." The switch SW1 is turned off to make the node FN electrically floating, so that backup operation is completed and the backup circuit 20 retains data.

When the backup operation is completed, supply of power to the logic circuit 10 can be stopped. In other words, when the backup circuit 20 is provided, clock gating and power gating of the logic circuit 10 can be performed.

(Restore Operation)

In order to start restore operation of data of the logic circuit 10, power is supplied to the logic circuit 10. The logic circuit 10 is made to receive data of the node SD by the control signal E0. The input of a control signal such as a clock signal to the logic circuit 10 is kept stopped. When the switch SW2 is turned on by the signal E2, data retained in the node FN is written to the node SD. The state of the logic circuit 10 is restored so that the logic circuit 10 can output data whose logic is the same as the logic of data of the node Q immediately before power-off from the node Q.

After the switch SW2 is turned off, supply of the control signal to the logic circuit 10 is restarted. The state of the circuit 100 is restored so that the circuit 100 can perform the normal operation. Note that in the case where the logic of the node Q needs to be the same as the logic of the node FN at the time of power-off when the normal operation is started, a control signal may be supplied before the switch SW2 is turned off so that the logic circuit 10 performs the normal operation, and the data of the node SD may be written to the node Q.

<Modification Example>

In the circuit 100, the backup circuit 20 backs up data of the node Q and restores the backed up data to the node SD. The node whose data is backed up is not limited to the node Q, and any one of the input node, output node, and internal node of the logic circuit 10 may be used. The same applies to the node whose data is restored. Note that it is preferable that each of the node whose data is backed up and the node whose data is restored be not the internal node. When each of the node whose data is backed up and the node whose data is restored is the input node or output node of the logic circuit 10, the logic circuit 10 can be implemented in the backup circuit 20 without a big change in design of the logic circuit 10.

Figure 3A:
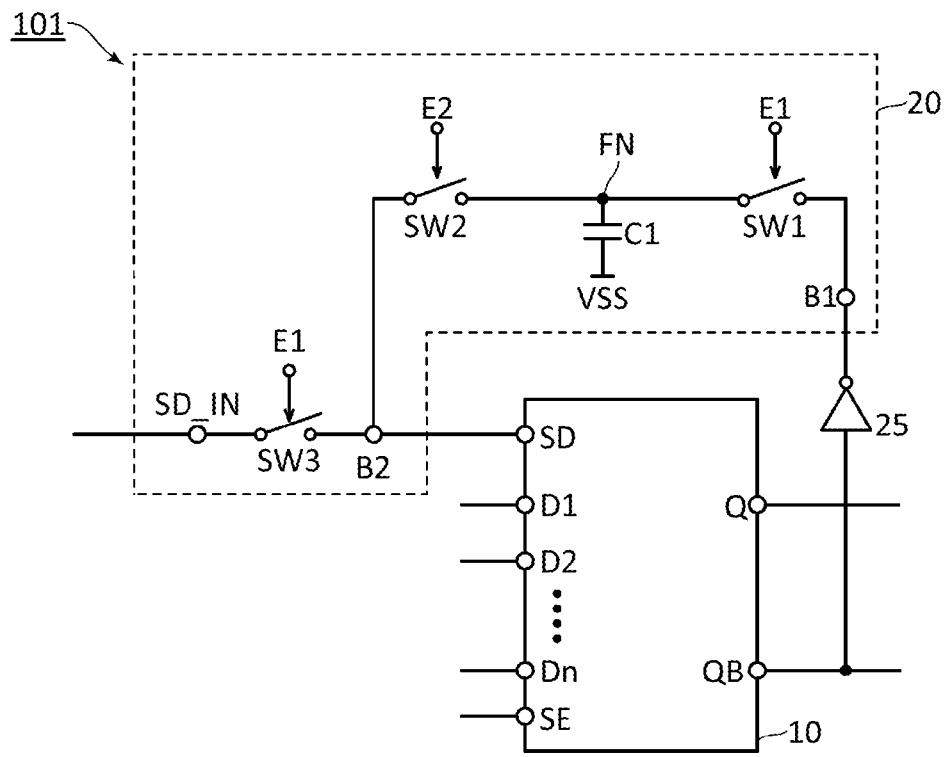
FIGS. 3A and 3B are circuit diagrams each illustrating a structure example of a circuit.
Figure 3B:
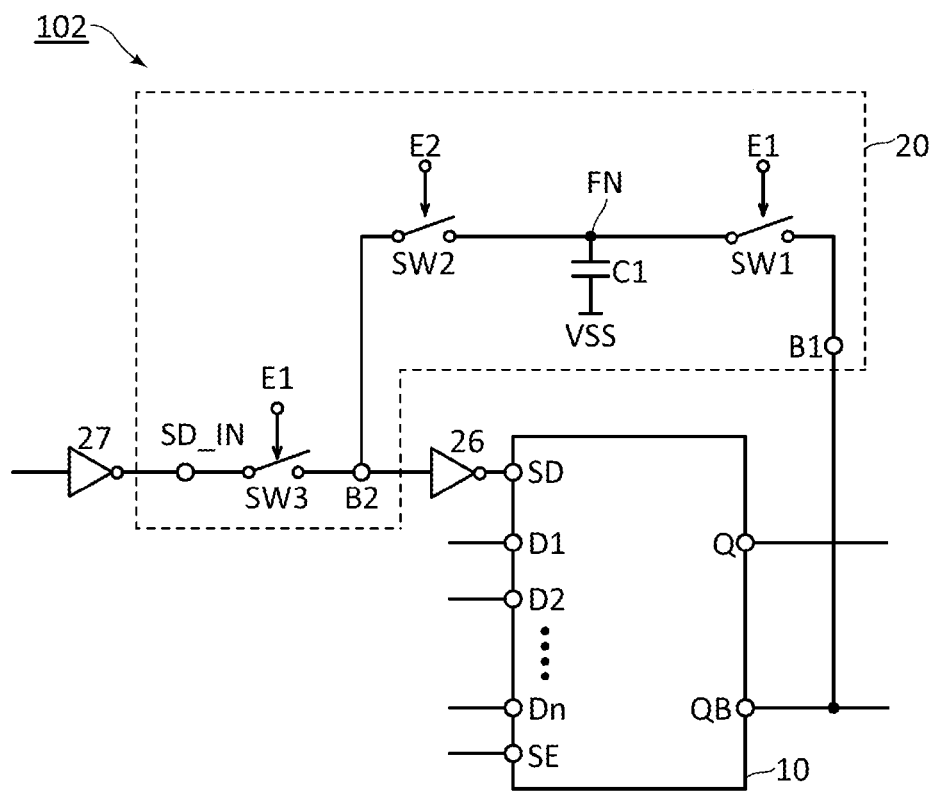

FIGS. 3A and 3B each illustrate an example in which the node whose data is backed up is the node QB. A circuit 101 in FIG. 3A includes the logic circuit 10, the backup circuit 20, and an inverter circuit (hereinafter referred to as "INV" in some cases) 25. The node B1 is electrically connected to the node QB through the INV 25. In backup operation, data of the node QB is written to the node FN through the INV 25, so that the logic of the node FN is the same as that of the node Q.

A circuit 102 in FIG. 3B includes the logic circuit 10, the backup circuit 20, and INVs 26 and 27. The node B1 is electrically connected to the node QB. The node B2 is electrically connected to the node SD through the INV 26. In backup operation, data of the node QB is written to the node FN, so that the logic of the node FN is inverted from that of the node Q. In restore operation, data of the node FN is written to the node SD through the INV 26, so that the logic of the node SD is the same as that of the node Q.

Note that the INV 26 can be provided as a logic gate of the logic circuit 10. In addition, each of the circuits 101 and 102 does not necessarily include the node Q.

The backup circuit 20 may have retention characteristics such that data can be retained while the logic circuit 10 is power gated. To retain data in the backup circuit 20 for a long time, a potential change (in particular, a potential drop) of the electrically floating node FN is preferably reduced as much as possible. A means for achieving this is to use a transistor with extremely low drain current in an off state (off-state current) as each of the switches SW1 and SW2.

To reduce off-state current of a transistor, a channel formation region contains a semiconductor with a wide energy gap, for example. The energy gap of the semiconductor is preferably greater than or equal to 2.5 eV, greater than or equal to 2.7 eV, or greater than or equal to 3 eV. An example of such a semiconductor material is a metal oxide. Each of the switches SW1 and SW2 is a transistor whose channel formation region contains a metal oxide (hereinafter such a transistor is referred to as an oxide semiconductor transistor or an OS transistor), for example. The leakage current of an OS transistor normalized by channel width can be, for example, lower than or equal to $10 \times 10^{-21}$ A/μm (10 zA/μm) with a source-drain voltage of 10 V at room temperature (approximately 25° C.). It is preferable that the leakage current of the OS transistor used as each of the switches SW1 and SW2 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

Avalanche breakdown or the like is less likely to occur in some cases in an OS transistor than in a general transistor including silicon or the like because a metal oxide semiconductor has a wide energy gap and thus electrons are less likely to be excited, and the effective mass of a hole is large. Since hot-carrier degradation or the like due to the avalanche breakdown is inhibited, the OS transistor has high drain withstand voltage and can be driven at high drain voltage. Accordingly, the use of the OS transistor in the backup circuit 20 can leave a wide margin for driving conditions such as the potential level of a signal and input timing. The backup circuit 20 can be driven such that the voltage of the node FN is high when data is retained, for example.

A metal oxide contained in a channel formation region of a transistor is preferably a metal oxide containing at least one of indium (In) and zinc (Zn). Typical examples of such a metal oxide include an In oxide, a Zn oxide, an In—Zn oxide, and an In-M-Zn oxide (M is Al, Ti, Ga, Y, Zr, La, Ce, Nd, or Hf). A reduction in impurities serving as electron donors, such as hydrogen, and a reduction in oxygen vacancies can make a metal oxide i-type (intrinsic) or substantially i-type. Here, such a metal oxide can be referred to as a highly purified oxide semiconductor. A metal oxide with a low carrier density is preferably used for a channel formation region. A highly purified intrinsic or substantially highly purified intrinsic metal oxide has few carrier generation sources and thus can have a low carrier density. The highly purified intrinsic or substantially highly purified intrinsic oxide has a low density of defect states and accordingly has a low density of trap states in some cases. Charge trapped by the trap states in the metal oxide takes a long time to be released and may behave like fixed charge. Thus, a transistor whose channel formation region is formed using a metal oxide with a high density of trap states has unstable electrical characteristics in some cases.

In order to obtain stable electrical characteristics of the oxide semiconductor transistor, it is effective to reduce the concentration of impurities in the channel formation region. In addition, in order to reduce the concentration of impurities in the channel formation region, the concentration of impurities in a film that is adjacent to the channel formation region is preferably low. Examples of impurities include hydrogen, nitrogen, carbon, silicon, alkali metal, and alkaline earth metal.

There is no particular limitation on the switch SW3 and a transistor included in the logic circuit 10, and a general transistor included in a standard cell can be used. For example, a transistor whose channel formation region contains a Group 14 element (Si, Ge, or C) can be used.

A typical example of the transistor in the logic circuit 10 is a transistor (Si transistor) whose channel formation region contains silicon. For the purpose of improving the mobility of the Si transistor or for other purposes, a distortion transistor where Ge is added to a channel formation region may be used.

The switch SW3 may be an OS transistor like the switches SW1 and SW2, or a CMOS circuit such as an analog switch. In the case where the switch SW3 is a CMOS circuit, a Si transistor may be a p-channel transistor and an OS transistor may be an n-channel transistor.

The use of OS transistors as the switches SW1 to SW3 is very effective in reducing area overhead of the circuit 100 due to addition of the backup circuit 20. When the switches SW1 to SW3 are OS transistors, the backup circuit 20 can be stacked over the logic circuit 10. Thus, the backup circuit 20 can be provided without any change in design and layout of the logic circuit 10.

As described above, the combination of an OS transistor and a Si transistor can provide a low-power logic circuit; however, a problem might arise owing to a difference in electrical characteristics between the OS transistor and the Si transistor. For example, the threshold voltage (hereinafter sometimes referred to as "Vt") of the OS transistor is higher than that of the Si transistor because a technique for controlling the threshold voltage of the OS transistor is not adequately established for the time being.

For example, power supply voltage (1.8 V) for a Si transistor and power supply voltage (2.5 V) for an OS transistor are supplied to a processor disclosed in Non-Patent Document 1 owing to a difference in threshold voltage between the Si transistor and the OS transistor. A level shifter is provided in a peripheral circuit of the processor to increase the amplitude of a drive signal of the OS transistor. It is possible to eliminate a level shifter from a peripheral circuit by using a backup circuit in this embodiment. Next, this fact is described in detail by using specific examples of the circuit structure and driving method of the backup circuit when the logic circuit is a scan flip-flop.

<Structure Example 1 of Flip-Flop>

Figure 4:
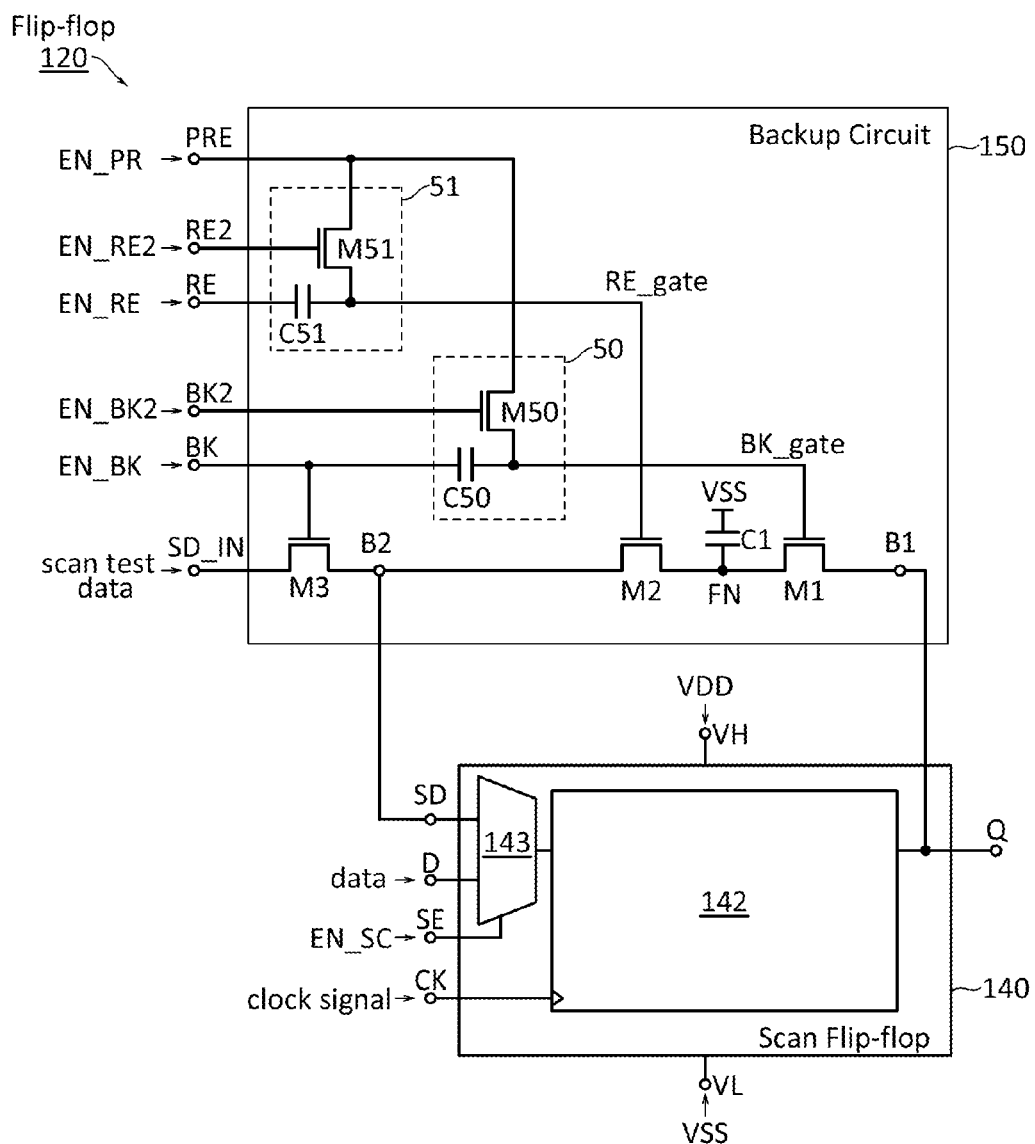
FIG. 4 is a circuit diagram illustrating a structure example of a flip-flop.

A flip-flop 120 in FIG. 4 includes a scan flip-flop 140 and a backup circuit 150. In other words, the flip-flop 120 is a scan flip-flop including a backup circuit.

Structure Example of Scan Flip-Flop

The scan flip-flop 140 (hereinafter referred to as "SFF 140") includes nodes VH, VL, D, Q, CK, SD, and SE, a flip-flop 142, and a selector 143.

The nodes VH and VL are nodes for power supply voltage. VSS (low power supply voltage) is supplied to the node VL. VDD (high power supply voltage) is supplied to the node VH through a power switch. The nodes D and SD are data input nodes, and the node Q is a data output node. The node D is electrically connected to a data output node of a logic circuit (e.g., a combinational circuit). The node SD is a scan test data input node and a restore data input node. The node CK is a clock input node and is supplied with a clock signal. The node SE is a control signal input node. A scan enable signal EN_SC (hereinafter referred to as a signal EN_SC) is input to the node SE. The selector 143 outputs one of input data of the node D and input data of the node SD to the flip-flop 142 in accordance with the logic of the signal EN_SC. The state of the flip-flop 142 is updated in synchronization with a clock signal.

An input node and an output node are provided in the SFF 140 as appropriate in accordance with a circuit structure or the like. For example, in the case where data whose logic is inverted from the logic of the node Q is output, the node QB is provided.

Figure 5:
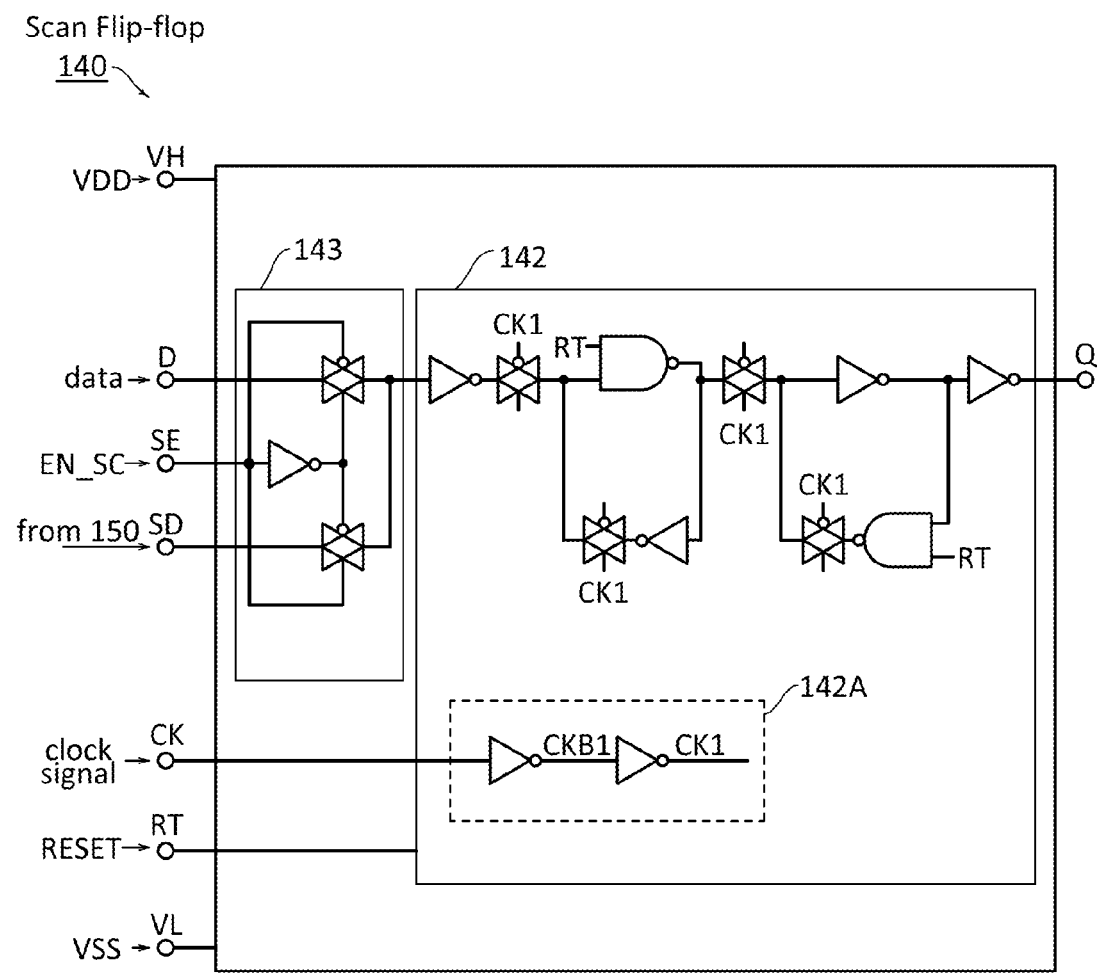
FIG. 5 is a circuit diagram illustrating a structure example of a scan flip-flop.

There is no particular limitation on the circuit structure of the SFF 140, and a scan flip-flop prepared in a standard circuit library can be used. FIG. 5 illustrates a structure example of the SFF 140.

The selector 143 includes two analog switches and one inverter circuit. In the example of FIG. 5, data input to the flip-flop 142 is data of the node D when the node SE is "L" (low-level potential), and the data input to the flip-flop 142 is data of the node SD when the node SE is "H" (high-level potential).

The flip-flop 142 includes a circuit 142A, four inverter circuits, four analog switches, and two NAND circuits. The flip-flop 142 is a reset flip-flop. Thus, the flip-flop 142 includes nodes RT for inputting a reset signal (RESET). The nodes RT are electrically connected to input nodes of the NAND circuits. The circuit 142A includes two inverter circuits and nodes CK1 and CKB1. The analog switches of the flip-flop 142 are electrically connected to the nodes CK1 and CKB1, respectively.

<Structure Example 1 of Backup Circuit>

The backup circuit 150 includes nodes B1, B2, FN, SD_IN, RE, RE2, BK, BK2, and PRE, transistors M1 to M3, the capacitor C1, and circuits 50 and 51. The circuit 50 includes a transistor M50 and a capacitor C50. The circuit 51 includes a transistor M51 and a capacitor C51.

The transistors M1 to M3 correspond to the switches SW1 to SW3 in the backup circuit 20. Here, a node connected to a gate of the transistor M1 is referred to as BK_gate, and a node connected to a gate of the transistor M2 is referred to as RE_gate.

At least the transistors M1 and M2 of the transistors M1 to M3, M50, and M51 are preferably OS transistors. When the transistors M1 and M2 are OS transistors, the voltage drop of the node FN can be suppressed while the node FN retains data "1." Thus, the backup circuit 150 can function as a nonvolatile storage circuit for data backup of the SFF 140. With the flip-flop 120, the semiconductor device can perform power gating and effectively reduce power consumption.

Note that in a data retention period of the backup circuit 150, voltage that turns off the transistors M1 and M2 completely might be continuously supplied to gates. Alternatively, in the case where the transistors M1 and M2 include back gates, voltage that makes the transistors M1 and M2 normally-off might be continuously supplied to the back gates. In such a case, the voltage is supplied to the backup circuit 150 in the retention period. However, the backup circuit 150 consumes little power because almost no current flows. Because the backup circuit 150 consumes little power even when predetermined voltage is supplied to the backup circuit 150 in the retention period, the backup circuit 150 can be regarded as being nonvolatile.

The node B1 is electrically connected to the node Q. The node B2 is electrically connected to the node SD. The node SD_IN in the flip-flop 120 is a scan test data input node and is electrically connected to a node Q of another flip-flop 120.

The nodes PRE, RE, RE2, BK, and BK2 are control signal input nodes. A signal EN_PR is a signal for controlling precharge of BK_gate and RE_gate and is input to the node PRE. Signals EN_BK and EN_BK2 are signals for controlling data backup and are input to the nodes BK and BK2, respectively. Signals EN_RE and EN_RE2 are signals for controlling data restore and are input to the nodes RE and RE2, respectively.

The circuit 50 has a function of raising the voltage of BK_gate, and the circuit 51 has a function of raising the voltage of RE_gate. Here, bootstrap circuits are provided as the circuits 50 and 51.

The transistor M50 controls electrical continuity between the node PRE and BK_gate. A gate of the transistor M50 is electrically connected to the node BK2. The capacitor C50 has a function of holding a potential difference between the node BK and BK_gate. A signal whose amplitude is larger than that of the signal EN_BK is input to the gate of the transistor M1 by bootstrap operation of the circuit 50.

The transistor M51 controls electrical continuity between the node PRE and RE_gate. A gate of the transistor M51 is electrically connected to the node RE2. The capacitor C51 has a function of holding a potential difference between the node RE and RE_gate. A signal whose amplitude is larger than that of the signal EN_RE is input to the gate of the transistor M2 by bootstrap operation of the circuit 51.

<Operation Example of Flip-Flop>

Figure 6:
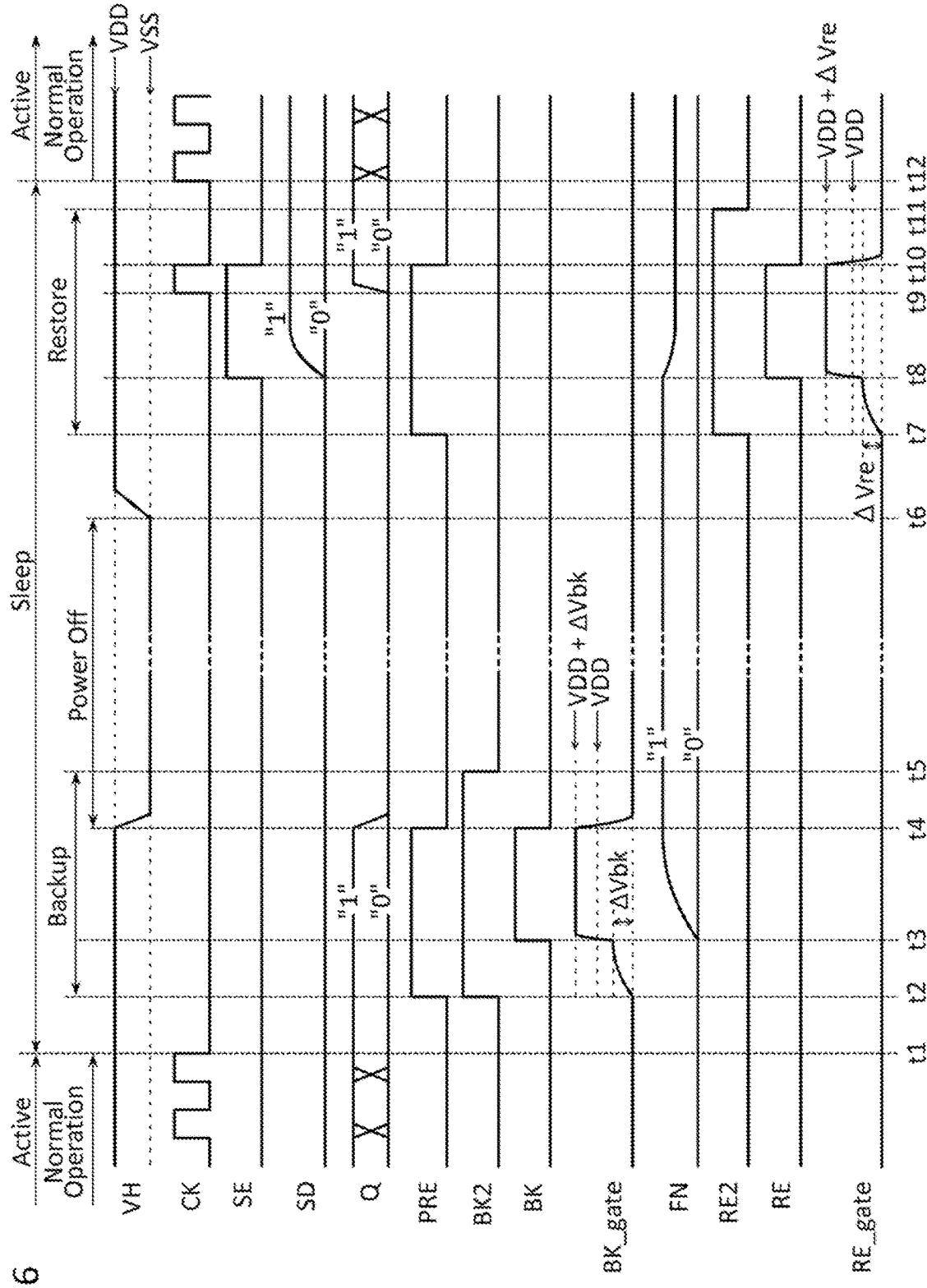
FIG. 6 is a timing chart illustrating an operation example of the flip-flop in FIG. 4.

FIG. 6 illustrates an operation example of the flip-flop 120 when the semiconductor device including the flip-flop 120 is transferred from an active mode to a sleep mode and an operation example of the flip-flop 120 when the semiconductor device is transferred from the sleep mode to the active mode.

FIG. 6 is a timing chart of the flip-flop 120 on the assumption that the transistors M1 to M3, M50, and M51 are OS transistors (high Vt transistors). Here, t1 to t12 each represent time. Low-level voltage of signals (e.g., a data signal, a clock signal, and EN_BK) input from the outside of the flip-flop 120 is VSS, and high-level voltage of the signals is VDD. In other words, the drive voltage of the backup circuit 150 is the same as that of the SFF 140. VDD is higher than the threshold voltage of the transistors M1 to M3, M50, and M51 but is not high enough to drive the transistors M1 to M3, M50, and M51 in saturation regions. Even when the backup circuit 150 including the OS transistors is driven with VDD (high power supply voltage), data backup and data restore of the SFF 140 can be performed correctly. This fact will be described in detail in Example 1.

<Active Mode>

In the active mode, the flip-flop 120 performs normal operation. The nodes PRE, BK2, BK, RE2, and RE are "L" in order to turn off the transistors M1 to M3. The node RT is "H" and a clock signal is input to the node CK. The logic of the node Q is changed at the time of the rise of the node CK.

<Sleep Mode>

A backup sequence is performed by transfer from the active mode to the sleep mode. In the backup sequence, clock gating (clock stop), data backup, and power gating (power-off) are performed.

(Backup Sequence)

Supply of a clock signal is stopped at t1 and the semiconductor device is set in the sleep mode. A period from t2 to t5 is a backup operation period. Precharge operation of BK_gate is performed in a period from t2 to t3. The nodes BK2 and PRE are set to "H" at t2. The transistor M50 is turned on, charge of the node PRE is stored in BK_gate, and the voltage of BK_gate is increased to ΔVbk. The voltage (VSS+ΔVbk) of BK_gate becomes lower than VDD because of the threshold voltage of the transistor M50. In the example of FIG. 6, the voltage of BK_gate is lower than the threshold voltage of the transistor M1, so that the transistor M1 is off.

The node BK is set to "H" at t3. The voltage of BK_gate is increased to VDD+ΔVbk in accordance with the increase of the voltage of the node BK from VSS to VDD by bootstrap operation of the circuit 50. In other words, voltage higher than VDD is applied to the gate of the transistor M1. Note that VDD+ΔVbk is higher than the threshold voltage of the transistor M1. That is, the capacitance of the capacitor C50 is determined so that VDD+ΔVbk is higher than the threshold voltage of the transistor M1.

Thus, when the node BK is set to "H," the node Q is electrically connected to the node FN by the transistor M1. In the case where the node Q is "1," charge in the node Q is stored in the node FN. In the case where the node Q is "0," the node FN is kept at "L." In other words, the logic of the node FN is the same as that of the node Q. Then, the nodes BK, PRE, and BK2 are set to "L" to terminate the backup sequence.

First, the node BK is set to "L" at t4. The node PRE is set to "L" before the node BK2 in order to set the voltage of BK_gate to VSS. Here, the node PRE is set to "L" at t4 together with the node BK. The voltage of BK_gate is decreased and the transistor M1 is turned off. The node FN becomes floating and the backup circuit 150 retains data. Then, the node BK2 is set to "L" at t5. Through these operations, the backup sequence is completed.

When the backup circuit 150 retains data, the power supply of the SFF 140 can be stopped. Here, the node RT is set to "L" and power gating is started at t4. The node VH is discharged and the potential of the node VH is set to VSS.

Note that power gating is performed as necessary. Depending on the power domain of the semiconductor device including the flip-flop 120, the sleep mode time, or the like, power required to return from the sleep mode to the active mode might be higher than power that can be reduced by power-off. In that case, the effect of power gating cannot be obtained; thus, in the sleep mode, it is preferable that power be not turned off and only clock gating be performed. Alternatively, voltage scaling in which power supply voltage is made lower than VDD may be performed to reduce consumed current of the SFF 140 in the sleep mode.

(Restore Sequence)

In a restore sequence where the mode is transferred from the sleep mode to the active mode, power is turned on, data is restored, and clocks are supplied. The mode is transferred to the active mode by starting supply of clocks.

The power is turned on at t6. Charge is stored in the node VH and the voltage of the node VH is increased to VDD. Restore operation is started after the voltage of the node VH is increased to VDD. A period from t7 to t11 is a restore operation period. First, the circuit 51 is driven and RE_gate is precharged in a period from t7 to t8. Precharging of RE_gate is similar to that of BK_gate. The nodes RE2 and PRE are set to "H" at t7. The transistor M51 is turned on, charge of the node PRE is stored in RE_gate, and the voltage of RE_gate is set to ΔVre. The voltage (VSS+ΔVre) of RE_gate becomes lower than VDD because of the threshold voltage of the transistor M51. In the example of FIG. 6, the voltage of RE_gate is lower than the threshold voltage of the transistor M2, so that the transistor M2 is off.

Data of the node FN is written to the node SD in a period from t8 to t10. When the node SE is set to "H" at t8, the SFF 140 can receive data of the node SD. In addition, the node RE is set to "H" at t8. The voltage of RE_gate is raised to VDD+ΔVre by the circuit 51. Note that VDD+ΔVre is higher than the threshold voltage of the transistor M2. That is, the capacitance of the capacitor C51 is determined so that VDD+ΔVre is higher than the threshold voltage of the transistor M2.

When the node RE is set to "H," the transistor M2 is turned on, and the node FN is electrically connected to the node SD. When the node FN is "L," the node SD is kept at "L." When the node FN is "H," charge of the node FN is stored in the node SD. That is, when the node RE is set to "H," data of the node FN is written to the node SD.

In the case where the node FN is electrically connected to the node SD while the node FN is "H" in order to write data of the node FN to the node SD by capacitance distribution, the voltage of the node FN is decreased by parasitic capacitance of the node SD. Thus, capacitance of the capacitor C1 needs to be much higher than the parasitic capacitance of the node SD. The capacitance of the capacitor C1 is determined in consideration of characteristics and the like of the SFF 140 to which data of the node SD is input.

A clock signal is input to the node CK at t9. The flip-flop 142 operates, and data of the node SD is written to the node Q. Thus, the SFF 140 returns to a state where the supply of clocks is stopped.

Next, in order to turn off the transistor M2, the voltage of RE_gate is returned to VSS and the SFF 140 returns to a state where data of the node D can be received. First, the nodes SE, PRE, and RE are set to "L" in synchronization with the fall in the node CK at t10. The node RE2 is set to "L" at t11. Through these operations, the restore sequence is completed, and the flip-flop 120 can perform the normal operation. When the input of a clock signal is restarted at t12, the flip-flop 120 restarts the normal operation.

When the backup circuit 150 includes the circuits 50 and 51, voltage higher than VDD can be input to the gates of the transistors M1 and M2. Therefore, it is not necessary to provide a level shifter for shifting the levels of drive signals EN_RE and EN_BK of the transistors M1 and M2.

Note that although a signal obtained by shifting the level of the signal EN_BK is input to the gate of the transistor M1, the signal EN_BK is input to a gate of the transistor M3. This is because the transistor M3 is driven only in scan test. When VDD is input to the gate of the transistor M3, the node SD_IN is electrically connected to the node SD. Thus, a circuit for raising the gate voltage of the transistor M3 is not necessarily required.

The flip-flop 120 can back up and restore data at high speed. For example, the flip-flop 120 can complete backup operation and restore operation within several clock cycles. In the example of FIG. 6, backup operation time and restore operation time are each four clock cycles.

The backup operation and the restore operation correspond to charging and discharging of the node FN by switching operation of the transistors M1 and M2; thus, energy required for these operations is low as in the case of a DRAM cell. In addition, since the backup circuit 150 does not consume power for data retention, the standby power of the flip-flop 120 can be reduced. Supply of power to the backup circuit 150 is not needed in normal operation; thus, even when the backup circuit 150 is provided, the dynamic power of the flip-flop 120 is not increased substantially.

Note that when the backup circuit 150 is provided, parasitic capacitance of the transistor M1 is added to the node Q. However, the parasitic capacitance of the transistor M1 is lower than parasitic capacitance due to a logic circuit connected to the node Q; thus, the influence of the parasitic capacitance of the transistor M1 on the normal operation of the flip-flop 120 is negligible. In other words, even when the backup circuit 150 is provided, there is no substantial decrease in the performance of the flip-flop 120 in the active mode.

<Other Structure Examples of Backup Circuit>

Other structure examples of the backup circuit are described with reference to FIG. 7, FIG. 8, FIG. 9, and FIG. 10.

Figure 7:
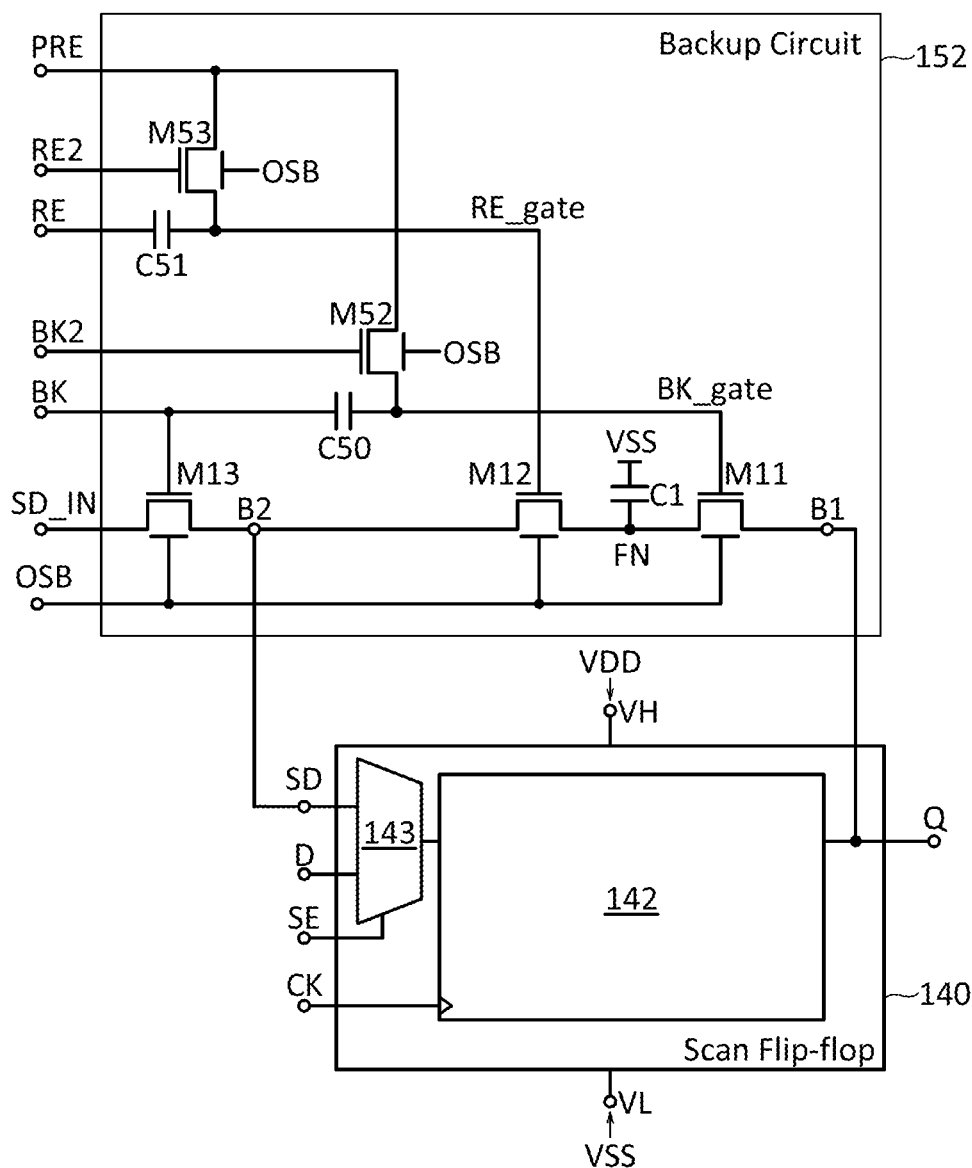
FIG. 7 is a circuit diagram illustrating a structure example of a flip-flop.
Figure 8:
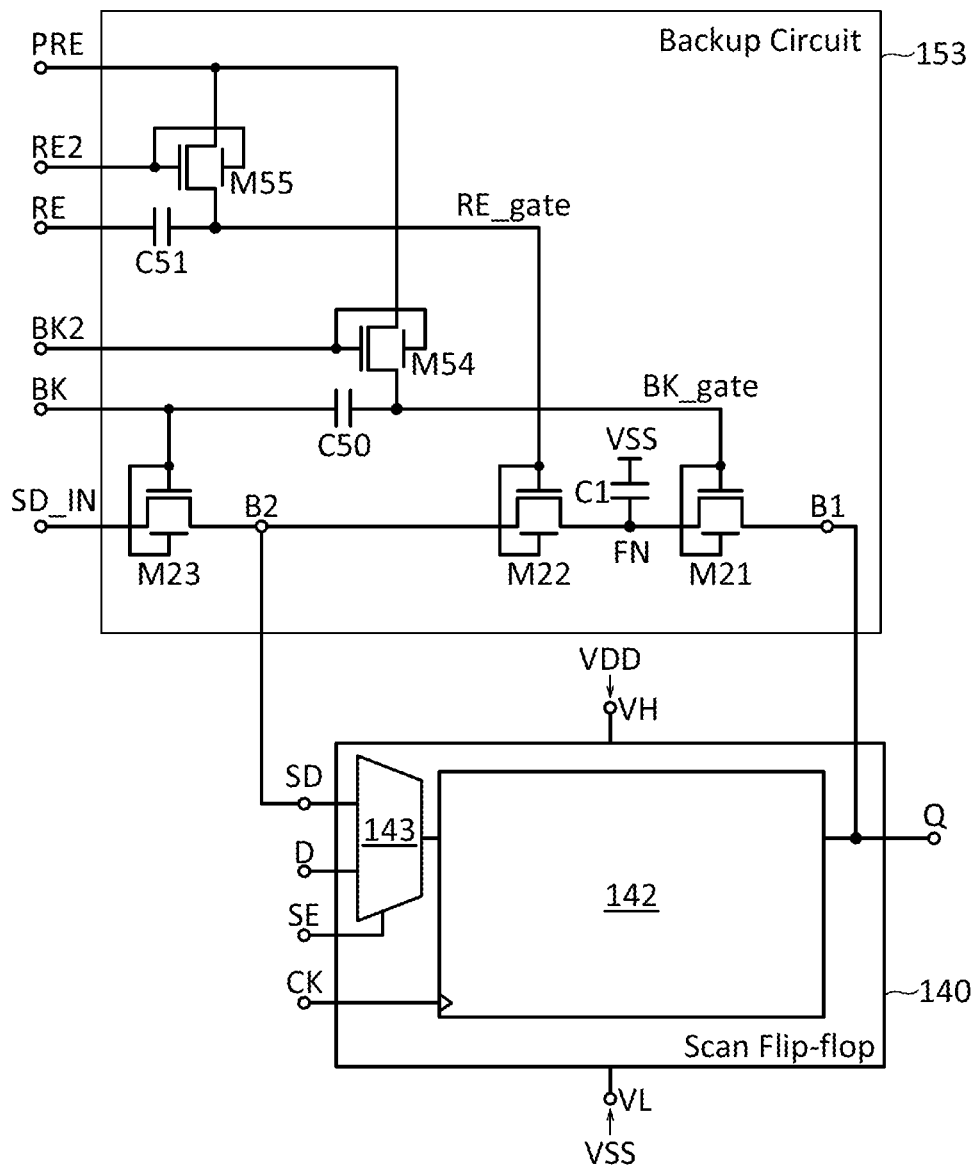
FIG. 8 is a circuit diagram illustrating a structure example of a flip-flop.

Some or all of the transistors M1 to M3, M50, and M51 can include back gates. In the case where the transistor includes a back gate, voltage can be input to the back gate from the outside, or the back gate can be electrically connected to any of a gate, a source, and a drain. FIG. 7 and FIG. 8 each illustrate an example in which a backup circuit includes transistors with back gates.

<Structure Example 2 of Backup Circuit>

A flip-flop 122 in FIG. 7 includes the SFF 140 and a backup circuit 152. The backup circuit 152 corresponds to a circuit obtained by replacement of the transistors in the backup circuit 150 with transistors M11 to M13, M52, and M53 with back gates. Back gates of these transistors are electrically connected to a node OSB. Vt of the transistors M11 to M13, M52, and M53 can be changed by the voltage of the node OSB.

For example, voltage lower than VSS is input to the node OSB while the node FN retains data, so that Vt of the transistors M11 and M12 is shifted positively and retention characteristics of the backup circuit 152 are improved. For example, when data of the node Q is written to the node FN or when data of the node FN is written to the node SD, voltage higher than VSS is applied to the node OSB, so that Vt of the transistors M11 to M13, M52, and M53 is shifted negatively and current drive capability of these transistors is improved. For example, in order to reduce the off-state current of the transistor M13 in normal operation, voltage lower than VSS is input to the node OSB, so that Vt of the transistor M13 is shifted positively.

In addition, constant voltage can be input to the node OSB regardless of the operating mode of the backup circuit 152. For example, in order to reduce the off-state current of the transistors M11 to M13, voltage lower than VSS is input to the node OSB.

<Structure Example 3 of Backup Circuit>

A flip-flop 123 in FIG. 8 includes the SFF 140 and a backup circuit 153. The backup circuit 153 corresponds to a circuit obtained by replacement of the transistors in the backup circuit 150 with transistors M21 to M23, M54, and M55 with back gates. The transistor M21 includes a back gate that is electrically connected to a gate. This can increase the current drive capability of the transistor M21. The same applies to the transistors M22, M23, M54, and M55.

<Structure Example 4 of Backup Circuit>

Figure 9:
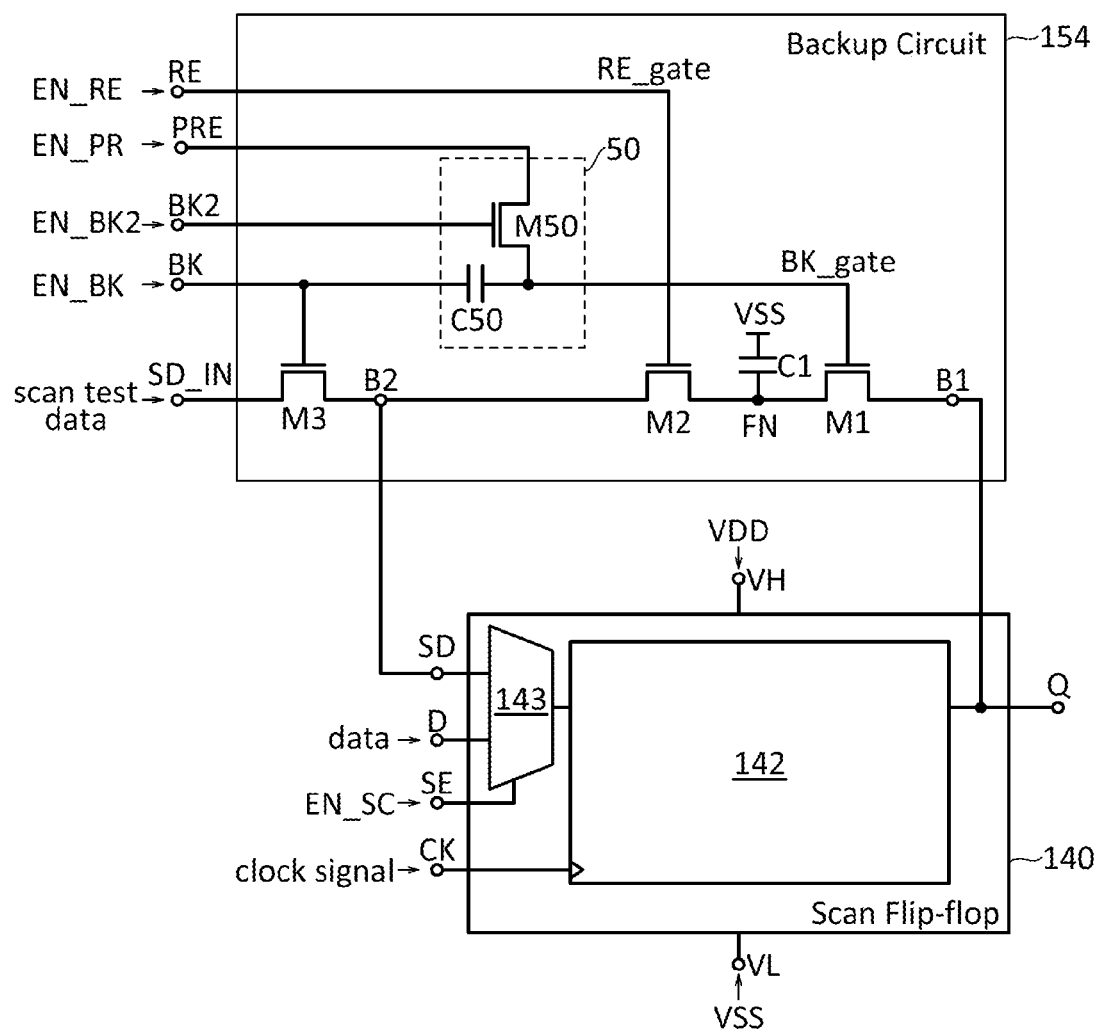
FIG. 9 is a circuit diagram illustrating a structure example of a flip-flop.

A flip-flop 124 in FIG. 9 includes the SFF 140 and a backup circuit 154. The backup circuit 154 is obtained by eliminating the circuit 51 from the backup circuit 150.

The node RE is electrically connected to the gate of the transistor M2, so that VDD is input to the gate of the transistor M2 in restore operation. Therefore, when data "1" of the node FN is written to the node SD by the backup circuit 150, the voltage of the node SD becomes lower than that in the example of FIG. 6; however, it does not pose any problems. The SFF 140 includes low Vt transistors and data of the node SD can be amplified by the logic gate in the SFF 140. Consequently, even when the backup circuit 154 is used, data "1" can be written from the node SD to the node Q correctly.

With the backup circuit 154, the number of elements and the number of signals can be reduced. In contrast, in the backup circuit 150, the transistor M2 can be driven with voltage higher than VDD; thus, the allowable voltage variation of the node FN is larger than that in the backup circuit 154. Accordingly, for example, capacitance of the capacitor C1 in the backup circuit 150 can be lower than that in the backup circuit 154.

As in the case of the backup circuits 152 and 153, some or all of the transistors in the backup circuit 154 can include back gates.

<Structure Example 5 of Backup Circuit>

Figure 10:
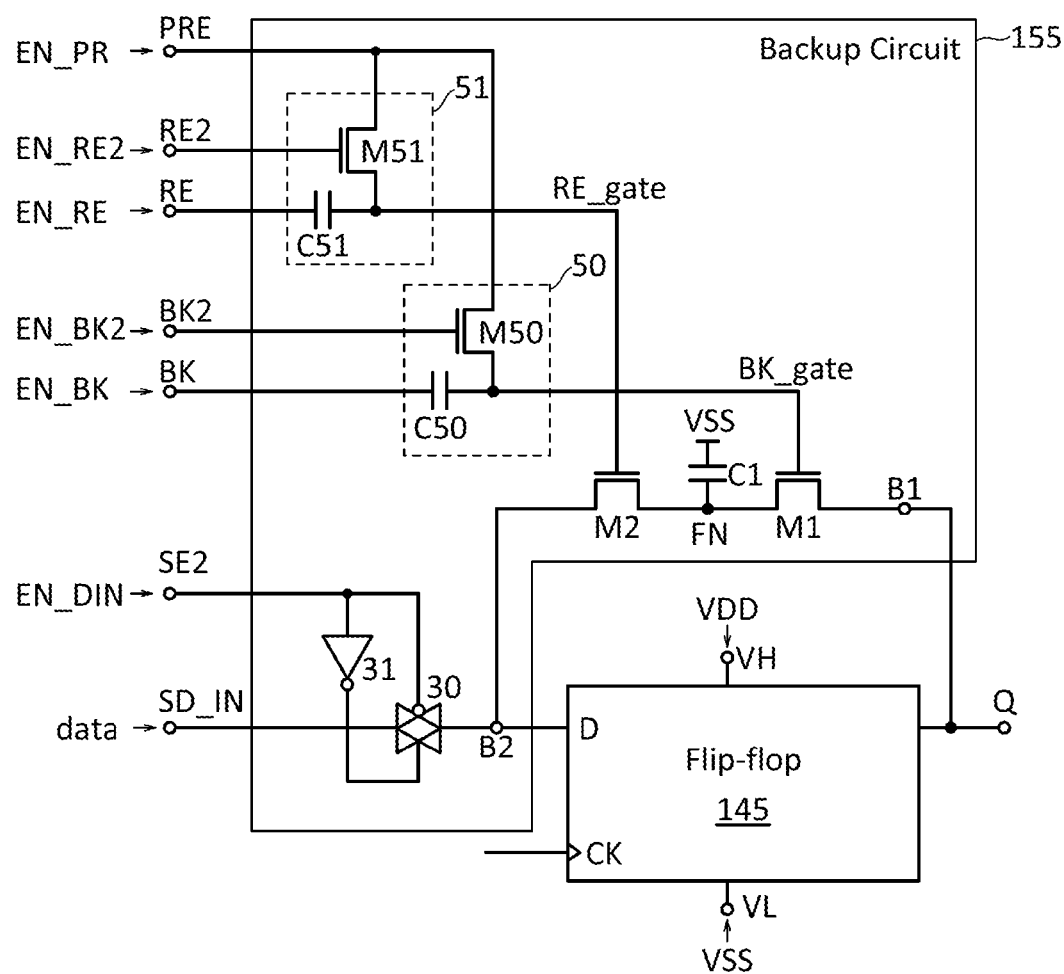
FIG. 10 is a circuit diagram illustrating a structure example of a flip-flop.

A flip-flop 125 in FIG. 10 includes a flip-flop 145 and a backup circuit 155. The backup circuit 155 is a modification example of the backup circuit 150, which includes an analog switch 30 and an INV 31 instead of the transistor M3. A node SE2 and an output node of the INV 31 are electrically connected to the analog switch 30. A control signal EN_DIN of the analog switch 30 is input to the node SE2.

In the backup circuit 20 (FIG. 1A), the switch SW1 and the switch SW3 are driven with the same signal E1; however, the switch SW1 and the switch SW3 can be driven with different signals. When the backup circuit has such a circuit structure, data backup and restore operations of a logic circuit (e.g., a flip-flop) that does not include a data selection portion in an input stage can be performed. The backup circuit 155 is an example of the circuit with this structure.

In the backup circuit 155, the node SD_IN is an input node of data processed by the flip-flop 145. The node B2 is electrically connected to the node D of the flip-flop 145. In normal operation, the node SE2 is set to "L" so that the node SD_IN is electrically connected to the node D. In restore operation, the node SE2 is set to "H" so that the node SD_IN is not electrically connected to the node D.

Some or all of the transistors M1, M2, M50, and M51 can be replaced with transistors with back gates. In addition, it is possible not to provide the circuit 51 in the backup circuit 155 like the backup circuit 154.

The backup circuit in this embodiment is a small-scale circuit that can perform backup and restore operations at high speed and low energy and does not consume energy for data retention. Therefore, even when the backup circuit is included in the semiconductor device, area overhead, performance overhead, and power overhead are negligible. Consequently, when the backup circuit is included in the semiconductor device, the power consumption of the semiconductor device can be effectively reduced by power gating.

Furthermore, it is possible to design a circuit by a combination of a logic circuit and a backup circuit without any design change in a logic cell prepared in a circuit library. Therefore, the ease of design is high and operation verification is facilitated. The same drive voltage for the logic circuit and the backup circuit results in high ease of design and operation verification.

Embodiment 2

As described above, the backup circuit in Embodiment 1 is highly suitable for normally-off computing. In this embodiment, a processor is described as an example of a semiconductor device that includes the backup circuit in Embodiment 1.

<Structure Example of Processor>

Figure 11:
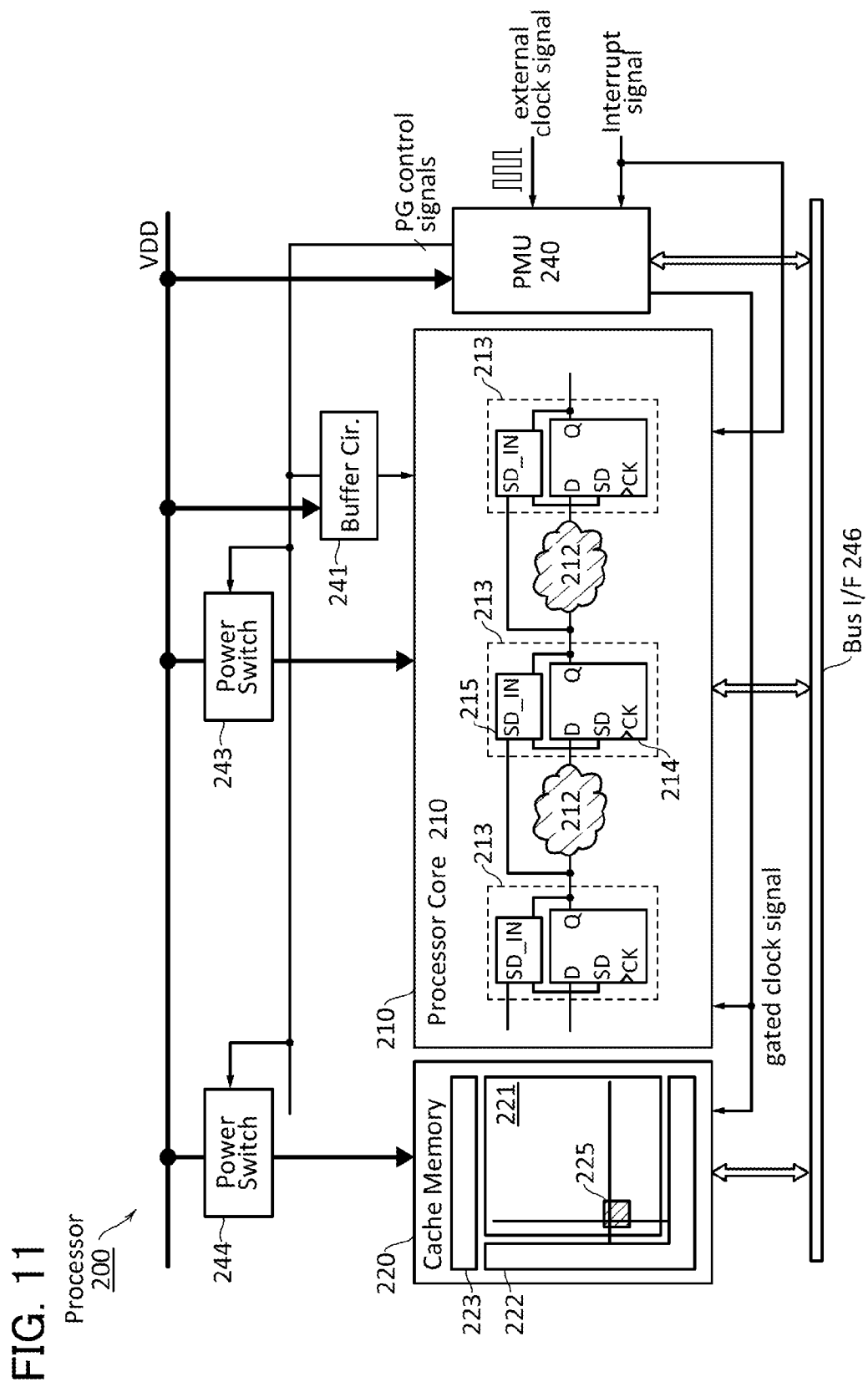
FIG. 11 is a block diagram illustrating a structure example of a processor.

FIG. 11 is a block diagram illustrating a structure example of a processor. A processor 200 includes a processor core 210, a cache memory 220, a power management unit (PMU) 240, a buffer circuit 241, power switches 243 and 244, and a bus interface (I/F) 246. Data is transmitted between the processor core 210 and a peripheral circuit such as the PMU 240 or the cache memory 220 through the bus I/F 246. A clock signal, an interrupt request signal, and the like are input to the processor 200 from the outside. An external clock signal is input to the PMU 240, and an interrupt request signal is input to the processor core 210 and the PMU 240.

The processor 200 can be applied to a variety of processors. For example, the processor 200 can also be applied to a central processing unit (CPU), a graphics processing unit (GPU), a programmable logic device (PLD), a digital signal processor (DSP), a microcontroller unit (MCU), and a custom LSI.

The processor core 210 includes a plurality of sequential circuits and a plurality of combinational circuits to form a variety of functional circuits. FIG. 11 illustrates two combinational circuits 212 and three flip-flops 213 as typical examples. The flip-flop 213 is mainly provided in a register. The flip-flop 213 is a scan flip-flop including a backup circuit. Here, 214 represents a scan flip-flop, and 215 represents a backup circuit. The backup circuit in Embodiment 1 is applied to the backup circuit 215. In order to perform scan test, the node SD_IN of the flip-flop 213 is electrically connected to the node Q of the flip-flop 213 in a preceding stage.

Figure 12:
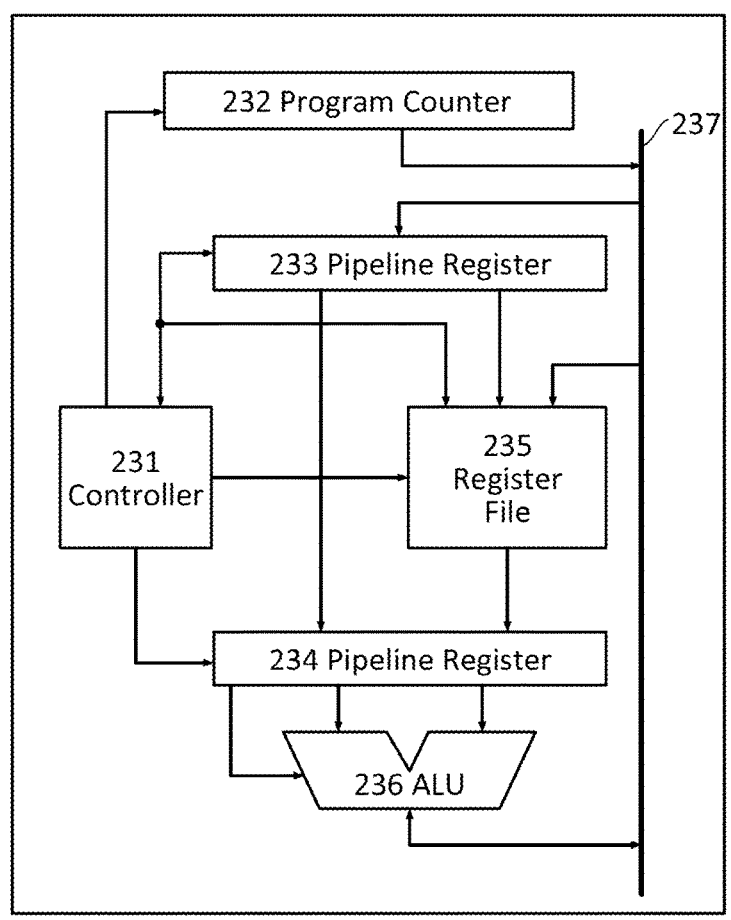
FIG. 12 is a block diagram illustrating a structure example of a processor core.

FIG. 12 illustrates a structure example of the processor core 210. The processor core 210 includes a controller 231, a program counter 232, a pipeline register 233, a pipeline register 234, a register file 235, an arithmetic logic unit (ALU) 236, and a data bus 237. Data is transmitted between the processor core 210 and a peripheral circuit such as the PMU 240 or a cache through the data bus 237.

The controller 231 has a function of decoding and executing instructions contained in a program such as input applications by controlling the overall operations of the program counter 232, the pipeline register 233, the pipeline register 234, the register file 235, the ALU 236, and the data bus 237. The ALU 236 has a function of performing a variety of arithmetic operations such as four arithmetic operations and logic operations. The program counter 232 is a register having a function of storing the address of an instruction to be executed next. The pipeline register 233 has a function of temporarily storing instruction data. The register file 235 includes a plurality of registers including a general-purpose register and can store data read from a main memory, data obtained as a result of arithmetic operations in the ALU 236, or the like. The pipeline register 234 has a function of temporarily storing data used for arithmetic operations performed in the ALU 236, data obtained as a result of arithmetic operations in the ALU 236, or the like.

The PMU 240 has a function of controlling power gating and clock gating. The PMU 240 generates a gated clock signal (GCLK) from an external clock signal. The signal GCLK is input to the processor core 210 and the cache memory 220. The PMU 240 has a function of generating a power gating (PG) control signal. Examples of the PG control signal include a signal for controlling the backup circuit 215 and a signal for controlling the power switches 243 and 244. The backup circuit control signal is input to the buffer circuit 241. The power switch 243 controls supply of VDD to the processor core 210, and the power switch 244 controls supply of VDD to the cache memory 220.

<Cache Memory>

The cache memory 220 is a storage device having a function of temporarily storing frequently used data. The cache memory 220 includes a memory cell array 221, a peripheral circuit 222, and a controller 223. The memory cell array 221 includes a plurality of memory cells 225. The controller 223 comprehensively controls the cache memory 220. For example, the controller 223 controls write and read operations of the memory cell array 221. The peripheral circuit 222 drives the memory cell array 221 in response to a control signal from the controller 223.

In order to perform power gating of the cache memory 220, the memory cell 225 can retain data even when VDD is not supplied. FIGS. 13A to 13F each illustrate a circuit structure example of such a memory cell. Furthermore, when the memory cell array 221 is formed using the memory cells described here, the cache memory 220 can be an embedded memory.

Write transistors of memory cells 251 to 253 in FIGS. 13A to 13E are OS transistors. Since the OS transistor has extremely low off-state current, the memory cells 251 to 253 in FIGS. 13A to 13E function as nonvolatile memory devices.

(1T1C)

Figure 13A:
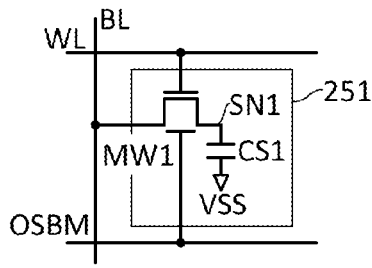
FIGS. 13A to 13F are circuit diagrams each illustrating a structure example of a memory cell.

The memory cell 251 in FIG. 13A is a 1T1C (one transistor and one capacitor) memory cell and is electrically connected to wirings WL, BL, and OSBM. The wiring BL is a bit line and the wiring WL is a word line.

The memory cell 251 includes a node SN1, a transistor MW1, and a capacitor CS1. The node SN1 is a retention node. The capacitor CS1 is a storage capacitor for holding charge of the node SN1. The transistor MW1 is a write transistor (OS transistor). The transistor MW1 has a function of controlling electrical continuity between the wiring BL and the node SN1. A gate of the transistor MW1 is electrically connected to the wiring WL. The transistor MW1 includes a back gate, and the back gate is electrically connected to the wiring OSBM. The back gate may be electrically connected to any of a gate, a source, and a drain of the transistor MW1, or the transistor MW1 does not necessarily include a back gate.

(2T)

Figure 13B:
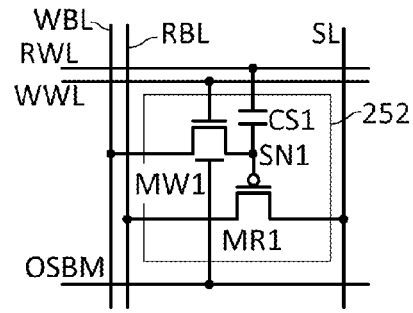

The memory cell 252 in FIG. 13B is a 2T (gain cell) memory cell and is electrically connected to wirings WWL, RWL, WBL, RBL, and SL and the wiring OSBM. The wiring WWL is a write word line; the wiring RWL is a read word line; the wiring WBL is a write bit line; the wiring RBL is a read bit line; and the wiring SL is a source line.

The memory cell 252 includes the node SN1, the capacitor CS1, the transistor MW1, and a transistor MR1. The transistor MW1 controls electrical continuity between the wiring WBL and the node SN1. The gate of the transistor MW1 is electrically connected to the wiring WWL. The transistor MR1 is a read transistor and controls electrical continuity between the wiring RBL and the wiring SL. A gate of the transistor MR1 is electrically connected to the node SN1. The capacitor CS1 is electrically connected to the node SN1 and the wiring RWL. A constant potential may be input to the wiring RWL, or the potential of the wiring RWL may be controlled in accordance with a selected or non-selected state of the memory cell 252.

Figure 13C:
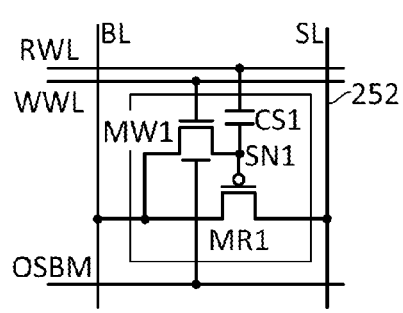

In the case where the memory cell 252 is used, the wiring BL may be used as a bit line for write and read operations, as illustrated in FIG. 13C. The transistor MR1 may be an n-channel transistor. The transistor MR1 can be a Si transistor.

(3T)

Figure 13D:
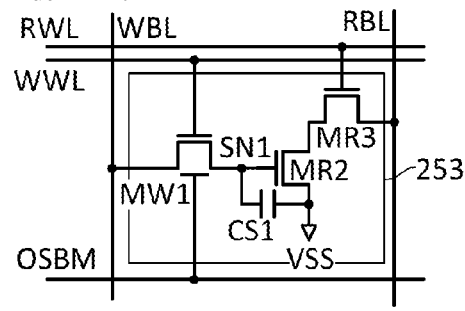
Figure 13E:
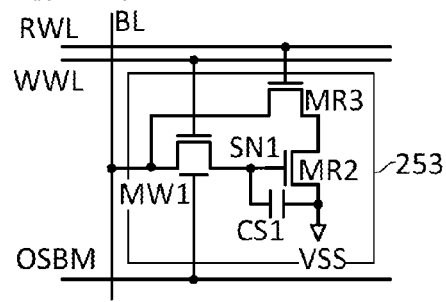

The memory cell 253 in FIG. 13D is a 3T (gain cell) memory cell and is electrically connected to the wirings WWL, RWL, WBL, RBL, and OSBM. The memory cell 253 includes the node SN1, the capacitor CS1, the transistor MW1, and transistors MR2 and MR3. The transistors MR2 and MR3 are electrically connected to each other in series. A gate of the transistor MR2 is electrically connected to the node SN1, and a gate of the transistor MR3 is electrically connected to the wiring RWL. The wiring BL can be provided as a bit line instead of the wirings WBL and RBL, as illustrated in FIG. 13E.

The transistor MR1 in the memory cell 252 and the transistors MR2 and MR3 in the memory cell 253 are not particularly limited, and can be Si transistors formed using a silicon wafer, for example. In the case where the transistors MR1 to MR3 are n-channel transistors, the transistors MR1 to MR3 may be OS transistors.

(SRAM)

Figure 13F:
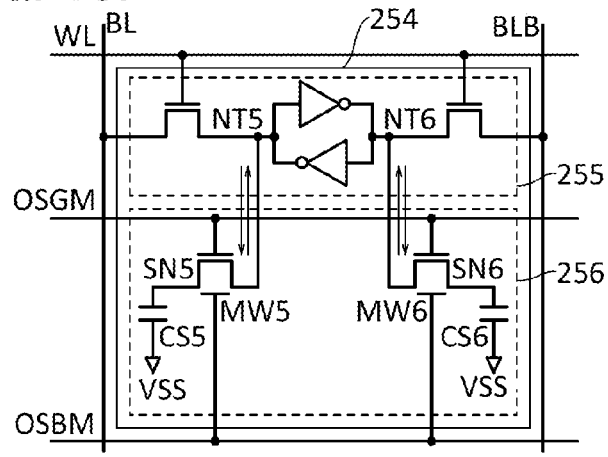

A memory cell 254 in FIG. 13F is an example of a combination of a volatile memory cell and a backup circuit. The memory cell 254 is electrically connected to the wirings WL, BL, and OSBM and wirings BLB and OSGM. The memory cell 254 includes a memory cell 255 and a backup circuit 256. The memory cell 255 is an SRAM memory cell, which includes two transistors and two inverter circuits. The backup circuit 256 has a function of backing up data of nodes NT5 and NT6 in the memory cell 255 and a function of restoring retained data to the nodes NT5 and NT6.

The backup circuit 256 includes nodes SN5 and SN6, transistors MW5 and MW6, and capacitors CS5 and CS6.

The transistors MW5 and MW6 are OS transistors. Back gates of the transistors MW5 and MW6 are electrically connected to the wiring OSBM. The back gate of the transistor MW5 may be electrically connected to any of a gate, a source, and a drain of the transistor MW5, or the transistor MW5 does not necessarily include a back gate. The same applies to the transistor MW6. The capacitors CS5 and CS6 are storage capacitors for holding charge of the nodes SN5 and SN6.

In an active mode, the transistors MW5 and MW6 are off and the memory cell 254 functions as an SRAM cell. In a backup sequence, the transistors MW5 and MW6 are turned on to write data of the node NT5 to the node SN5 and write data of the node NT6 to the node SN6. In a restore sequence, the transistors MW5 and MW6 are turned on to write data of the node SN5 to the node NT5 and write data of the node SN6 to the node NT6.

For example, in the case where primary (L1) and secondary (L2) cache memories are provided in the processor 200, the L1 cache memory can be formed using the memory cell 254, and the L2 cache memory can be formed using any of the memory cells 251 to 253. Alternatively, the L1 cache memory can be formed using the memory cell 252 or 253, and the L2 cache memory can be formed using the memory cell 251. For example, in the case where the L1 cache memory, the L2 cache memory, and a third level (L3) cache memory are provided in the processor 200, the L1 cache memory can be formed using any of the memory cells 252 to 254, the L2 cache memory can be formed using the memory cell 252 or 253, and the L3 cache memory can be formed using any of the memory cells 251 to 253.

<Power Gating>

Figure 14:
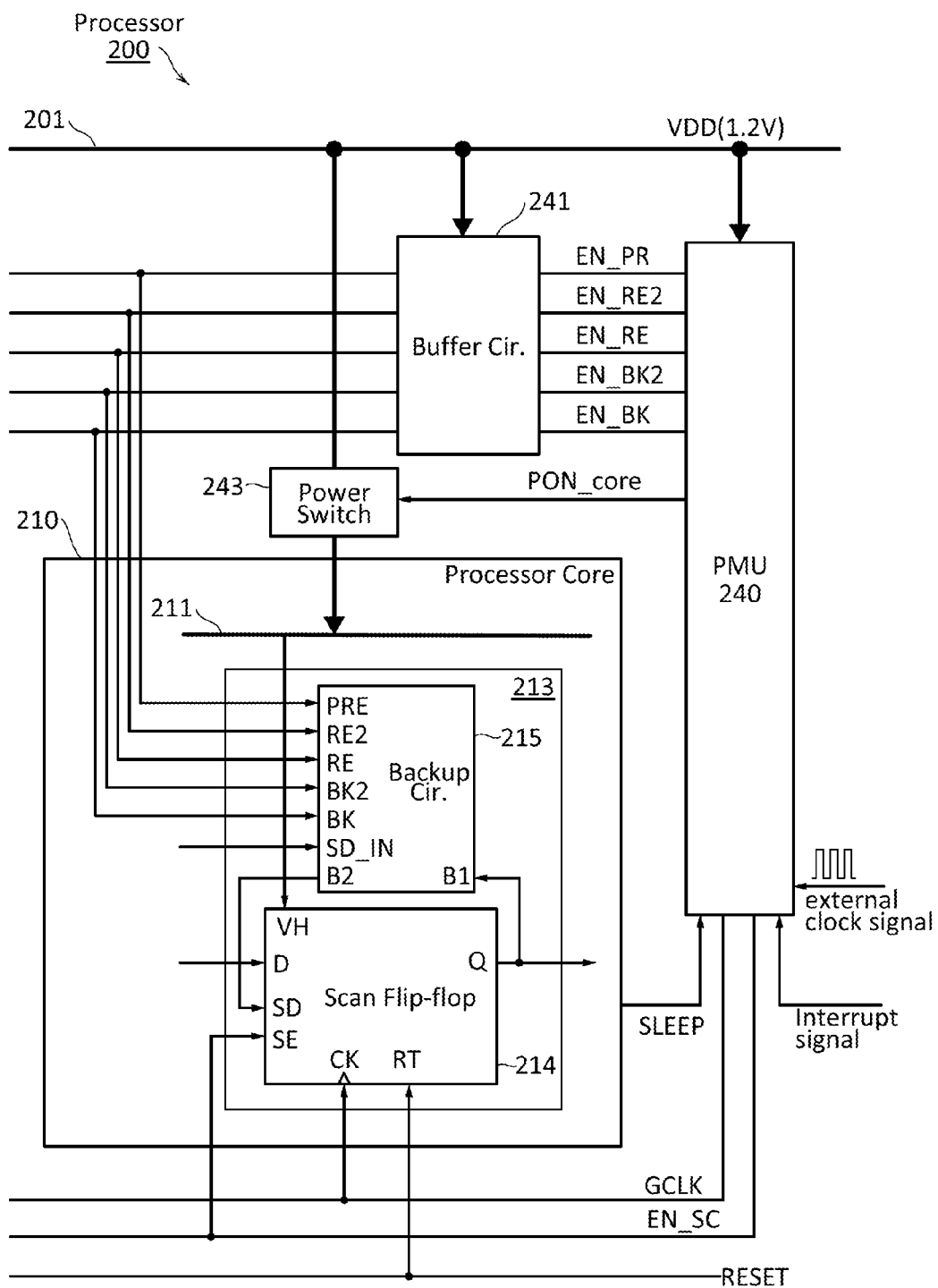
FIG. 14 is a block diagram illustrating a structure example of main components of a processor.

Power gating of the processor core 210 is described with reference to FIG. 14. FIG. 14 is a block diagram illustrating main components of the processor 200. Here, the flip-flop 120 (FIG. 4 and FIG. 5) is used as the flip-flop 213.

The power switch 243 controls electrical continuity between a power supply line 201 and a power supply line 211. The power supply voltage VDD is supplied from an external power supply circuit to the power supply line 201. The power supply line 211 is a power supply line for supplying VDD to the processor core 210. Supply of VDD to the power supply line 211 is controlled by the power switch 243. The node VH of the flip-flop 213 is electrically connected to the power supply line 211.

The PMU 240 generates a control signal (PON_core) of the power switch 243, a control signal (e.g., EN_BK or EN_RE) of the backup circuit 215, and a control signal (EN_SC) of the scan flip-flop 214. Here, a signal RESET is input from the outside of the processor 200. The control signal (e.g., EN_BK or EN_RE) generated in the PMU 240 is input to the backup circuit 215 through the buffer circuit 241. Since bootstrap circuits are provided in the backup circuit 215, the buffer circuit 241 does not necessarily have a level shift function, and the power supply voltage can be the same as the power supply voltage (e.g., 1.2 V) of the processor core 210.

A signal SLEEP is output from the processor core 210 to the PMU 240. The signal SLEEP is a trigger signal for transferring the processor core 210 to the sleep mode. When the signal SLEEP is input to the PMU 240, the PMU 240 outputs a control signal for transition from the active mode to the sleep mode to a functional circuit to be controlled (see FIG. 6). First, the PMU 240 stops the supply of a clock signal to the processor core 210. Then, the backup sequence is started. The PMU 240 controls the power switch 243 and stops the supply of VDD to the processor core 210 as necessary.

The processor core 210 can be transferred from the active mode to the sleep mode in response to an interrupt request signal.

Processing for returning the processor core 210 from the sleep mode to the active mode is executed by input of an interrupt request signal, for example. The PMU 240 outputs a control signal for transition from the sleep mode to the active mode to a functional circuit to be controlled in response to an interrupt request signal (see FIG. 6). First, the PMU 240 controls the power switch 243 and restarts the supply of VDD to the processor core 210. Then, the PMU 240 outputs a control signal for executing the restore sequence. Finally, the PMU 202 restarts the supply of a clock signal.

The PMU 240 may include a timer circuit for measuring time. The processor core 210 may be transferred from the active mode to the sleep mode or transferred from the sleep mode to the active mode based on the measurement time of the timer circuit.

When the power switch 244 is driven, the peripheral circuit 222 and the controller 223 of the cache memory 220 are power gated in accordance with power gating of the processor core 210. Note that in the case where the memory cell array 221 includes the memory cell 254 in FIG. 13F, the memory cell array 221 is also power gated.

<Structure Example of Flip-Flop 213>

The area overhead of the flip-flop 213 due to implementation of the backup circuit 215 is negligible. In addition, the backup circuit 215 can be implemented in the flip-flop 213 without any change in the circuit structure and layout of the scan flip-flop 214. This fact is described with reference to FIG. 15.

Figure 15:
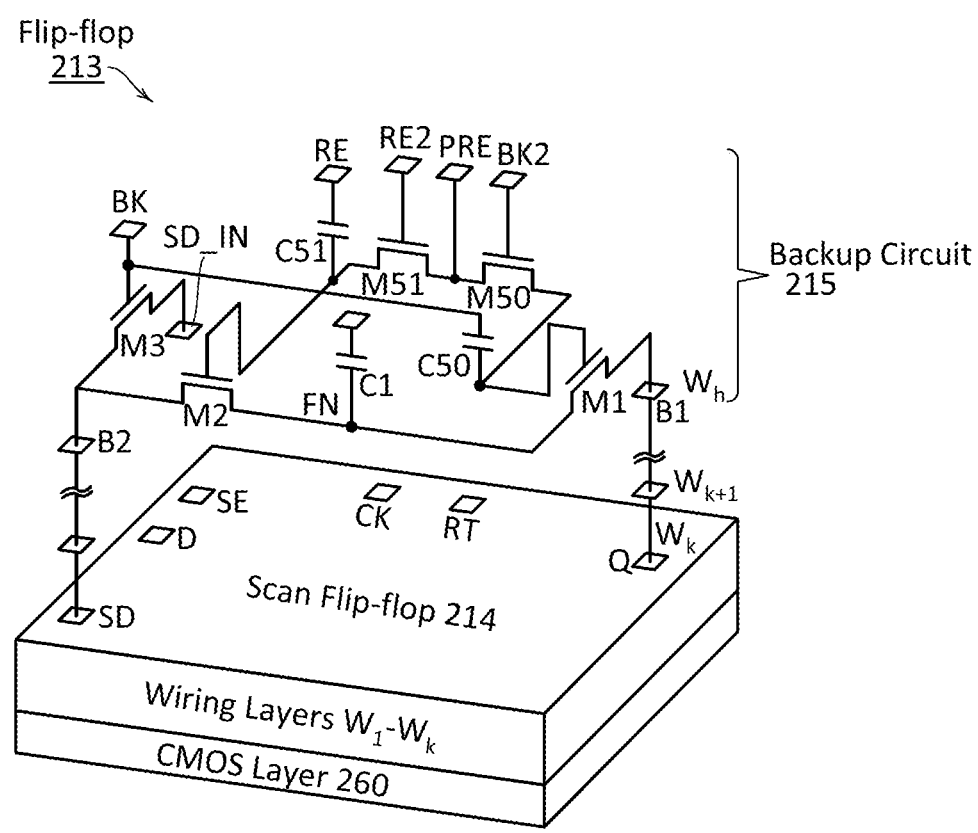
FIG. 15 is a circuit diagram schematically illustrating a layered structure of a flip-flop.

FIG. 15 is a circuit diagram schematically illustrating the layered structure of the flip-flop 213. As illustrated in FIG. 15, the flip-flop 213 can have a 3 D structure in which the backup circuit 215 is stacked over the scan flip-flop 214. A first wiring layer, a k-th wiring layer, a (k+1)th wiring layer, and an h-th wiring layer are denoted by $W_1$, $W_k$, $W_{k+1}$, and $W_h$, respectively. Here, k is an integer of 1 or more and h is an integer of (k+2) or more. The nodes D, SD, Q, SE, CK, and RT of the scan flip-flop 214 are provided in the wiring layer $W_k$, and the nodes SD_IN, B1, and B2 of the backup circuit 215 are provided in the wiring layer $W_h$.

The transistors M1 to M3, M50, and M51 of the backup circuit 215 are OS transistors. The transistors of the scan flip-flop 214 can be formed by a standard CMOS process. The transistors of the scan flip-flop 214 are provided in a layer 260. Here, the layer 260 is referred to as a CMOS layer 260. Conductors of the wiring layers $W_1$ to $W_k$ electrically connect the transistors of the CMOS layer 260 to each other to form the scan flip-flop 214. Conductors of the wiring layers $W_{k+1}$ to $W_h$ electrically connect the scan flip-flop 214 to the backup circuit 215.

The number of elements in the backup circuit 215 is much smaller than the number of elements in the scan flip-flop 214; thus, there is no need to change the circuit structure and layout of the scan flip-flop 214 in order to stack the backup circuit 215. In other words, the backup circuit 215 has very broad utility. In addition, the backup circuit 215 can be stacked in a region where the scan flip-flop 214 is formed; thus, even when the backup circuit 215 is included, the area overhead of the flip-flop 213 can be zero.

The flip-flop 213 can be arranged so that scan test can be carried out efficiently. In other words, when the backup circuit 215 is used, an integrated circuit with a backup function can be designed easily and the ease of the test can be secured. In addition, the processor core 210 can be designed easily and the ease of verification can be secured because the backup circuit 215 can be driven with the power supply voltage VDD as in the case of the other circuits of the processor core 210.

In the processor core 210, as in the scan flip-flop 214, another standard cell such as a NAND circuit or an inverter circuit is provided in the stack of the CMOS layer 260 and the wiring layers $W_1$ to $W_k$. Conductors for connecting the backup circuit 215 to the nodes SD and Q are formed in the wiring layers $W_1$ to $W_k$; thus, it is necessary to lay out wirings of other standard cells by diverting the wirings around these conductors. Accordingly, the area of the processor core 210 is increased in some cases. The flip-flop 213 is a kind of standard cell included in the processor core 210 in many cases; however, the area overhead of the flip-flop 213 due to the backup circuit 215 is zero. Thus, the area overhead of the processor core 210 is due to the change in the layout of wirings between the standard cells and can be less than several percent.

When the scan flip-flop in this embodiment includes a backup circuit, for example, the following beneficial effects can be obtained. The area overhead of the scan flip-flop due to the backup circuit is negligible. Even when the backup circuit is provided, the increase in power consumption in normal operation is negligible, and performance in the normal operation is hardly decreased. The backup circuit can perform backup and restore operations at low power and high speed and can retain data without the supply of power. In addition, the scan flip-flop can be designed by directly using a scan flip-flop in a circuit library; thus, the scan flip-flop can be designed easily. Consequently, an integrated circuit including the scan flip-flop does not decrease the ease of test even when the scan flip-flop forms a scan chain.

In this manner, the scan flip-flop is highly suitable for normally-off computing. Even when the scan flip-flop is included, the dynamic power of the integrated circuit can hardly be increased and the performance of the integrated circuit can hardly be decreased. Thus, the integrated circuit including the scan flip-flop can reduce power consumption effectively by power gating while keeping the performance.

Unlike the off-state current of a Si transistor, the off-state current of an OS transistor hardly depends on temperature. The off-state current of the OS transistor even in a high temperature condition is hardly changed from the off-state current of the OS transistor at room temperature. A backup circuit and a memory cell that are formed using OS transistors do not lose data even in a high temperature condition. Therefore, this embodiment is suitable for a processor used in a high temperature condition.

Embodiment 3

In this embodiment, an IC chip, an electronic component, electronic devices, and the like are described as examples of a semiconductor device.

<Example of Manufacturing Method of Electronic Component>

Figure 16A:
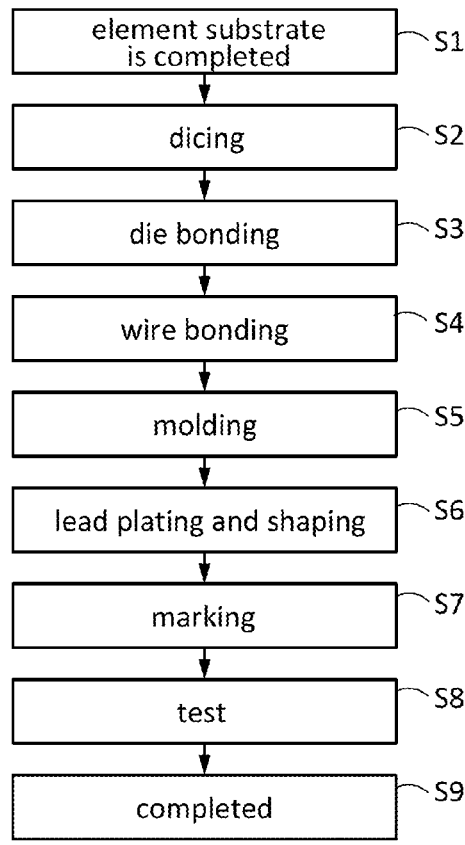
FIG. 16A is a flow chart showing an example of a method for manufacturing an electronic component.

FIG. 16A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed wiring board through an assembly process (post-process). The post-process can be finished through steps in FIG. 16A. Specifically, after an element substrate obtained in a wafer process is completed (Step S1), a rear surface of the substrate is ground. The substrate is thinned in this step to reduce warpage or the like of the substrate in the wafer process and to reduce the size of the electronic component.

Next, the substrate is divided into a plurality of chips in a dicing step (Step S2). The divided chips are separately picked up to be mounted on and bonded to a lead frame in a die bonding step (Step S3). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (Step S4). A silver line or a gold line can be used as the metal fine line. Either ball bonding or wedge bonding may be used as wire bonding.

A molding step is performed to seal the wire bonded chip with an epoxy resin or the like (Step S5). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (Step S6). This plating step prevents rust of the lead and facilitates soldering at the time of mounting the chip on a printed wiring board in a later step. Printing (marking) is performed on a surface of the package (Step S7). Through an inspection step (Step S8), the electronic component is completed (Step S9). When the electronic component includes the semiconductor device described in the above embodiment, a low-power small electronic component can be provided.

Figure 16B:
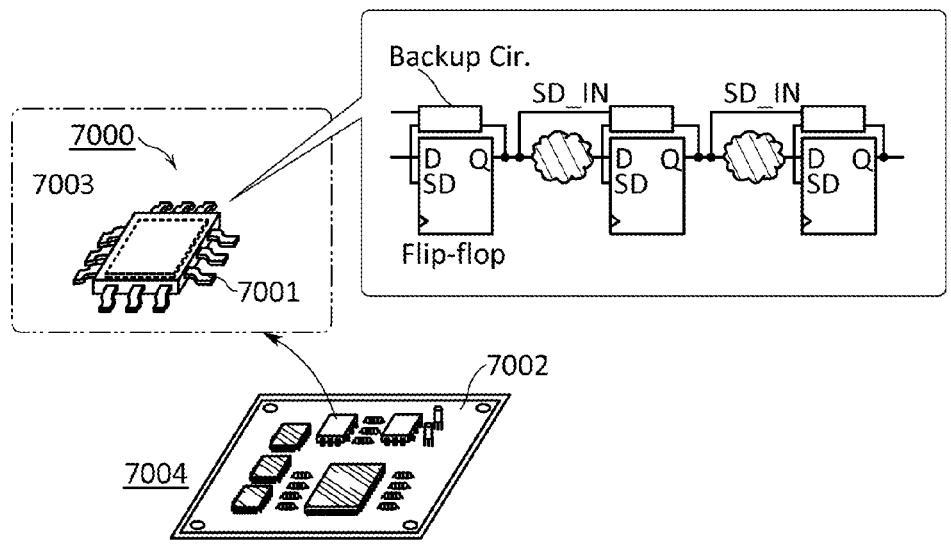
FIG. 16B is a schematic perspective view illustrating a structure example of the electronic component.

FIG. 16B is a schematic perspective view of the completed electronic component. FIG. 16B illustrates a schematic perspective view of a quad flat package (QFP) as an example of the electronic component. As illustrated in FIG. 16B, an electronic component 7000 includes a lead 7001 and a circuit portion 7003. In the circuit portion 7003, the logic circuit with the backup circuit in Embodiment 1, the processor in Embodiment 2, and the like are formed, for example. The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. The electronic component 7000 can be used as, for example, a random access memory that stores data or a processing unit that executes a variety of processings, such as a CPU, a microcontroller unit (MCU), a microprocessor (MPU), an FPGA, or a wireless IC. When an electronic device includes the electronic component 7000, the power consumption of the electronic device can be reduced. Alternatively, the electronic device can have smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

(Sensor Device)

A sensor device is described as an example of an electronic device.

Figure 17:
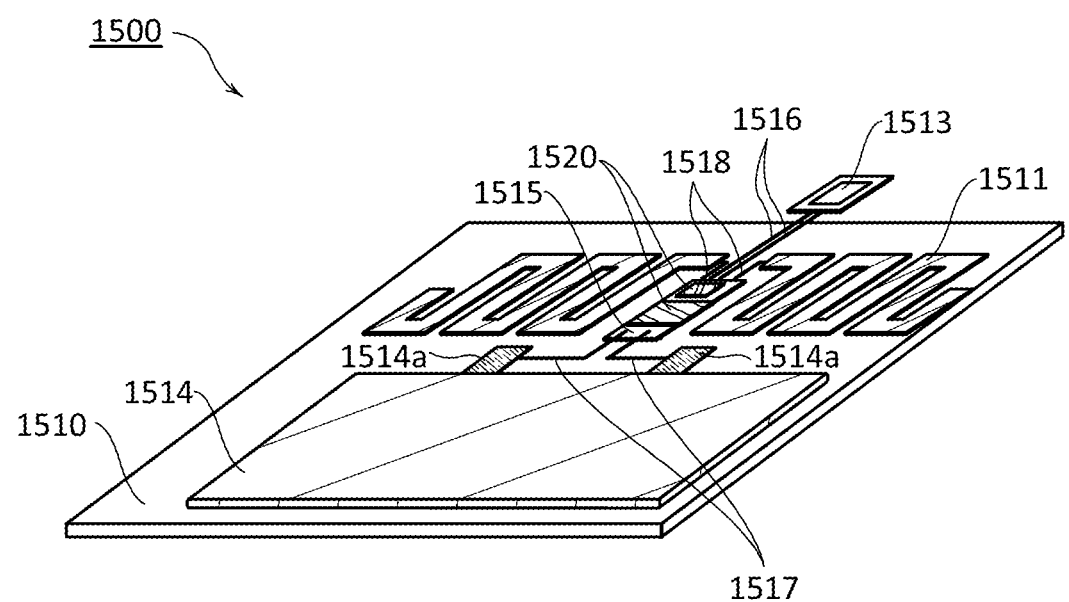
FIG. 17 illustrates a structure example of a sensor device.

The processor in Embodiment 2 is a low-power processor capable of performing normally-off driving with power gating. Thus, a sensor device in which the processor, a wireless communication device, and a sensor are combined is highly preferable for a sensor network device. FIG. 17 illustrates an example of a sensor device capable of performing wireless communication. A sensor device 1500 in FIG. 17 includes a support 1510, an antenna 1511, a sensor 1513, a battery 1514, a circuit board 1515, conducting wires 1516, conducting wires 1517, and conducting wires 1518.

The circuit board 1515 includes a variety of electronic components 1520. For example, an IC including a microprocessor and an IC including a wireless communication device are provided as the electronic components 1520. The processor in Embodiment 2 is used as the microprocessor.

The antenna 1511 is connected to the electronic components 1520 through the conducting wires 1518. The sensor 1513 is connected to the electronic components 1520 through the conducting wires 1516. The sensor 1513 is formed either outside the support 1510 or over the support 1510. The sensor 1513 has a function of outputting various kinds of data such as thermal data, mechanical data, and electromagnetic data, as analog data.

The battery 1514 includes a pair of terminals 1514a (a positive electrode terminal and a negative electrode terminal). The pair of terminals 1514a is connected to the electronic components 1520 through the conducting wires 1517 and the circuit board 1515. The battery 1514 may be provided as appropriate in accordance with the operation power of the sensor device 1500. When the low-power processor in Embodiment 2 is used as the processor, the sensor device 1500 can be driven with power obtained from a signal received by the antenna 1511.

The support 1510 can be formed using glass, quartz, plastics, metal, stainless steel foil, tungsten foil, a flexible substrate, an attachment film, a substrate film, paper including a fibrous material, or wood, for example. Examples of the flexible substrate include a flexible synthetic resin such as plastics typified by polyethylene terephthalate (PET), polyethylene naphthalate (PEN), and polyether sulfone (PES), and acrylic. Examples of the attachment film include attachment films formed using polypropylene, polyester, polyvinyl fluoride, polyvinyl chloride, and the like.

The sensor device 1500 is preferably thin. In particular, the thickness of the sensor device 1500 including the thicknesses of the battery 1514 and the support 1510 is larger than or equal to 0.1 mm and smaller than or equal to 5 mm, preferably larger than or equal to 0.1 mm and smaller than or equal to 3 mm, more preferably larger than or equal to 0.1 mm and smaller than or equal to 1 mm. The sensor device 1500 with the above structure can be embedded in paper such as a poster or corrugated cardboard.

For example, when the support 1510 and the battery 1514 can be changed in their forms with a curvature radius of greater than or equal to 30 mm, preferably greater than or equal to 10 nm, the sensor device 1500 can be flexible. Thus, the sensor device 1500 with the above structure can be attached to clothes, a human body, or the like.

Figure 18A:
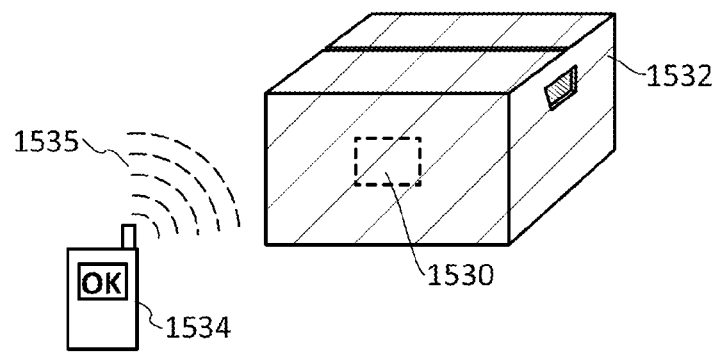
FIGS. 18A to 18C each illustrate an application example of a sensor device.

Application examples of a sensor device are described with reference to FIGS. 18A to 18C and FIG. 19. For example, a tag for individual identification can be used. FIG. 18A is a schematic diagram of an individual identification system including a sensor device. A sensor device 1530 is attached to an item 1532 or provided in the item 1532. A wireless signal 1535 is transmitted from an external reader 1534. When the sensor device 1530 receives the wireless signal 1535, the sensor device 1530 transmits data (e.g., an identification number or weight) stored in the sensor device 1530 and data obtained by sensing (e.g., position, temperature, or humidity) to the reader 1534.

Figure 18B:
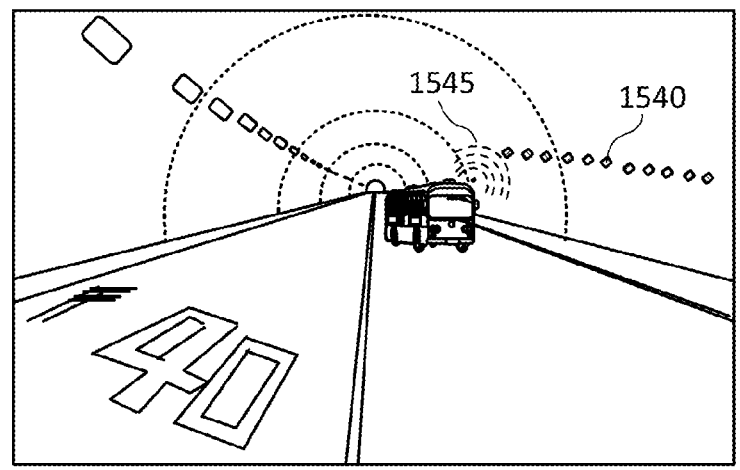

For example, as illustrated in FIG. 18B, a sensor device 1540 is embedded in a tunnel wall and a wireless signal 1545 is transmitted from the outside to the sensor device 1540. The sensor device 1540 that has received the wireless signal 1545 can obtain and transmit data on the tunnel wall.

Figure 18C:
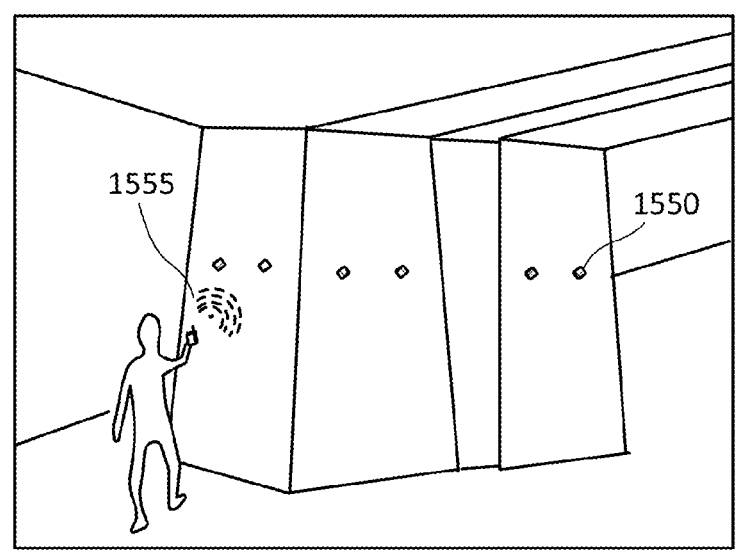

For example, as illustrated in FIG. 18C, a sensor device 1550 is embedded in a wall surface of a pillar of a bridge and a wireless signal 1555 is transmitted from the outside to the sensor device 1550. The sensor device 1550 that has received the wireless signal 1555 can obtain and transmit data on the pillar of the bridge.

Figure 19:
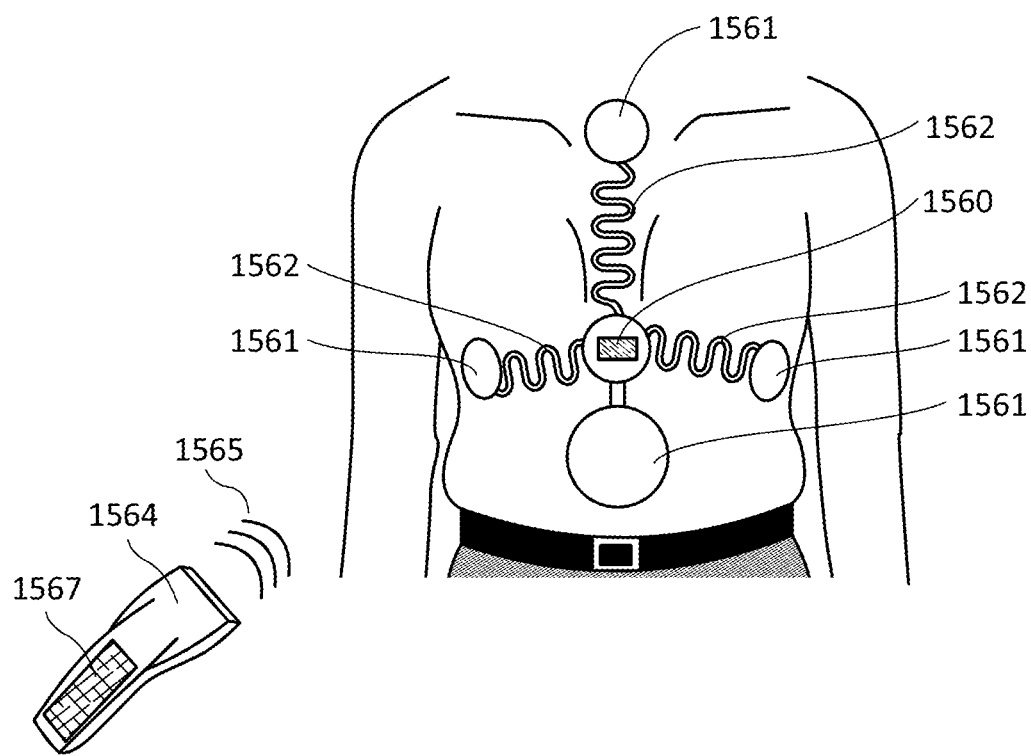
FIG. 19 illustrates an application example of a sensor device.

A sensor device can be applied to a healthcare device. Such an example is illustrated in FIG. 19. For example, a sensor device 1560 is attached to a human body with the use of a bond pad or the like, and a wireless signal 1565 is transmitted from a reader 1564. The sensor device 1560 that has received the wireless signal 1565 can obtain and transmit data such as biological data by supplying a signal to an electrode 1561 or the like attached to the human body through a wiring 1562. The obtained data can be checked on a display portion 1567 of the reader 1564.

Other specific examples of electronic devices are described below with reference to FIGS. 20A to 20C and FIGS. 21A to 21E. Note that a touch panel including a touch sensor may be used for a display portion of each of the electronic devices in FIGS. 20A to 20C and FIGS. 21A to 21C. With the touch panel, the display portion can also function as an input portion of the electronic device.

Figure 20A:
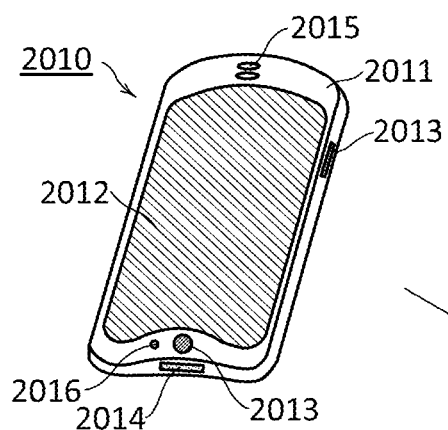
FIGS. 20A to 20C illustrate structure examples of electronic devices.

An information terminal 2010 in FIG. 20A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Power on/off operation, screen switching of the display portion 2012, and the like can be performed by pressing the operation button 2013.

Figure 20B:
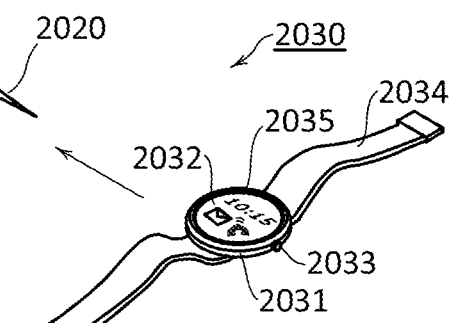

FIG. 20B illustrates an example of a watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. When the information terminal 2010 receives an incoming e-mail or call, for example, information notifying the incoming e-mail or call can be displayed on the display portion 2032 of the information terminal 2030.

Figure 20C:
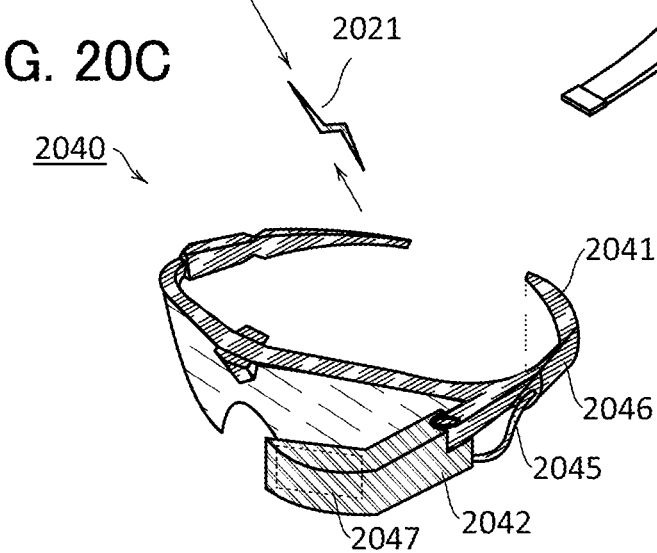

FIG. 20C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components. Power is supplied from the battery 2046 to the display portion 2047 and the electronic components in the housing 2042 through the cable 2045. A variety of information such as an image or the like transmitted wirelessly is displayed on the display portion 2047.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 21A:
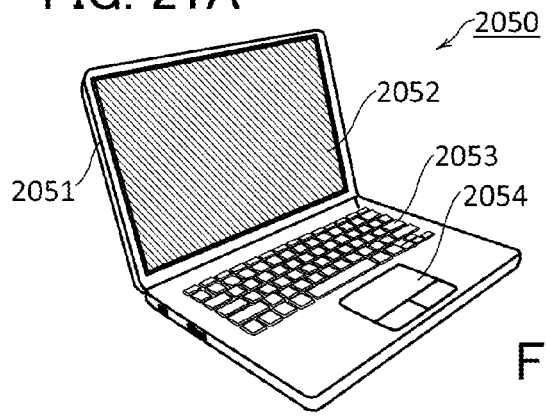
FIGS. 21A to 21E illustrate structure examples of electronic devices.

A laptop 2050 in FIG. 21A includes a housing 2051, a display portion 2052, a keyboard 2053, and a pointing device 2054. The laptop 2050 can be operated by touch operation of the display portion 2052.

Figure 21B:
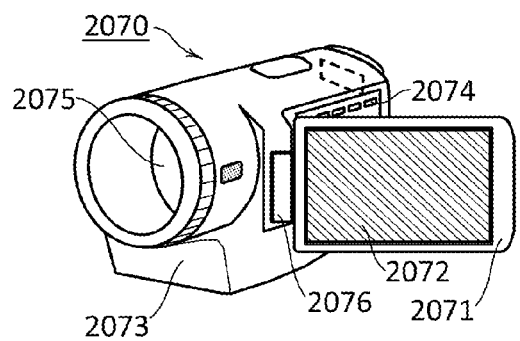

A video camera 2070 in FIG. 21B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 21C:
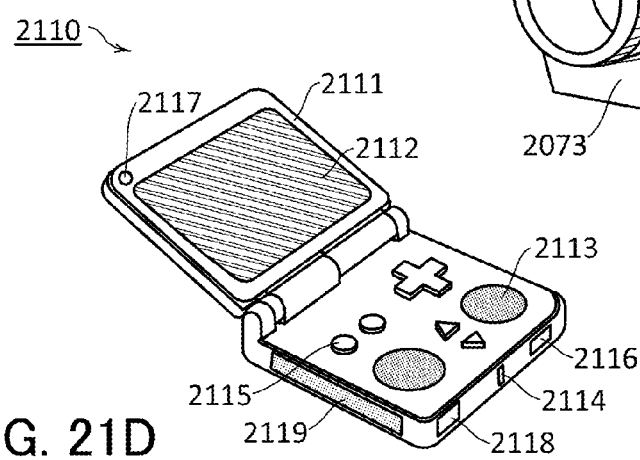

A portable game machine 2110 in FIG. 21C includes a housing 2111, a display portion 2112, speakers 2113, an LED lamp 2114, operation key buttons 2115, a connection terminal 2116, a camera 2117, a microphone 2118, and a recording medium read portion 2119.

Figure 21D:
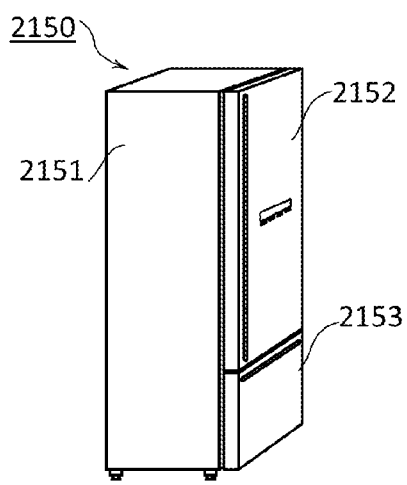

An electric refrigerator-freezer 2150 in FIG. 21D includes a housing 2151, a refrigerator door 2152, a freezer door 2153, and the like.

Figure 21E:
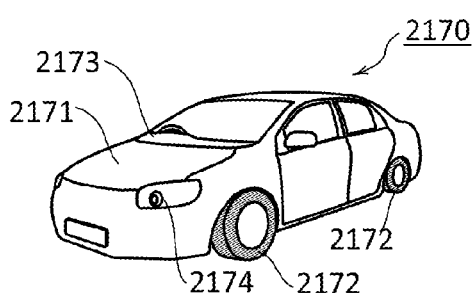

A motor vehicle 2170 in FIG. 21E includes a car body 2171, wheels 2172, a dashboard 2173, lights 2174, and the like. The processor in Embodiment 2 is used as each of processors in the motor vehicle 2170.

Embodiment 4

In this embodiment, an oxide semiconductor and the like are described.
<Structure Example 1 of OS Transistor>

Figure 22A:
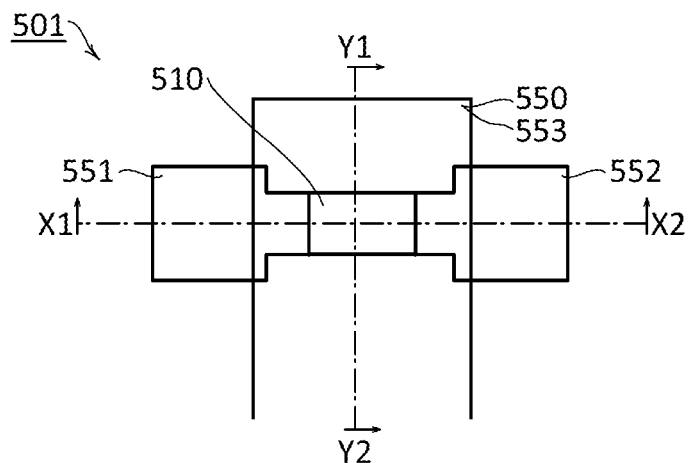
FIG. 22A is a plan view illustrating a structure example of an oxide semiconductor (OS) transistor.
Figure 22B:
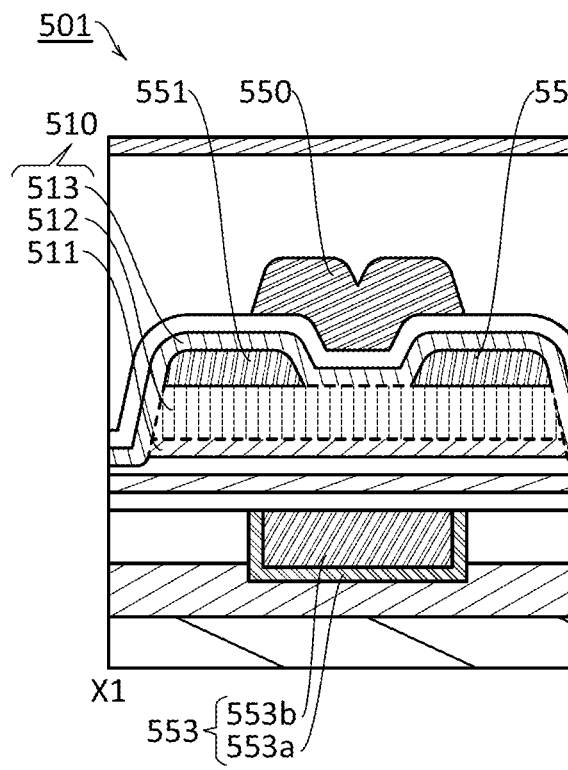
FIGS. 22B and 22C are cross-sectional views of the OS transistor in FIG. 22A.
Figure 22C:
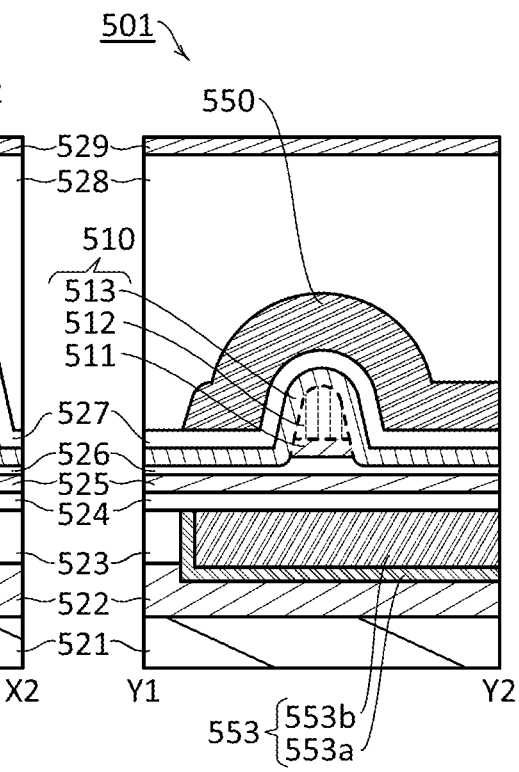

FIG. 22A is a top view illustrating a structure example of an OS transistor. FIG. 22B is a cross-sectional view taken along line X1-X2 in FIG. 22A. FIG. 22C is a cross-sectional view taken along line Y1-Y2 in FIG. 22A. In some cases, the direction of line X1-X2 is referred to as a channel length direction, and the direction of line Y1-Y2 is referred to as a channel width direction. Accordingly, FIG. 22B illustrates a cross-sectional structure of the OS transistor in the channel length direction, and FIG. 22C illustrates a cross-sectional structure of the OS transistor in the channel width direction. Note that to clarify the device structure, FIG. 22A does not illustrate some components.

An OS transistor 501 is formed over an insulating surface, here, over an insulating layer 521. The OS transistor 501 is covered with insulating layers 528 and 529. The OS transistor 501 includes insulating layers 522 to 527, metal oxide layers 511 to 513, and conductive layers 550 to 553.

Note that an insulating layer, a metal oxide layer, a conductor, and the like in a drawing may have a single-layer structure or a layered structure. These elements can be formed by any of a variety of deposition methods such as sputtering, molecular beam epitaxy (MBE), pulsed laser ablation (PLA), chemical vapor deposition (CVD), and atomic layer deposition (ALD). Examples of CVD include plasma-enhanced CVD, thermal CVD, and metal organic CVD.

The metal oxide layers 511 to 513 are collectively referred to as an oxide layer 510. As illustrated in FIGS. 22B and 22C, the oxide layer 510 includes a portion where the metal oxide layer 511, the metal oxide layer 512, and the metal oxide layer 513 are stacked in that order. When the OS transistor 501 is on, a channel is mainly formed in the metal oxide layer 512 of the oxide layer 510.

A gate electrode of the OS transistor 501 is formed using the conductive layer 550. A pair of electrodes that functions as a source electrode and a drain electrode of the OS transistor 501 is formed using the conductive layers 551 and 552. A back gate electrode of the OS transistor 501 is formed using the conductive layer 553. The conductive layer 553 includes conductive layers 553a and 553b. Note that the OS transistor 501 does not necessarily include a back gate electrode. The same applies to OS transistors 502 to 507 to be described later.

A gate insulating layer on a gate (front gate) side is formed using the insulating layer 527. A gate insulating layer on a back gate side is formed using a stack of the insulating layers 524 to 526. The insulating layer 528 is an interlayer insulating layer. The insulating layer 529 is a barrier layer.

The metal oxide layer 513 covers a stack of the metal oxide layers 511 and 512 and the conductive layers 551 and 552. The insulating layer 527 covers the metal oxide layer 513. The conductive layers 551 and 552 each include a region that overlaps with the conductive layer 550 with the metal oxide layer 513 and the insulating layer 527 positioned therebetween.

The conductive layers 551 and 552 are formed using a hard mask used for forming the stack of the metal oxide layers 511 and 512. For example, the metal oxide layers 511 and 512 and the conductive layers 551 and 552 can be formed through the following steps. A two-layer metal oxide film is formed. A conductive film is formed over the metal oxide film. This conductive film is etched, so that a hard mask is formed. With the use of this hard mask, the two-layer metal oxide film is etched to form the stack of the metal oxide layers 511 and 512. Then, the hard mask is etched to form the conductive layers 551 and 552. Since the conductive layers 551 and 552 are formed through these steps, the conductive layers 551 and 552 do not include regions that are in contact with side surfaces of the metal oxide layers 511 and 512.

(Conductive Layer)

Examples of a conductive material used for the conductive layers 550 to 553 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

With the use of a conductive material with a high work function for the conductive layer 550, it is possible to increase Vt of the OS transistor 501 and reduce cutoff current. For the conductive layer 550, a conductive material whose work function is preferably higher than or equal to 4.8 eV, more preferably higher than or equal to 5.0 eV, still more preferably higher than or equal to 5.2 eV, yet more preferably higher than or equal to 5.4 eV, still more preferably higher than or equal to 5.6 eV can be used. Examples of the conductive material with a high work function include molybdenum, molybdenum oxide, Pt, Pt silicide, Ni silicide, indium tin oxide, and an In—Ga—Zn oxide to which nitrogen is added.

Note that the cutoff current refers to drain current at gate-source voltage=0 V.

For example, the conductive layer 550 is a single layer of tantalum nitride or tungsten. Alternatively, in the case where the conductive layer 550 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor described first is used for a layer on the insulating layer 527 side.

The conductive layers 551 and 552 have the same layer structure. For example, in the case where the conductive layer 551 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 551 has a two-layer structure or a three-layer structure layer, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride. The conductor described first is used for a layer on the insulating layer 527 side.

For example, it is preferable that the conductive layer 553a be a conductive layer that has a hydrogen barrier property (e.g., a tantalum nitride layer) and that the conductive layer 553b be a conductive layer that has higher conductivity than the conductive layer 553a (e.g., tungsten). With such a structure, the conductive layer 553 functions as a wiring and has a function of suppressing diffusion of hydrogen into the oxide layer 510.

(Insulating Layer)

Examples of insulating materials used for the insulating layers 521 to 529 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 521 to 529 are formed using a single-layer structure or a layered structure of these insulating materials. The layers used for the insulating layers 521 to 529 may include a plurality of insulating materials.

Note that in this specification and the like, an oxynitride refers to a substance that contains more oxygen than nitrogen, and a nitride oxide refers to a substance that contains more nitrogen than oxygen.

In order to suppress the increase in oxygen vacancies in the oxide layer 510, the insulating layers 526 to 528 preferably include oxygen. More preferably, at least one of the insulating layers 526 to 528 is formed using an insulating film from which oxygen is released by heating (hereinafter such an insulating film is referred to as an insulating film containing excess oxygen). When oxygen is supplied from the insulating film containing excess oxygen to the oxide layer 510, the oxygen vacancies in the oxide layer 510 can be compensated. Thus, reliability and electrical characteristics of the OS transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 521 to 529 is preferably low in order to prevent the increase in the concentration of hydrogen in the oxide layer 510. In particular, the concentration of hydrogen in the insulating layers 523 to 528 is preferably low. Specifically, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of nitrogen in the insulating layers 523 to 528 is preferably low in order to prevent the increase in the concentration of nitrogen in the oxide layer 510. Specifically, the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The hydrogen concentration and the nitrogen concentration are measured by secondary ion mass spectrometry (SIMS).

In the OS transistor 501, the oxide layer 510 is preferably surrounded by an insulating layer with oxygen and hydrogen barrier properties (hereinafter such an insulating layer is referred to as a barrier layer). With such a structure, it is possible to suppress the release of oxygen from the oxide layer 510 and entry of hydrogen into the oxide layer 510; thus, the reliability and electrical characteristics of the OS transistor 501 can be improved.

For example, the insulating layer 529 functions as a barrier layer and at least one of the insulating layers 521, 522, and 524 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

In addition, a barrier layer may be provided between the oxide layer 510 and the conductive layer 550. Alternatively, a metal oxide layer that has oxygen and hydrogen barrier properties may be provided as the metal oxide layer 513.

The film thicknesses of the insulating layer 524, the insulating layer 525, and the insulating layer 526 are preferably reduced so that the threshold voltage of the OS transistor can be easily controlled with the voltage of the conductive layer 550. For example, the film thicknesses of the insulating layers 524 to 526 are each smaller than or equal to 50 nm. The film thicknesses of the insulating layers 524 to 526 are each preferably smaller than or equal to 30 nm, more preferably smaller than or equal to 10 nm, still more preferably smaller than or equal to 5 nm.

A structure example of the insulating layers 521 to 529 is described. In this example, each of the insulating layers 521, 522, 525, and 529 functions as a barrier layer. The insulating layers 526 to 528 are oxide layers containing excess oxygen. The insulating layer 521 is formed using silicon nitride. The insulating layer 522 is formed using aluminum oxide. The insulating layer 523 is formed using silicon oxynitride. The gate insulating layers (524 to 526) on the back gate side are formed using a stack of silicon oxide, aluminum oxide, and silicon oxide. The gate insulating layer (527) on the front gate side is formed using silicon oxynitride. The interlayer insulating layer (528) is formed using silicon oxide. The insulating layer 529 is formed using aluminum oxide.

(Metal Oxide Layer)

The thickness of each of the metal oxide layers 511 to 513 is larger than or equal to 3 nm and smaller than or equal to 500 nm, preferably larger than or equal to 3 nm and smaller than or equal to 100 nm, more preferably larger than or equal to 3 nm and smaller than or equal to 60 nm.

In order to reduce the off-state current of the OS transistor 501, for example, the energy gap of the metal oxide layer 512 is preferably large. The energy gap of the metal oxide layer 512 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 510 is preferably a crystalline metal oxide layer. In the oxide layer 510, at least the metal oxide layer 512 is preferably a crystalline metal oxide layer. The OS transistor 501 can have high reliability and favorable electrical characteristics.

As the oxide of the metal oxide layer 512, typically, an In—Ga oxide, an In—Zn oxide, or an In-M-Zn oxide (M is Al, Ga, Y, or Sn) can be used. The metal oxide layer 512 is not limited to the oxide layer containing indium. The metal oxide layer 512 can be formed using a Zn—Sn oxide, a Ga—Sn oxide, or a Zn—Mg oxide, for example. The metal oxide layers 511 and 513 can be formed using an oxide that is similar to the oxide of the metal oxide layer 512. The metal oxide layers 511 and 513 can be formed using a Ga oxide. In that case, the metal oxide layer 512 is preferably a metal oxide layer containing Ga.

When an interface level is formed at an interface between the metal oxide layer 512 and the metal oxide layer 511, a channel region is also formed in a region close to the interface; thus, the threshold voltage of the OS transistor 501 varies. It is preferable that the metal oxide layer 511 contains at least one of the metal elements contained in the metal oxide layer 512. Accordingly, an interface state is hardly formed at the interface between the metal oxide layer 512 and the metal oxide layer 513, and variations in the electrical characteristics of the OS transistor 501, such as the threshold voltage, can be reduced.

The metal oxide layer 513 preferably contains at least one of the metal elements contained in the metal oxide layer 512 because interface scattering is unlikely to occur at the interface between the metal oxide layer 512 and the metal oxide layer 513, and carrier transfer is not inhibited. Thus, the field-effect mobility of the OS transistor 501 can be increased.

It is preferable that the metal oxide layer 512 have the highest carrier mobility among the metal oxide layers 511 to 513. Accordingly, a channel can be formed in the metal oxide layer 512 that is apart from the insulating layers 526 and 527.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

For example, the metal oxide layer 512 is formed using an In—Ga—Zn oxide, and the metal oxide layers 511 and 513 are formed using a Ga oxide. For example, in the case where the metal oxide layers 511 to 513 are formed using an In-M-Zn oxide, the metal oxide layer 511 has the highest In content among the metal oxide layers 511 to 513. In the case where the In-M-Zn oxide is formed by sputtering, the In content can be changed by a change in the atomic ratio of metal elements of a target.

For example, it is preferable that the atomic ratio of metal elements of a target used for depositing the metal oxide layer 512 be In:M:Zn=1:1:1, 3:1:2, or 4:2:4.1. For example, it is preferable that the atomic ratio of metal elements of a target used for depositing the metal oxide layers 511 and 513 be In:M:Zn=1:3:2 or 1:3:4. The atomic ratio of an In-M-Zn oxide deposited using a target of In:M:Zn=4:2:4.1 is approximately In:M:Zn=4:2:3.

In order that the OS transistor 501 have stable electrical characteristics, it is preferable to reduce the concentration of impurities in the oxide layer 510. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration in the electric characteristics of the OS transistor.

For example, the oxide layer 510 includes a region where the concentration of silicon is lower than or equal to $2\times10^{18}$ atoms/cm$^3$. The concentration of silicon in the region is preferably lower than or equal to $2\times10^{17}$ atoms/cm$^3$. The same applies to the concentration of carbon in the oxide layer 510.

The oxide layer 510 includes a region where the concentration of alkali metal is lower than or equal to $1\times10^{18}$ atoms/cm$^3$. The concentration of alkali metal in the region is preferably lower than or equal to $2\times10^{16}$ atoms/cm$^3$. The same applies to the concentration of alkaline earth metal in the oxide layer 510.

The oxide layer 510 includes a region where the concentration of nitrogen is lower than $5\times10^{19}$ atoms/cm$^3$. The concentration of nitrogen in the region is preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The oxide layer 510 includes a region where the concentration of hydrogen is lower than $1\times10^{20}$ atoms/cm$^3$. The concentration of hydrogen in the region is preferably lower than $1\times10^{19}$ atoms/cm$^3$, more preferably lower than $5\times10^{18}$ atoms/cm$^3$, still more preferably lower than $1\times10^{18}$ atoms/cm$^3$.

The concentrations of the impurities in the oxide layer 510 are measured by SIMS.

In the case where the metal oxide layer 512 contains oxygen vacancies, donor levels are formed by entry of hydrogen into sites of oxygen vacancies in some cases. As a result, the on-state current of the OS transistor 501 is decreased. Sites of oxygen vacancies become more stable by entry of oxygen than by entry of hydrogen. Thus, by decreasing oxygen vacancies in metal oxide layer 512, the on-state current of the OS transistor 501 can be increased in some cases. Consequently, preventing entry of hydrogen into sites of oxygen vacancies by a reduction in hydrogen in the metal oxide layer 512 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the OS transistor 501 is likely to be normally-on when the metal oxide layer 512 contains hydrogen because the metal oxide layer 512 includes a channel formation region. Accordingly, it is preferable that hydrogen in the metal oxide layer 512 be reduced as much as possible.

FIGS. 22A to 22C illustrate examples in which the oxide layer 510 has a three-layer structure; however, one embodiment of the present invention is not limited thereto. For example, the oxide layer 510 may have a two-layer structure without the metal oxide layer 511 or 513. Alternatively, the oxide layer 510 may have a four-layer structure in which any one of the oxide semiconductor layers described as the metal oxide layers 511 to 513 is provided below or over the metal oxide layer 511 or below or over the metal oxide layer 513. Alternatively, the oxide layer 510 may include one or more metal oxide layers that are similar to the metal oxide layers 511 to 513 at two or more of the following positions: between given layers in the oxide layer 510, over the oxide layer 510, and below the oxide layer 510.

<Energy Band Structure>

Figure 29:
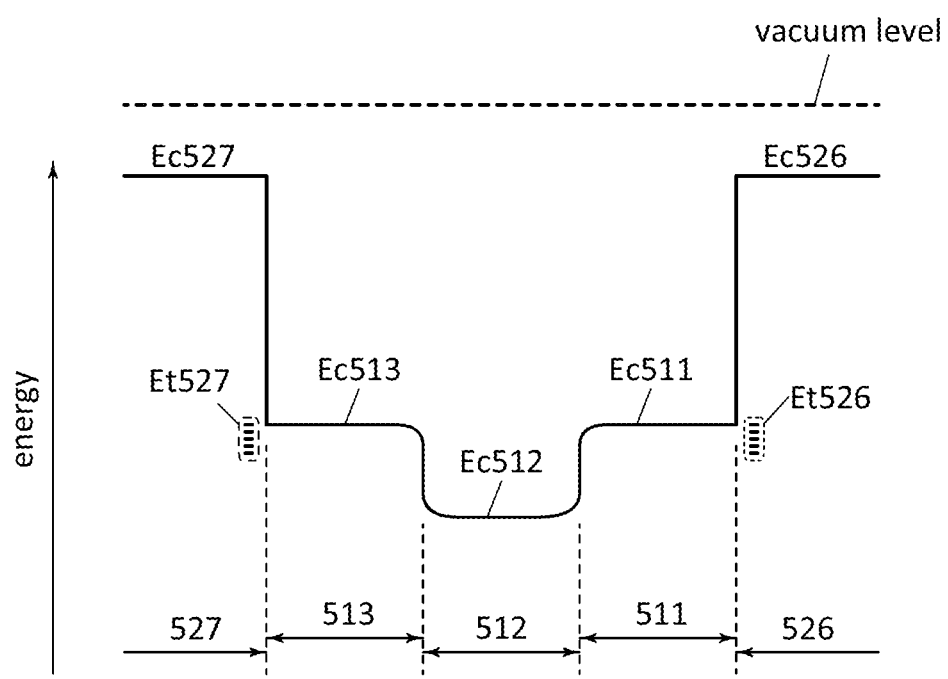
FIG. 29 is an energy band diagram of an OS transistor.

Effects of the stack of the metal oxide layers 511 to 513 are described with reference to FIG. 29. FIG. 29 is a schematic diagram showing the energy band structure of a channel formation region of the OS transistor 501. Although the OS transistor 501 is described here as an example, effects of the stack of the metal oxide layers 511 to 513 in the OS transistors 502 and 503 to be described later are similar to those in the OS transistor 501.

Here, Ec526, Ec511, Ec512, Ec513, and Ec527 indicate the energy at the bottom of the conduction band of the insulating layer 526, the metal oxide layer 511, the metal oxide layer 512, the metal oxide layer 513, and the insulating layer 527, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The difference in energy between the vacuum level and the top of the valence band can be measured using an ultraviolet photoelectron spectroscopy (UPS) device (VersaProbe manufactured by ULVAC-PHI, Inc.).

Since the insulating layers 526 and 527 are insulators, Ec526 and Ec527 are closer to the vacuum level than Ec511, Ec512, and Ec513 (i.e., the insulating layers 526 and 527 have a lower electron affinity than the metal oxide layers 511 to 513).

The metal oxide layer 512 has a higher electron affinity than the metal oxide layers 511 and 513. For example, the difference in electron affinity between the metal oxide layers 511 and 512 and the difference in electron affinity between the metal oxide layers 512 and 513 are each greater than or equal to 0.07 eV and less than or equal to 1.3 eV. The difference in electron affinity between the metal oxide layers 511 and 512 and the difference in electron affinity between the metal oxide layers 512 and 513 are each preferably greater than or equal to 0.1 eV and less than or equal to 0.7 eV, more preferably greater than or equal to 0.15 eV and less than or equal to 0.4 eV. Note that the electron affinity is a difference in energy between the vacuum level and the bottom of the conduction band.

When voltage is applied to the gate electrode (the conductive layer 550) of the OS transistor 501, a channel is mainly formed in the metal oxide layer 512 having the highest electron affinity among the metal oxide layers 511 to 513.

An indium gallium oxide has low electron affinity and a high oxygen-blocking property. Therefore, the metal oxide layer 513 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide layers 511 and 512 between the metal oxide layers 511 and 512. Furthermore, in some cases, there is a mixed region of the metal oxide layers 512 and 513 between the metal oxide layers 512 and 513. Because the mixed region has low interface state density, a stack of the metal oxide layers 511 to 513 (the oxide layer 510) has a band structure where energy at each interface and in the vicinity of the interface is changed continuously (continuous junction).

Electrons transfer mainly through the metal oxide layer 512 in the oxide layer 510 having such an energy band structure. Therefore, even when an interface state exists at an interface between the metal oxide layer 511 and the insulating layer 526 or an interface between the metal oxide layer 513 and the insulating layer 527, electron movement in the oxide layer 510 is less likely to be inhibited and the on-state current of the OS transistor 501 can be increased.

Although trap states Et 526 and Et 527 due to impurities or defects might be formed in the vicinity of the interface between the metal oxide layer 511 and the insulating layer 526 and the vicinity of the interface between the metal oxide layer 513 and the insulating layer 527 as illustrated in FIG. 29, the metal oxide layer 512 can be separated from the trap states Et 526 and Et 527 owing to the existence of the metal oxide layers 511 and 513.

Note that when a difference in energy between Ec511 and Ec512 is small, an electron in the metal oxide layer 512 might reach the trap state Et 526 by passing over the difference in energy. Since the electron is trapped at the trap state Et 526, negative fixed charge is generated at the interface with the insulating film, causing the threshold voltage of the transistor to be shifted in a positive direction. The same applies to the case where a difference in energy between Ec511 and Ec513 is small.

Each of the difference in energy between Ec511 and Ec512 and the difference in energy between Ec512 and Ec513 is preferably greater than or equal to 0.1 eV, more preferably greater than or equal to 0.15 eV so that a change in the threshold voltage of the OS transistor 501 can be reduced and the OS transistor 501 can have favorable electrical characteristics.

<Structure Example 2 of OS Transistor>

Figure 23A:
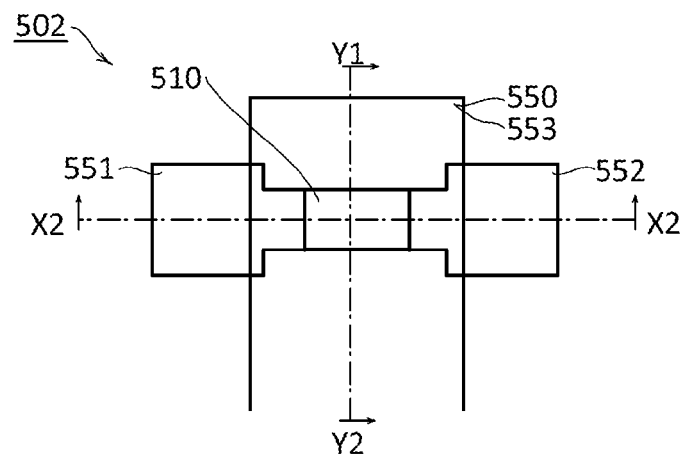
FIG. 23A is a plan view illustrating a structure example of an OS transistor.
Figure 23B:
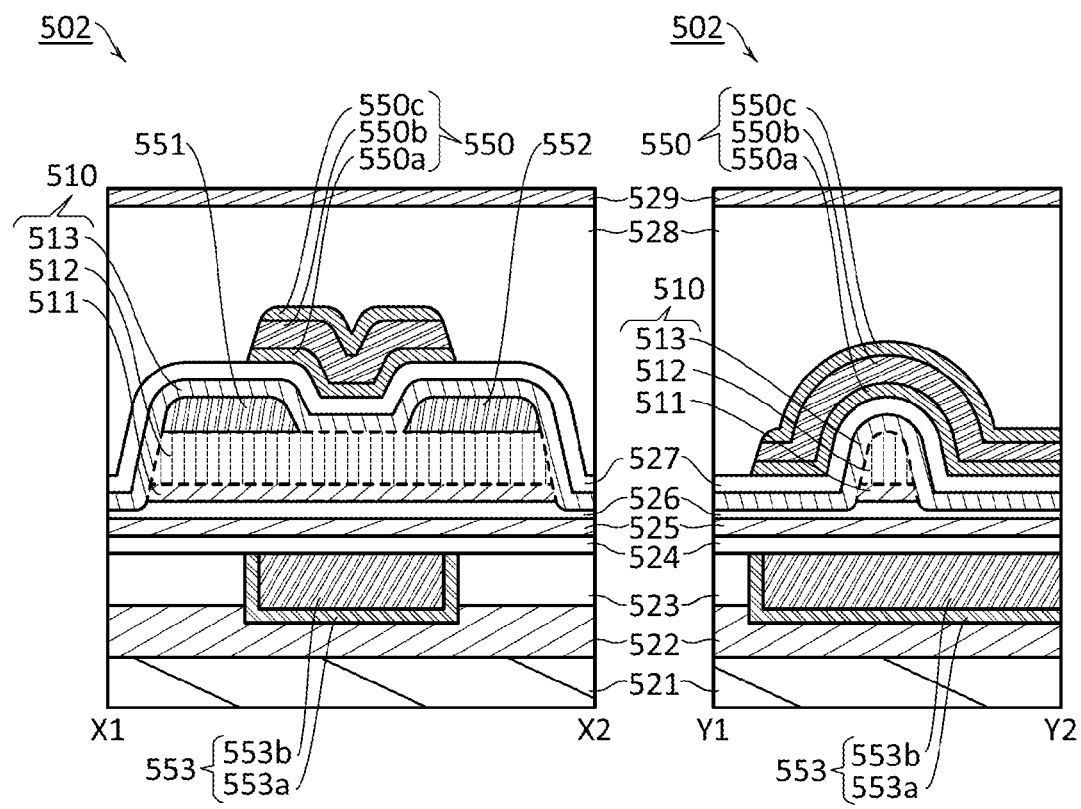
FIGS. 23B and 23C are cross-sectional views of the OS transistor in FIG. 23A.
Figure 23C:
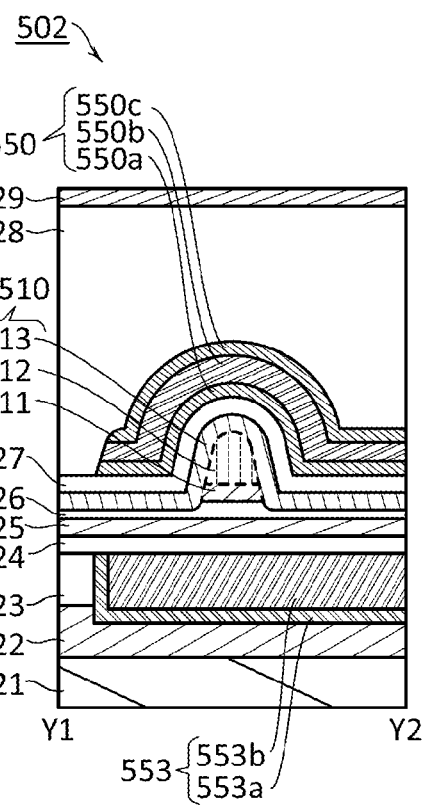

The OS transistor 502 in FIGS. 23A to 23C is a modification example of the OS transistor 501. The conductive layer 550 of the OS transistor 502 includes a conductive layer 550*a*, a conductive layer 550*b*, and a conductive layer 550*c*.

The conductive layer 550*a* is preferably formed by thermal CVD, MOCVD, or ALD. In particular, the conductive layer 550*a* is preferably formed by ALD. When the conductive layer 550*a* is formed by ALD or the like, plasma damage to the insulating layer 527 can be reduced. In addition, the conductive layer 550*a* is preferably formed by ALD or the like because coverage thereof can be improved. Therefore, it is possible to provide the highly reliable OS transistor 502.

The conductive layer 550*b* is formed using a material that has high conductivity, such as tantalum, tungsten, copper, or aluminum. The conductive layer 550*c* formed over the conductive layer 550*b* is preferably formed using a conductor that is less likely to be oxidized, such as tungsten nitride. In the case where an oxide material from which oxygen is released is used for the insulating layer 528, the conductive layer 550 can be prevented from being oxidized by released oxygen. Thus, it is possible to suppress oxidation of the conductive layer 550 and efficiently supply oxygen released from the insulating layer 528 to the oxide layer 510.

When a conductor that is less likely to be oxidized is used for the conductive layer 550*c* having a large contact area with the insulating layer 528 including an excess oxygen region, it is possible to suppress absorption of excess oxygen in the insulating layer 528 by the conductive layer 550. In addition, when a conductor with high conductivity is used for the conductive layer 550*b*, it is possible to provide the OS transistor 502 with low power consumption.

<Structure Example 3 of OS Transistor>

Figure 24A:
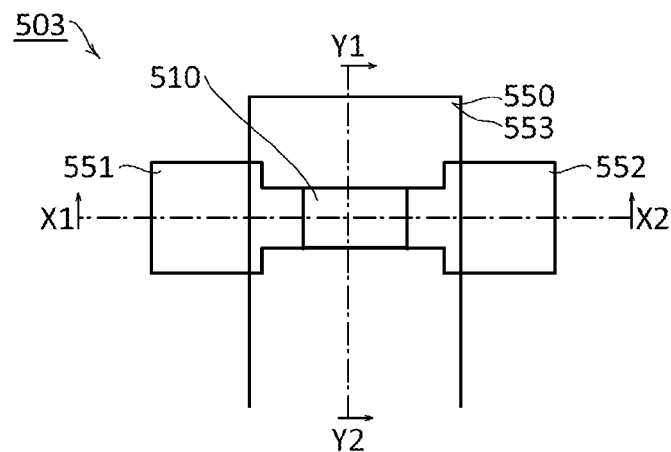
FIG. 24A is a plan view illustrating a structure example of an OS transistor.
Figure 24B:
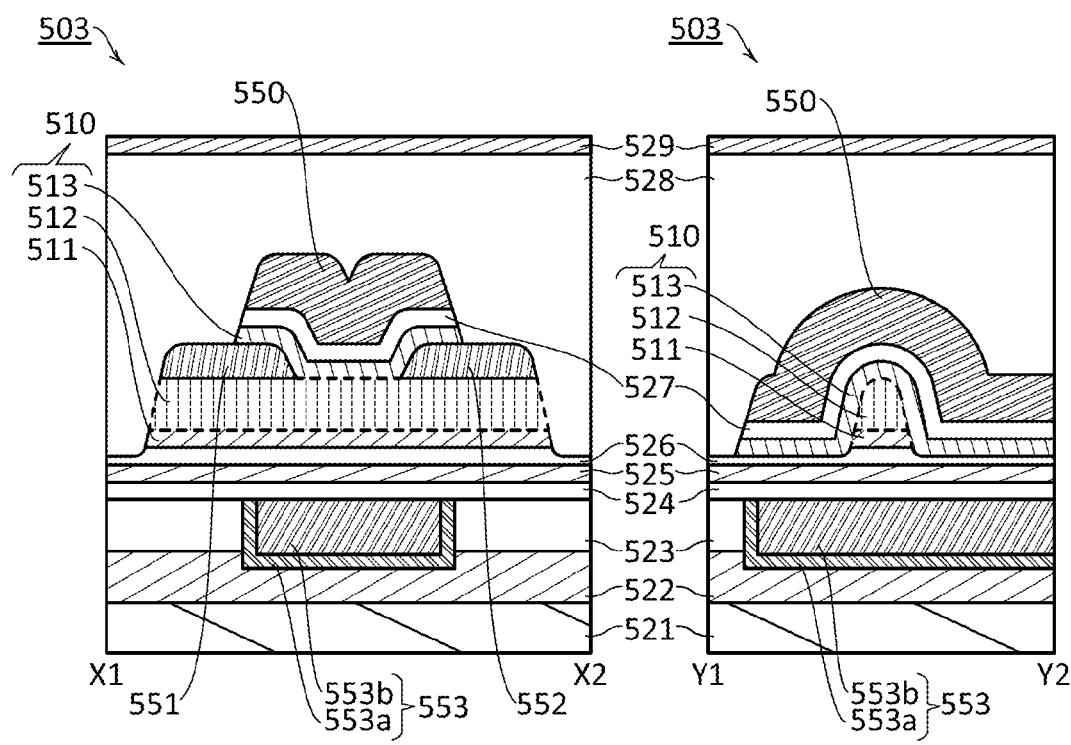
FIGS. 24B and 24C are cross-sectional views of the OS transistor in FIG. 24A.
Figure 24C:
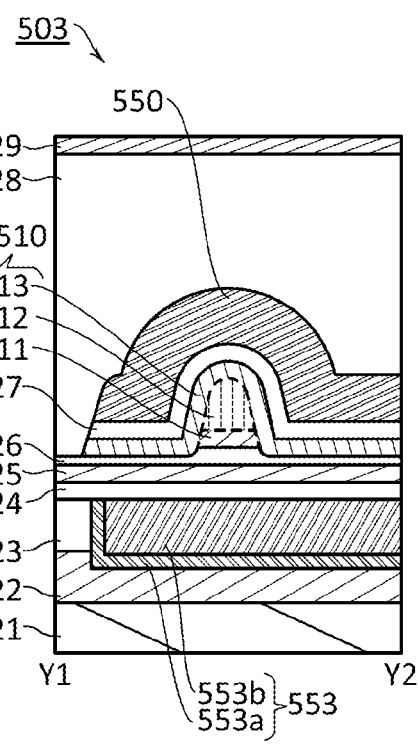

The OS transistor 503 in FIGS. 24A to 24C is a modification example of the OS transistor 501. In the OS transistor 503, the conductive layer 550 is used as an etching mask to etch the metal oxide layer 513 and the insulating layer 527.

<Structure Example 4 of OS Transistor>

Figure 25A:
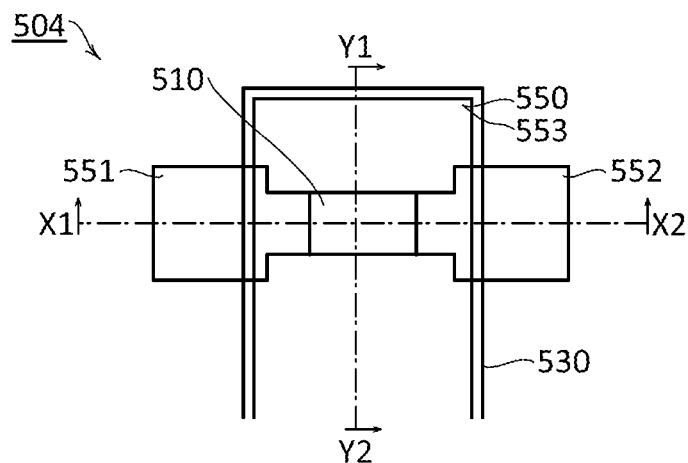
FIG. 25A is a plan view illustrating a structure example of an OS transistor.
Figure 25B:
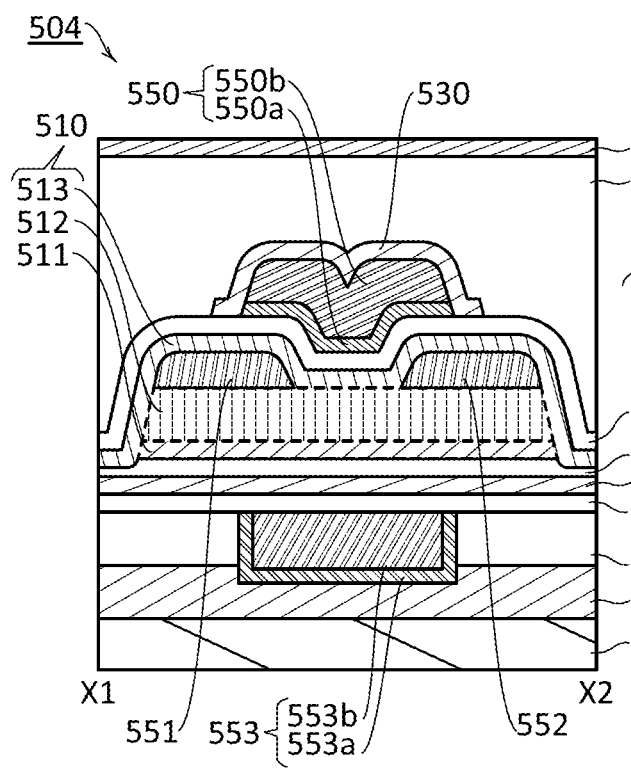
FIGS. 25B and 25C are cross-sectional views of the OS transistor in FIG. 25A.
Figure 25C:
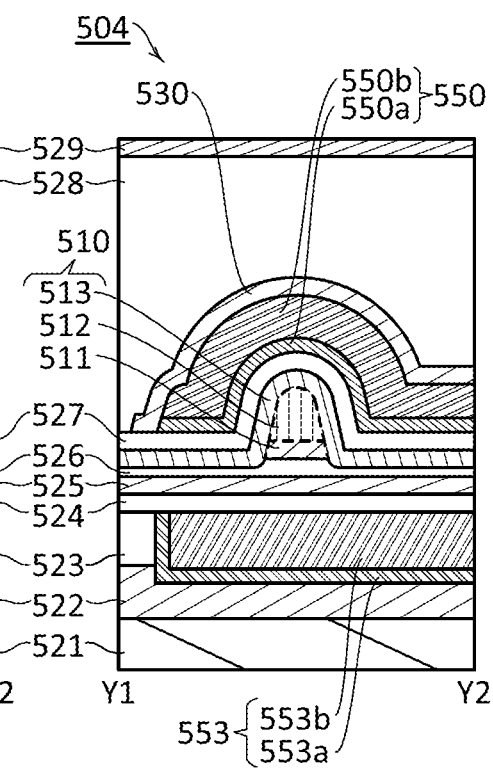

The OS transistor 504 in FIGS. 25A to 25C is a modification example of the OS transistor 501.

The conductive layer 550 has a two-layer structure of the conductive layer 550*a* and the conductive layer 550*b*. The conductive layer 550 is covered with an insulating layer 530.

For example, the insulating layer 530 has an oxygen barrier property. Thus, oxygen released from the insulating layer 528 or the like can suppress oxidation of the conductive layer 550. In that case, a metal oxide such as aluminum oxide can be used for the insulating layer 530. The thickness of the insulating layer 530 is not limited to a certain thickness as long as oxidation of the conductive layer 550 can be prevented. For example, the thickness of the insulating layer 530 is greater than or equal to 1 nm and less than or equal to 10 nm, preferably greater than or equal to 3 nm and less than or equal to 7 nm.

Note that as in the case of the OS transistor 503, the metal oxide layer 513 and the insulating layer 527 in the OS transistor 504 may be partly removed so that upper surfaces of the conductive layers 551 and 552 are partly exposed. Alternatively, only the insulating layer 527 may be partly removed.

<Structure Example 5 of OS Transistor>

The OS transistor 505 in FIGS. 26A to 26C is a modification example of the OS transistor 501.

The conductive layer 551 has a two-layer structure of a conductive layer 551*a* and a conductive layer 551*b*, and the conductive layer 552 has a two-layer structure of a conductive layer 552*a* and a conductive layer 552*b*.

In the conductive layer 551, the conductive layers 551*a* and 552*a* are preferably formed using a conductive film that has high adhesion to the metal oxide layer 512. This conductive film is preferably formed by ALD because coverage thereof can be improved. The conductive layers 551*b* and 552*b* are preferably formed using a conductor that has higher conductivity than the conductive layers 551*a* and 552*a*. The use of the conductive layers 551*a* and 552*a* reduces restrictions on a conductive material that can be used for the conductive layers 551*b* and 552*b*. When a material that has high conductivity, such as tantalum, tungsten, copper, or aluminum, is used for the conductive layers 551*a* and 552*a*, power consumption of a circuit including the OS transistor 505 can be reduced.

<Structure Example 6 of OS transistor>

The OS transistor 506 in FIGS. 27A to 27C is a modification example of the OS transistor 501. The OS transistor 506 differs from the OS transistor 501 mainly in the structure of the gate electrode.

The metal oxide layer 513, the insulating layer 527, and the conductive layer 550 are provided in an opening portion formed in the insulating layer 528. In other words, a gate electrode can be formed in a self-aligning manner by using the opening portion in the insulating layer 528. Thus, in the OS transistor 506, a gate electrode (550) does not include a region that overlaps with a source electrode and a drain electrode (551 and 552) with a gate insulating layer (527) positioned therebetween. Accordingly, gate-source parasitic capacitance and gate-drain parasitic capacitance can be reduced and frequency characteristics can be improved. Furthermore, gate electrode width can be controlled by the opening portion in the insulating layer 528; thus, it is easy to fabricate an OS transistor with short channel length.

<Structure Example 7 of OS Transistor>

The OS transistor 507 in FIGS. 28A to 28C is a modification example of the OS transistor 506.

The oxide layer 510 further includes a metal oxide layer 514. The metal oxide layer 514 covers the metal oxide layers 511 and 512 and the conductive layers 551 and 552.

The metal oxide layer 512 is separated from the insulating layer 528 by the metal oxide layer 514. In the oxide layer 510, a channel is mainly formed in the metal oxide layer 512; thus, generation of a shallow level in the vicinity of the channel can be suppressed when there is no region where the metal oxide layer 512 is in contact with the insulating layer 528. Thus, reliability of the OS transistor 507 can be improved.

<Structure Example of Semiconductor Device>

Structure examples of a semiconductor device including OS transistors and Si transistors are described with reference to FIG. 30 and FIG. 31.

Figure 30:
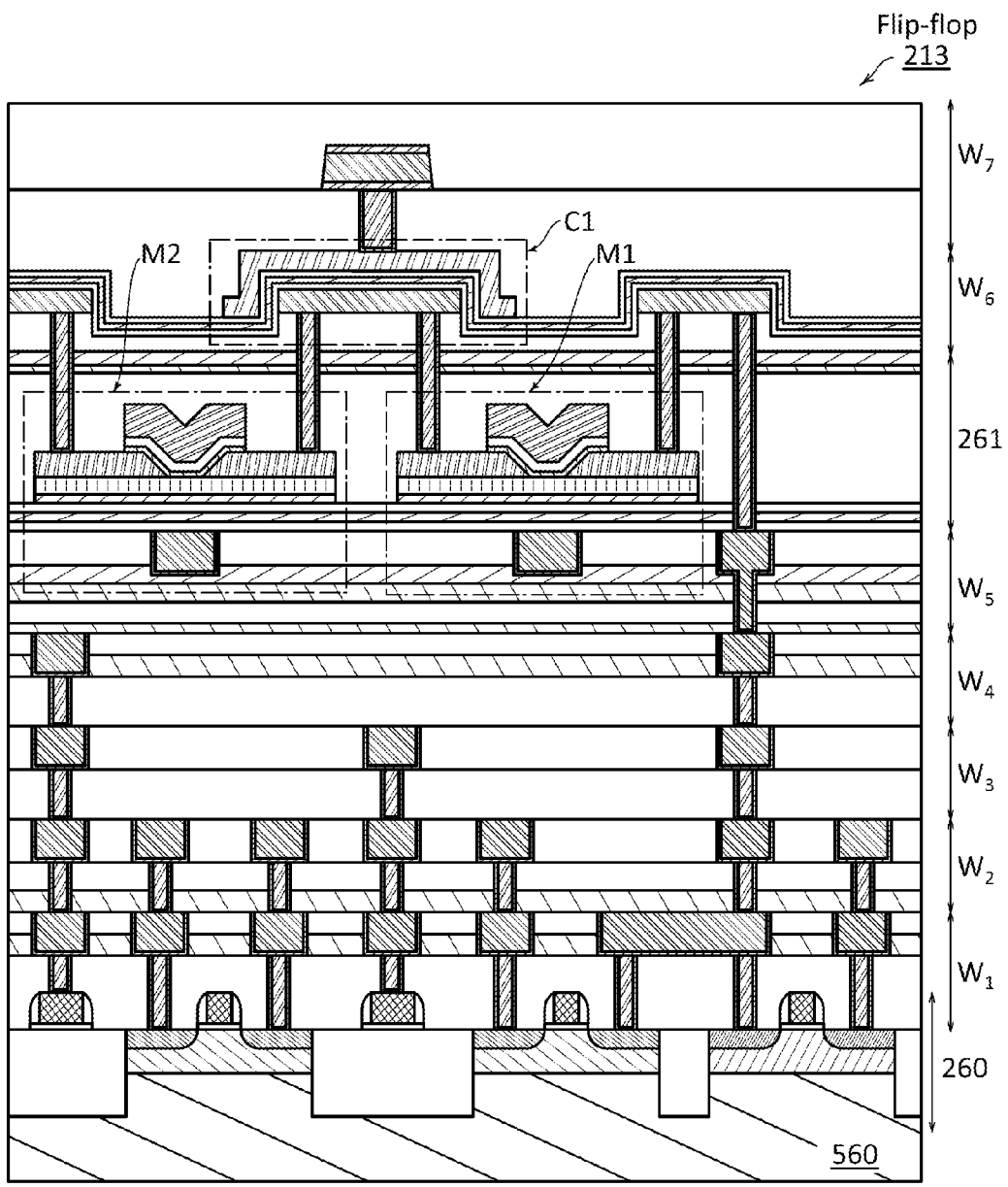
FIG. 30 is a cross-sectional view illustrating a structure example of a flip-flop.

FIG. 30 is a cross-sectional view for illustrating the layered structure of the processor 200 (FIG. 11). FIG. 30 illustrates typical main components of the flip-flop 213 (FIG. 15).

The flip-flop 213 includes a stack of the CMOS layer 260, the wiring layers $W_1$ to $W_5$, an OS transistor layer 261, and the wiring layers $W_6$ and $W_7$.

Si transistors of the scan flip-flop 214 are provided in the CMOS layer 260. An active layer of the Si transistor is formed using a single crystalline silicon wafer 560.

The transistors M1 to M3, M50, and M51 of the flip-flop 213 are provided in the OS transistor layer 261. In FIG. 30, the transistors M1 and M2 are typically illustrated. The transistors M1 and M2 have device structures similar to that of the OS transistor 503 (FIGS. 24A to 24C). The back gates of these transistors are formed in the wiring layer $W_5$. The transistors M3, M50, and M51 have device structures similar to those of the transistors M1 and M2.

The capacitors C1, C50, and C51 of the flip-flop 213 are provided in the wiring layer $W_6$. In FIG. 30, the capacitor C1 is illustrated as a typical example. The capacitors C50 and C51 have structures similar to that of the capacitor C1.

Figure 31:
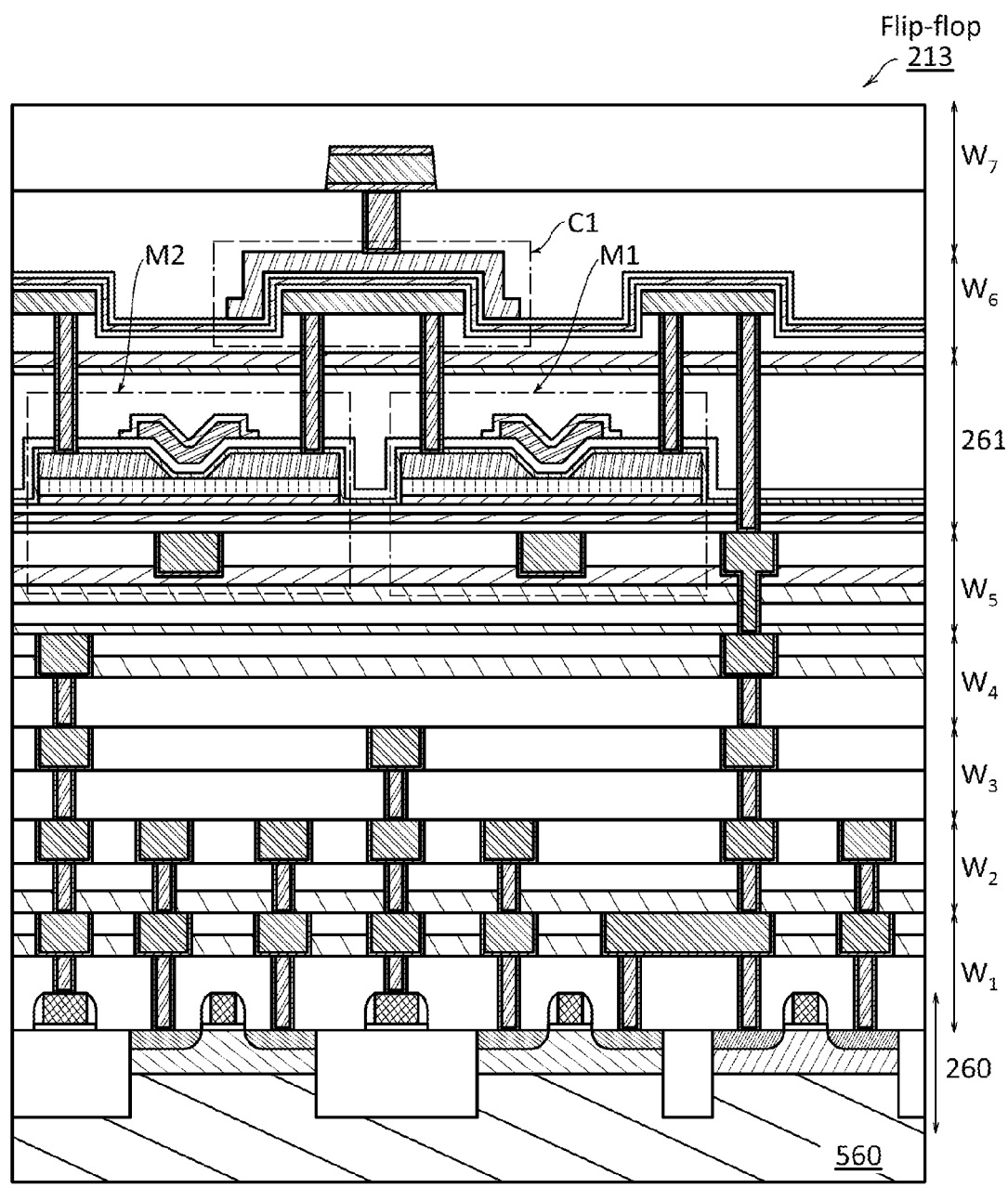
FIG. 31 is a cross-sectional view illustrating a structure example of a flip-flop.

FIG. 31 illustrates a structure example where the transistors M1 and M2 have structures similar to that of the OS transistor 504 (FIGS. 25A to 25C).

Embodiment 5

In this embodiment, an oxide semiconductor is described. An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

(CAAC-OS)

A CAAC-OS is an oxide semiconductor having a plurality of c-axis aligned crystal parts (also referred to as pellets).

The CAAC-OS has c-axis alignment, its crystal parts (nanocrystals) are connected in an a-b plane direction, and the crystal structure has distortion. The size of the crystal part is greater than or equal to 1 nm and less than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

The impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

(nc-OS)

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including random aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78 % of the density of the single crystal oxide semiconductor.

For example, in the case of an oxide semiconductor with an atomic ratio of In:Ga:Zn=1:1:1, the density of single-crystal $InGaZnO_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

<Carrier Density of Oxide Semiconductor>

Next, the carrier density of an oxide semiconductor is described. Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

The carrier density of the oxide semiconductor is preferably reduced in order to inhibit the negative shift of Vt of the OS transistor or reduce the off-state current of the OS transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state.

The carrier density of the oxide semiconductor is preferably increased in some cases in order to increase the on-state current or field-effect mobility of the OS transistor. The carrier density of the oxide semiconductor can be increased by slightly increasing the impurity concentration or the density of defect states in the oxide semiconductor.

For example, an oxide semiconductor that has a slightly high impurity concentration or a slightly high density of defect states in the range where a favorable ratio between the on-state current and the off-state current (i.e., Ion/Ioff ratio) of the OS transistor is obtained can be regarded as being substantially intrinsic.

Furthermore, an oxide semiconductor that has high electron affinity and thus has a narrow bandgap so as to increase the density of thermally excited electrons (carriers) can be regarded as substantially intrinsic. Note that an OS transistor using an oxide semiconductor with higher electron affinity has lower Vt.

The oxide semiconductor with an increased carrier density has somewhat n-type conductivity; thus, it can be referred to as a "slightly-n" oxide semiconductor.

The carrier density of a highly purified intrinsic oxide semiconductor is, for example, lower than $8\times10^{15}$ cm$^{-3}$, preferably lower than $1\times10^{11}$ cm$^{-3}$, more preferably lower than $1\times10^{10}$ cm$^{-3}$ and higher than or equal to $1\times10^{-9}$ cm$^{-3}$.

The carrier density of a substantially highly purified intrinsic oxide semiconductor is, for example, higher than or equal to $1\times10^{5}$ cm$^{-3}$ and lower than $1\times10^{18}$ cm$^{-3}$, preferably higher than or equal to $1\times10^{7}$ cm$^{-3}$ and lower than or equal to $1\times10^{17}$ cm$^{-3}$, more preferably higher than or equal to $1\times10^{9}$ cm$^{-3}$ and lower than or equal to $5\times10^{16}$ cm$^{-3}$, still more preferably higher than or equal to $1\times10^{10}$ cm$^{-3}$ and lower than or equal to $1\times10^{16}$ cm$^{-3}$, yet more preferably higher than or equal to $1\times10^{11}$ cm$^{-3}$ and lower than or equal to $1\times10^{15}$ cm$^{-3}$.

EXAMPLE 1

Figure 32A:
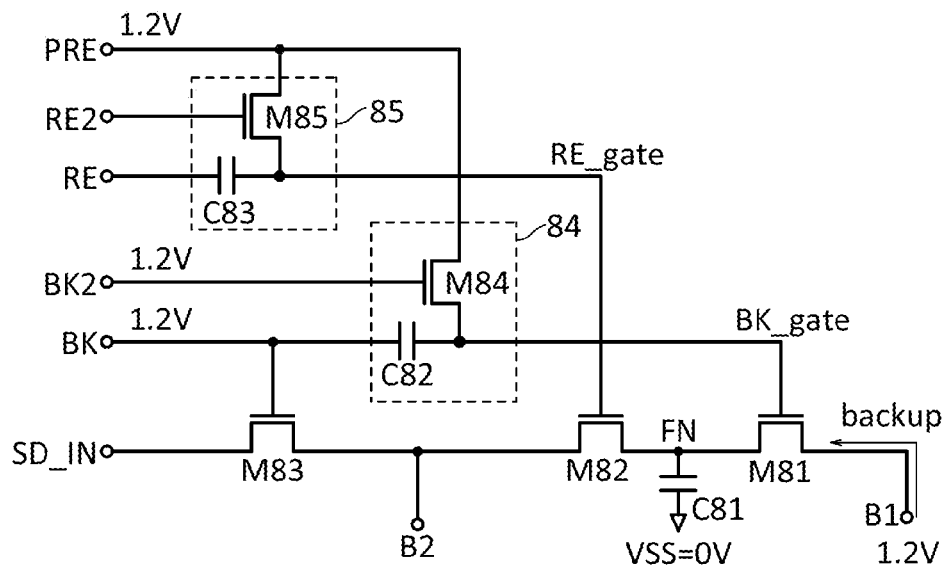
FIGS. 32A and 32B are circuit diagrams of backup circuits used for simulation.
Figure 32B:
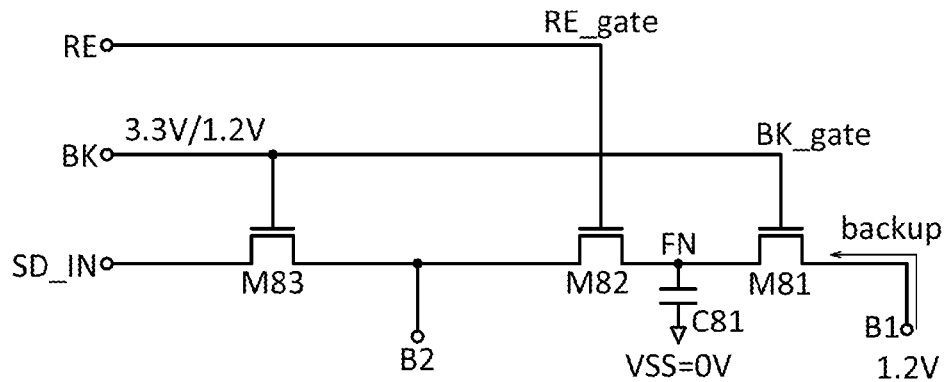

Circuit simulation confirmed that a backup circuit can be driven with the same drive voltage (VDD) as a logic circuit even when the backup circuit is formed using a high Vt transistor such as an OS transistor. FIGS. 32A and 32B illustrate backup circuits which have been used for the simulation.

A backup circuit 80 in FIG. 32A has the same circuit structure as the backup circuit 150 in Embodiment 1. The backup circuit 80 includes transistors M81 to M85, capacitors C81 to C83, and the nodes B1, B2, FN, SD_IN, RE, RE2, BK, BK2, and PRE. The transistor M84 and the capacitor C82 form a bootstrap circuit 84, and the transistor M85 and the capacitor C83 form a bootstrap circuit 85. Here, a node connected to a gate of the transistor M81 is referred to as BK_gate, and a node connected to a gate of the transistor M82 is referred to as RE_gate.

A backup circuit 90 in FIG. 32B is a circuit obtained by eliminating the bootstrap circuits 84 and 85 from the backup circuit 80.

Circuit simulation of data "1" (1.2 V) backup operation was performed in three conditions: Cases (1) to (3). Table 1 shows the conditions. Case (1) corresponds to Embodiment 1, and Cases (2) and (3) correspond to comparative examples. In Case (2), the backup circuit 90 is driven with low voltage (1.2 V). It has been assumed that the level of a control signal of the backup circuit 90 is shifted by a 3.3 V level shifter circuit in Case (2). It has been assumed that the backup circuit 90 is driven at 1.2 V without a level shifter circuit in Case (3).

TABLE 1

| Case | Circuit | Drive voltage (VDD) |
|---|---|---|
| (1) | Backup circuit 80 | 1.2 V |
| (2) | Backup circuit 90 | 3.3 V |
| (3) | Backup circuit 90 | 1.2 V |

Figure 33A:
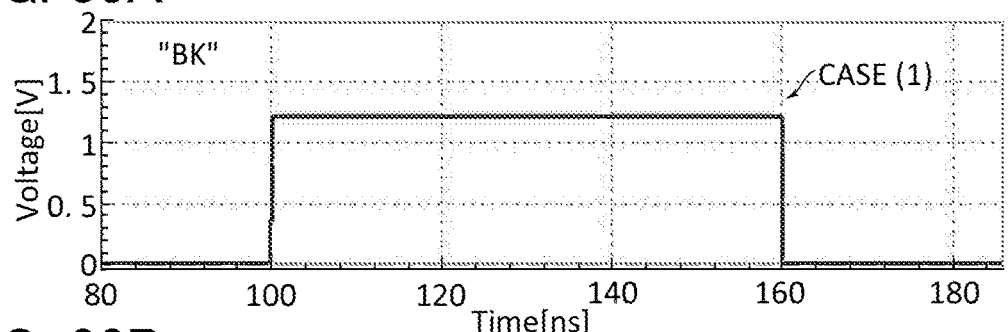
FIGS. 33A to 33D show waveforms obtained from the simulation.
Figure 33B:
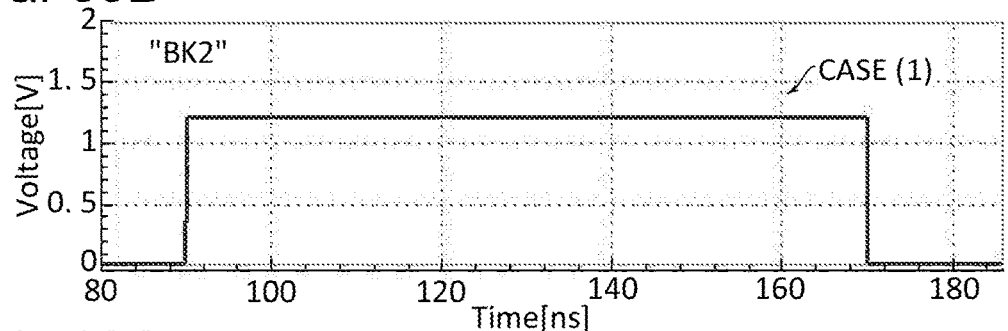
Figure 33C:
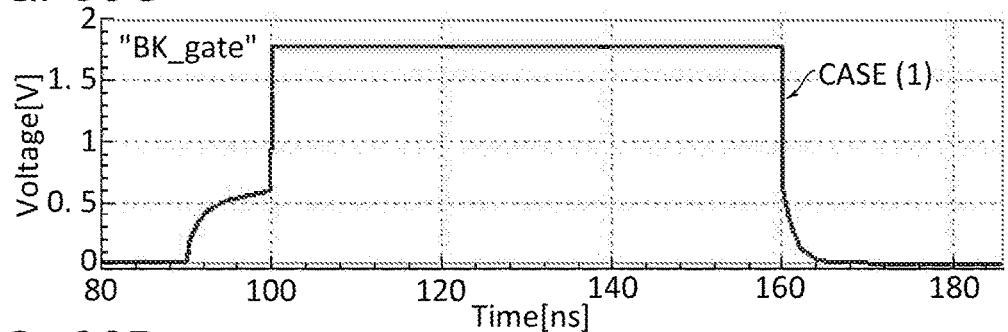
Figure 33D:
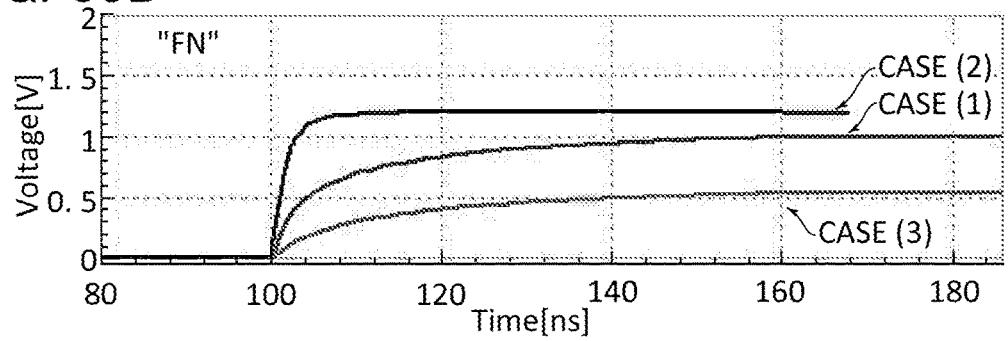

FIGS. 33A to 33D show simulation results. FIGS. 33A to 33D show waveforms of the nodes BK, BK2, BK_gate, and FN of the backup circuit 80, respectively. FIG. 33D also shows waveforms of the node FN of the backup circuit 90 in Cases (2) and (3). The transistors M81 to M85 are assumed to be OS transistors whose threshold voltages are each 0.7 V. Capacitances of the capacitors C82 and C83 are each 1 fF.

When the voltage of the node BK2 is 1.2 V and the voltage of the node BK is 0 V, the voltage of BK_gate is lower than the threshold voltage of the transistor M81. Thus, the transistor M81 is off and the voltage of the node FN is 0 V. When 1.2 V is input to the nodes PRE and BK2 of the backup circuit 80, BK_gate is precharged. The voltage of BK_gate is increased to approximately 1.8 V. Note that waveforms of the nodes BK, BK2, and BK_gate correspond to waveforms of the nodes RE, RE2, and RE_gate in restore operation, respectively.

Bootstrap capacitances of the bootstrap circuits 84 and 85 are each 1 fF. Even with such low bootstrap capacitances, the voltage of BK_gate and RE_gate can be increased effectively. Accordingly, even when the bootstrap circuits 84 and 85 are provided, an increase in the area of the backup circuit 80 can be suppressed.

In Case (1), the voltage of the node FN is increased to approximately 1 V by writing data "1" (1.2 V). In Case (2), the voltage of the node FN of the backup circuit 90 is increased to substantially the same as drive voltage by writing data "1" (1.2 V). It has been assumed that the backup circuit 90 is driven at 3.3 V in Case (2). In Case (3), the backup circuit 90 is driven with low voltage (1.2 V); thus, the voltage of the node FN is increased only by approximately 0.6 V due to the Vt drop of the transistor M81.

In other words, the simulation indicates that owing to the bootstrap circuits 84 and 85, performance of the backup circuit 80 that is driven with low voltage is comparable with performance of the backup circuit 90 that is driven with high voltage.

This application is based on Japanese Patent Application serial No. 2015-253021 filed with Japan Patent Office on Dec. 25, 2015, the entire contents of which are hereby incorporated by reference.

What is claimed is:

1. A circuit comprising:
   first to sixth nodes;
   first to third transistors;
   a first capacitor; and
   a first circuit,
   wherein the first capacitor is electrically connected to the first node,
   wherein the first transistor is configured to control electrical continuity between the first node and the second node,
   wherein the second transistor is configured to control electrical continuity between the first node and the third node,
   wherein the third transistor is configured to control electrical continuity between the third node and the fourth node,
   wherein a gate of the third transistor is electrically connected to the fifth node,
   wherein a gate of the second transistor is electrically connected to the sixth node,
   wherein the fifth node is electrically connected to the first circuit, and
   wherein the first circuit is configured to input voltage higher than voltage of the fifth node to a gate of the first transistor.

2. The circuit according to claim 1, further comprising a second circuit,
   wherein the second circuit is electrically connected to the sixth node, and
   wherein the second circuit is configured to input voltage higher than voltage of the sixth node to the gate of the second transistor.

3. The circuit according to claim 1, further comprising a seventh node and an eighth node,
   wherein the first circuit includes a fourth transistor and a second capacitor,
   wherein a first terminal of the second capacitor is electrically connected to the gate of the first transistor,
   wherein a second terminal of the second capacitor is electrically connected to the fifth node,
   wherein the fourth transistor is configured to control electrical continuity between the seventh node and the gate of the first transistor, and
   wherein a gate of the fourth transistor is electrically connected to the eighth node.

4. The circuit according to claim 2, further comprising seventh to ninth nodes,
   wherein the first circuit includes a fourth transistor and a second capacitor,
   wherein the second circuit includes a fifth transistor and a third capacitor,
   wherein a first terminal of the second capacitor is electrically connected to the gate of the first transistor,
   wherein a second terminal of the second capacitor is electrically connected to the fifth node,
   wherein the fourth transistor is configured to control electrical continuity between the seventh node and the gate of the first transistor,
   wherein a gate of the fourth transistor is electrically connected to the eighth node,
   wherein a first terminal of the third capacitor is electrically connected to the gate of the second transistor,
   wherein a second terminal of the third capacitor is electrically connected to the sixth node,
   wherein the fifth transistor is configured to control electrical continuity between the seventh node and the gate of the second transistor, and
   wherein a gate of the fifth transistor is electrically connected to the ninth node.

5. The circuit according to claim 1, wherein a channel formation region of each of the first transistor and the second transistor includes a metal oxide.

6. The circuit according to claim 1, wherein a channel formation region of each of the first to third transistors includes a metal oxide.

7. The circuit according to claim 3, wherein a channel formation region of the fourth transistor includes a metal oxide.

8. The circuit according to claim 4, wherein a channel formation region of each of the fourth transistor and the fifth transistor includes a metal oxide.

9. A logic circuit comprising a backup circuit and a first logic circuit,
   wherein the backup circuit includes the circuit according to claim 1,
   wherein the first logic circuit includes an input node and an output node,
   wherein the output node is electrically connected to the second node of the backup circuit, and
   wherein the input node is electrically connected to the third node of the backup circuit.

10. The logic circuit according to claim 9, wherein the backup circuit and the first logic circuit are stacked.

11. A processor comprising a plurality of scan flip-flops,
    wherein the plurality of scan flip-flops each include a first input node, a second input node, a first output node, and a backup circuit,
    wherein the backup circuit includes the circuit according to claim 1, and
    wherein in the plurality of scan flip-flops, the first output node is electrically connected to the second node of the backup circuit, and the second input node is electrically connected to the third node of the backup circuit.

12. An electronic component comprising a chip and a lead,
    wherein the lead is electrically connected to the chip, and
    wherein the chip includes the processor according to claim 11.

13. An electronic device comprising:
    a wireless communication device;
    a sensor; and
    the processor according to claim 11.

14. An electronic device comprising:
    the processor according to claim 11; and
    at least one of a display device, a touch sensor, a microphone, a speaker, an operation key, and a housing.

15. A processor comprising:
a first scan flip-flop;
a second scan flip-flop;
a first combinational circuit; and
a second combinational circuit,
wherein the first scan flip-flop includes a first input node, a second input node, a first output node, and a first backup circuit,
wherein the second scan flip-flop includes a third input node, a fourth input node, a second output node, and a second backup circuit,
wherein the first backup circuit and the second backup circuit each include the circuit according to claim 1,
wherein an output node of the first combinational circuit is electrically connected to the first input node,
wherein an input node of the second combinational circuit is electrically connected to the first output node,
wherein an output node of the second combinational circuit is electrically connected to the third input node,
wherein the second node of the first backup circuit is electrically connected to the first output node,
wherein the third node of the first backup circuit is electrically connected to the second input node,
wherein the second node of the second backup circuit is electrically connected to the second output node,
wherein the third node of the second backup circuit is electrically connected to the fourth input node, and
wherein the fourth node of the second backup circuit is electrically connected to the first output node.

16. An electronic component comprising a chip and a lead,
wherein the lead is electrically connected to the chip, and
wherein the chip includes the processor according to claim 15.

17. An electronic device comprising:
a wireless communication device;
a sensor; and
the processor according to claim 15.

18. An electronic device comprising:
the processor according to claim 15; and
at least one of a display device, a touch sensor, a microphone, a speaker, an operation key, and a housing.

* * * * *